United States Patent
Kagan et al.

(10) Patent No.: US 12,099,468 B2
(45) Date of Patent: Sep. 24, 2024

(54) SYSTEMS AND METHODS FOR COLLECTING, ANALYZING, BILLING, AND REPORTING DATA FROM INTELLIGENT ELECTRONIC DEVICES

(71) Applicant: EI ELECTRONICS LLC, Westbury, NY (US)

(72) Inventors: Erran Kagan, Great Neck, NY (US); Luna A. Koval, Commack, NY (US)

(73) Assignee: EI ELECTRONICS LLC, Westbury, NY (US)

( * ) Notice: Subject to any disclaimer, the term of this patent is extended or adjusted under 35 U.S.C. 154(b) by 167 days.

(21) Appl. No.: 16/997,977

(22) Filed: Aug. 20, 2020

(65) Prior Publication Data

US 2020/0379947 A1     Dec. 3, 2020

Related U.S. Application Data

(63) Continuation of application No. 13/799,832, filed on Mar. 13, 2013, now abandoned, which is a
(Continued)

(51) Int. Cl.
*G06F 16/13* (2019.01)
*G01D 4/00* (2006.01)
(Continued)

(52) U.S. Cl.
CPC ............. *G06F 16/13* (2019.01); *G01D 4/004* (2013.01); *H04L 67/06* (2013.01); *G01R 22/063* (2013.01); *Y02B 90/20* (2013.01); *Y04S 20/30* (2013.01)

(58) Field of Classification Search
CPC ......... G06F 16/13; G06F 16/27; G01D 4/004; G01R 22/063; G06Q 50/06; H04L 67/06; Y02B 90/20; Y04S 20/30
See application file for complete search history.

(56) References Cited

U.S. PATENT DOCUMENTS 2,883,255 A    4/1959 Anderson
2,987,704 A    6/1961 Gimpel et al.
(Continued)

FOREIGN PATENT DOCUMENTS

CN    101799681 A    8/2010
CN    111444240 A    7/2020
(Continued)

OTHER PUBLICATIONS

Wikipedia, Burst mode (Computing), https://web.archive.org/web/20081018044345/http://en.wikipedia.org/wiki/Burst_mode_(computing), Oct. 18, 2008, 1 pp. (Year: 2008).*
(Continued)

*Primary Examiner* — Marc S Somers
(74) *Attorney, Agent, or Firm* — Robinson + Cole LLP

(57) ABSTRACT

Systems and methods for collecting, analyzing, billing and reporting data from intelligent electronic devices are provided. Also, systems and methods for managing sensor data are provided. In some embodiments, a system for managing sensor data may include intelligent electronic devices, a server, a plurality of client devices, and a network. Each of the intelligent electronic devices is configured to obtain sensor data related to power parameters distributed to a load. The server is configured to receive the sensor data from the plurality of intelligent electronic devices and store the sensor data in a database. Each client device is configured to retrieve the sensor data from the database. The network enables communication among the server, the plurality of intelligent electronic devices, and the plurality of client devices.

18 Claims, 20 Drawing Sheets

Related U.S. Application Data continuation-in-part of application No. 13/644,877, filed on Oct. 4, 2012, now abandoned.

(60) Provisional application No. 61/755,112, filed on Jan. 22, 2013, provisional application No. 61/542,935, filed on Oct. 4, 2011.

(51) Int. Cl.
*H04L 67/06* (2022.01)
*G01R 22/06* (2006.01)

(56) References Cited

U.S. PATENT DOCUMENTS

| | | | |
|---|---|---|---|
| 3,142,820 A | 7/1964 | Daniels | |
| 3,453,540 A | 7/1969 | Dusheck, Jr. | |
| 3,824,441 A | 7/1974 | Heyman et al. | |
| 4,246,623 A | 1/1981 | Sun | |
| 4,466,071 A | 8/1984 | Russell | |
| 4,489,386 A | 12/1984 | Breddan | |
| 4,884,021 A | 11/1989 | Hammond et al. | |
| 4,996,646 A | 2/1991 | Farrington | |
| 5,014,229 A | 5/1991 | Mofachern | |
| 5,166,887 A | 11/1992 | Farrington et al. | |
| 5,170,360 A | 12/1992 | Porter et al. | |
| 5,185,705 A | 2/1993 | Farrington | |
| 5,212,441 A | 5/1993 | McEachern et al. | |
| 5,224,054 A | 6/1993 | Wallis | |
| 5,233,538 A | 8/1993 | Wallis | |
| 5,237,511 A | 8/1993 | Caird et al. | |
| 5,298,854 A | 3/1994 | McEachern et al. | |
| 5,298,855 A | 3/1994 | McEachern et al. | |
| 5,298,856 A | 3/1994 | McEachern et al. | |
| 5,298,859 A | 3/1994 | McEachern et al. | |
| 5,298,885 A | 3/1994 | McEachern et al. | |
| 5,298,888 A | 3/1994 | McEachern et al. | |
| 5,300,924 A | 4/1994 | McEachern et al. | |
| 5,301,122 A | 4/1994 | Halpern | |
| 5,302,890 A | 4/1994 | McEachern et al. | |
| 5,307,009 A | 4/1994 | McEachern et al. | |
| 5,315,527 A | 5/1994 | Beckwith | |
| 5,347,464 A | 9/1994 | McEachern et al. | |
| 5,544,064 A | 8/1996 | Beckwith | |
| 5,559,719 A | 9/1996 | Johnson et al. | |
| 5,574,654 A | 11/1996 | Bingham et al. | |
| 5,581,173 A | 12/1996 | Yalla et al. | |
| 5,706,204 A | 1/1998 | Cox et al. | |
| 5,724,556 A * | 3/1998 | Souder | G06F 8/20 |
| | | | 703/2 |
| 5,764,523 A | 6/1998 | Yoshinaga et al. | |
| 5,774,366 A | 6/1998 | Beckwith | |
| 5,796,977 A | 8/1998 | Sarangdhar et al. | |
| 5,801,643 A | 9/1998 | Williams et al. | |
| 5,819,203 A | 10/1998 | Moore et al. | |
| 5,822,165 A | 10/1998 | Moran | |
| 5,832,210 A | 11/1998 | Akiyama et al. | |
| 5,874,903 A | 2/1999 | Shuey et al. | |
| 5,898,387 A | 4/1999 | Davis et al. | |
| 5,899,960 A | 5/1999 | Moore et al. | |
| 5,986,574 A | 11/1999 | Colton | |
| 6,018,690 A | 1/2000 | Saito et al. | |
| 6,028,857 A | 2/2000 | Poor | |
| 6,038,516 A | 3/2000 | Alexander et al. | |
| 6,073,169 A | 6/2000 | Shuey et al. | |
| 6,098,175 A | 8/2000 | Lee | |
| 6,100,817 A | 8/2000 | Mason, Jr. et al. | |
| 6,121,593 A | 9/2000 | Mansbery et al. | |
| 6,151,653 A | 11/2000 | Lin et al. | |
| 6,157,329 A | 12/2000 | Lee et al. | |
| 6,167,329 A | 12/2000 | Engel et al. | |
| 6,195,614 B1 | 2/2001 | Kochan | |
| 6,279,037 B1 * | 8/2001 | Tams | H04L 43/12 |
| | | | 709/223 |
| 6,289,267 B1 * | 9/2001 | Alexander | H02H 3/00 |
| | | | 700/286 |
| 6,343,299 B1 | 1/2002 | Huang et al. | |
| 6,393,458 B1 | 5/2002 | Gigliotti et al. | |
| 6,396,839 B1 | 5/2002 | Ardalan et al. | |
| 6,405,128 B1 | 6/2002 | Bechtolsheim et al. | |
| 6,437,692 B1 | 8/2002 | Petite et al. | |
| 6,487,457 B1 | 11/2002 | Hull et al. | |
| 6,493,644 B1 | 12/2002 | Jonker et al. | |
| 6,496,511 B1 | 12/2002 | Wang et al. | |
| 6,519,537 B1 | 2/2003 | Yang | |
| 6,528,957 B1 | 3/2003 | Luchaco | |
| 6,560,608 B1 * | 5/2003 | Tomm | G06F 16/258 |
| | | | 707/999.102 |
| 6,564,332 B1 | 5/2003 | Nguyen et al. | |
| 6,565,608 B1 | 5/2003 | Fein et al. | |
| 6,615,147 B1 | 9/2003 | Jonker et al. | |
| 6,636,030 B1 | 10/2003 | Rose et al. | |
| 6,657,552 B2 | 12/2003 | Belski et al. | |
| 6,671,654 B1 | 12/2003 | Forth et al. | |
| 6,671,802 B1 | 12/2003 | Ott | |
| 6,717,394 B2 | 4/2004 | Elms | |
| 6,735,535 B1 | 5/2004 | Kagan et al. | |
| 6,751,563 B2 | 6/2004 | Spanier et al. | |
| 6,836,737 B2 | 12/2004 | Petite et al. | |
| 6,842,707 B2 | 1/2005 | Raichle et al. | |
| 6,900,738 B2 | 5/2005 | Crichlow | |
| 6,904,385 B1 | 6/2005 | Budike | |
| 6,957,158 B1 | 10/2005 | Hancock et al. | |
| 6,972,364 B2 | 12/2005 | Diedrichsen | |
| 6,985,087 B2 | 1/2006 | Soliman | |
| 7,006,934 B2 | 2/2006 | Jonker et al. | |
| 7,010,438 B2 | 3/2006 | Hancock et al. | |
| 7,043,459 B2 | 5/2006 | Peevey | |
| 7,049,975 B2 | 5/2006 | Vanderah et al. | |
| 7,050,808 B2 | 5/2006 | Janusz et al. | |
| 7,072,779 B2 | 7/2006 | Hancock et al. | |
| 7,085,824 B2 | 8/2006 | Forth et al. | |
| 7,085,938 B1 | 8/2006 | Pozzuoli et al. | |
| 7,126,493 B2 | 10/2006 | Junker et al. | |
| 7,129,848 B2 | 10/2006 | Milliot et al. | |
| 7,203,319 B2 | 4/2007 | Ben-Zur et al. | |
| 7,243,050 B2 | 7/2007 | Armstrong | |
| 7,249,265 B2 | 7/2007 | Carolsfeld et al. | |
| 7,271,996 B2 | 9/2007 | Kagan et al. | |
| 7,299,308 B2 | 11/2007 | Kondo et al. | |
| 7,304,586 B2 | 12/2007 | Wang et al. | |
| 7,337,081 B1 | 2/2008 | Kagan | |
| 7,342,507 B2 | 3/2008 | Jonker et al. | |
| 7,436,687 B2 | 10/2008 | Patel | |
| 7,444,454 B2 | 10/2008 | Yancey et al. | |
| 7,511,468 B2 | 3/2009 | McEachern et al. | |
| 7,514,907 B2 | 4/2009 | Rajda et al. | |
| 7,616,656 B2 | 11/2009 | Wang et al. | |
| 7,668,663 B2 * | 2/2010 | Kurnik | G06K 9/00503 |
| | | | 702/19 |
| 7,702,779 B1 | 4/2010 | Gupta et al. | |
| 7,739,728 B1 | 6/2010 | Koehler et al. | |
| 7,813,822 B1 | 10/2010 | Hoffberg | |
| 7,899,630 B2 | 3/2011 | Kagan | |
| 7,916,015 B1 | 3/2011 | Evancich et al. | |
| 7,916,060 B2 | 3/2011 | Zhu et al. | |
| 7,921,199 B1 | 4/2011 | Shirriff et al. | |
| 7,961,736 B2 | 6/2011 | Ayyagari | |
| 7,962,298 B2 | 6/2011 | Przydatek et al. | |
| 7,999,696 B2 | 8/2011 | Wang et al. | |
| 8,019,836 B2 | 9/2011 | Elliott et al. | |
| 8,024,073 B2 | 9/2011 | Imes et al. | |
| 8,037,173 B2 | 10/2011 | Tuckey et al. | |
| 8,078,418 B2 | 12/2011 | Banhegyesi et al. | |
| 8,160,824 B2 | 4/2012 | Spanier et al. | |
| 8,190,381 B2 | 5/2012 | Spanier et al. | |
| 8,193,929 B1 | 6/2012 | Siu et al. | |
| 8,250,246 B2 | 8/2012 | Brockmann et al. | |
| 8,335,936 B2 | 12/2012 | Jonsson et al. | |
| 8,402,267 B1 | 3/2013 | Graham et al. | |
| 8,599,036 B2 | 12/2013 | Wang et al. | |
| 8,635,036 B2 | 1/2014 | Pamulaparthy et al. | |
| 8,700,347 B2 | 4/2014 | Spanier et al. | |
| 8,717,007 B2 | 5/2014 | Banhegyesi | |
| 8,812,979 B2 | 8/2014 | Khanke et al. | |

(56) References Cited

U.S. PATENT DOCUMENTS

| | | |
|---|---|---|
| 8,933,815 B2 | 1/2015 | Kagan et al. |
| 8,949,990 B1 | 2/2015 | Hsieh et al. |
| 9,080,894 B2 | 7/2015 | Spanier et al. |
| 9,094,227 B2 | 7/2015 | Park |
| 9,161,102 B2 | 10/2015 | Millstein et al. |
| 9,268,552 B1 | 2/2016 | Kiiskila et al. |
| 9,310,792 B2 | 4/2016 | Lu et al. |
| 9,660,994 B2 | 5/2017 | McQuillan et al. |
| 10,303,860 B2 | 5/2019 | Koval et al. |
| 10,510,000 B1 | 12/2019 | Commons |
| 10,678,964 B2 | 6/2020 | Kawai |
| 10,972,556 B1 | 4/2021 | Cheng et al. |
| 11,276,395 B1 | 3/2022 | Jones et al. |
| 2002/0024453 A1 | 2/2002 | Maeda |
| 2002/0032535 A1 | 3/2002 | Alexander et al. |
| 2002/0048269 A1 | 4/2002 | Hong et al. |
| 2002/0052972 A1 | 5/2002 | Yim |
| 2002/0065872 A1 | 5/2002 | Genske et al. |
| 2002/0073211 A1 | 6/2002 | Lin et al. |
| 2002/0095406 A1* | 7/2002 | Mc George, Jr. ..... G06F 40/226 |
| 2002/0105435 A1 | 8/2002 | Yee et al. |
| 2002/0120723 A1 | 8/2002 | Forth et al. |
| 2002/0129342 A1 | 9/2002 | Kil et al. |
| 2002/0133504 A1 | 9/2002 | Vlahos et al. |
| 2002/0162014 A1 | 10/2002 | Przydatek et al. |
| 2002/0169570 A1 | 11/2002 | Spanier et al. |
| 2002/0174223 A1* | 11/2002 | Childers ............ H04L 41/0856 709/224 |
| 2002/0188706 A1 | 12/2002 | Richards et al. |
| 2003/0005130 A1 | 1/2003 | Cheng |
| 2003/0014200 A1 | 1/2003 | Jonker et al. |
| 2003/0065757 A1 | 4/2003 | Mentze et al. |
| 2003/0084280 A1 | 5/2003 | Bryan et al. |
| 2003/0093429 A1 | 5/2003 | Nishikawa et al. |
| 2003/0110380 A1 | 6/2003 | Carolsfeld et al. |
| 2003/0163508 A1 | 8/2003 | Goodman |
| 2003/0178982 A1 | 9/2003 | Elms |
| 2003/0179714 A1 | 9/2003 | Gilgenbach et al. |
| 2003/0187550 A1 | 10/2003 | Wilson et al. |
| 2003/0200285 A1 | 10/2003 | Hansen et al. |
| 2003/0204756 A1 | 10/2003 | Ransom et al. |
| 2003/0226058 A1 | 12/2003 | Miller et al. |
| 2004/0078474 A1 | 4/2004 | Ramaswamy |
| 2004/0088408 A1 | 5/2004 | Tsyganskiy |
| 2004/0098459 A1 | 5/2004 | Leukert-Knapp et al. |
| 2004/0107025 A1 | 6/2004 | Ransom et al. |
| 2004/0122833 A1 | 6/2004 | Forth et al. |
| 2004/0127775 A1 | 7/2004 | Miyazaki et al. |
| 2004/0128260 A1 | 7/2004 | Amedure et al. |
| 2004/0138834 A1 | 7/2004 | Blackett et al. |
| 2004/0162642 A1 | 8/2004 | Gasper et al. |
| 2004/0170181 A1 | 9/2004 | Bogdon et al. |
| 2004/0172207 A1 | 9/2004 | Hancock et al. |
| 2004/0177062 A1 | 9/2004 | Urquhart et al. |
| 2004/0187028 A1 | 9/2004 | Perkins et al. |
| 2004/0193329 A1 | 9/2004 | Ransom et al. |
| 2004/0208182 A1 | 10/2004 | Boles et al. |
| 2004/0243735 A1 | 12/2004 | Rosenbloom et al. |
| 2004/0250059 A1 | 12/2004 | Ramelson et al. |
| 2005/0027464 A1 | 2/2005 | Jonker et al. |
| 2005/0033956 A1 | 2/2005 | Krempl |
| 2005/0060110 A1 | 3/2005 | Jones et al. |
| 2005/0093571 A1 | 5/2005 | Suaris et al. |
| 2005/0138421 A1 | 6/2005 | Fedronic et al. |
| 2005/0138432 A1 | 6/2005 | Ransom et al. |
| 2005/0144437 A1 | 6/2005 | Ransom et al. |
| 2005/0169309 A1 | 8/2005 | Tripathi et al. |
| 2005/0183128 A1 | 8/2005 | Assayag et al. |
| 2005/0187725 A1 | 8/2005 | Cox |
| 2005/0202808 A1 | 9/2005 | Fishman et al. |
| 2005/0234837 A1 | 10/2005 | Ramachandran et al. |
| 2005/0240540 A1 | 10/2005 | Borleske et al. |
| 2005/0251535 A1* | 11/2005 | Theissen ................ G06Q 10/10 |
| 2005/0253682 A1 | 11/2005 | Kato et al. |
| 2005/0273280 A1 | 12/2005 | Cox |
| 2005/0273281 A1* | 12/2005 | Wall ...................... G06Q 50/06 702/60 |
| 2006/0020788 A1 | 1/2006 | Han et al. |
| 2006/0047787 A1 | 3/2006 | Agarwal et al. |
| 2006/0052958 A1 | 3/2006 | Hancock et al. |
| 2006/0066456 A1 | 3/2006 | Jonker et al. |
| 2006/0066903 A1 | 3/2006 | Shiimori |
| 2006/0083260 A1 | 4/2006 | Wang et al. |
| 2006/0085419 A1 | 4/2006 | Rosen |
| 2006/0089932 A1 | 4/2006 | Buehler et al. |
| 2006/0145890 A1 | 7/2006 | Junker et al. |
| 2006/0155422 A1 | 7/2006 | Uy et al. |
| 2006/0155442 A1 | 7/2006 | Luo et al. |
| 2006/0161360 A1 | 7/2006 | Yao et al. |
| 2006/0161400 A1 | 7/2006 | Kagan |
| 2006/0200599 A1 | 9/2006 | Manchester et al. |
| 2006/0206433 A1 | 9/2006 | Scoggins |
| 2006/0265720 A1 | 11/2006 | Cai et al. |
| 2006/0267560 A1 | 11/2006 | Rajda et al. |
| 2006/0274899 A1 | 12/2006 | Zhu et al. |
| 2007/0047735 A1 | 3/2007 | Celli et al. |
| 2007/0058634 A1 | 3/2007 | Gupta et al. |
| 2007/0061786 A1 | 3/2007 | Zhou et al. |
| 2007/0067119 A1 | 3/2007 | Loewen et al. |
| 2007/0067121 A1 | 3/2007 | Przydatek et al. |
| 2007/0096765 A1 | 5/2007 | Kagan |
| 2007/0096942 A1 | 5/2007 | Kagan et al. |
| 2007/0106618 A1 | 5/2007 | Wu et al. |
| 2007/0114987 A1 | 5/2007 | Kagan |
| 2007/0120705 A1 | 5/2007 | Kiiskila et al. |
| 2007/0136236 A1 | 6/2007 | Kussmaul et al. |
| 2007/0152058 A1 | 7/2007 | Yeakley et al. |
| 2007/0186111 A1 | 8/2007 | Durand |
| 2007/0240159 A1 | 10/2007 | Sugiyama |
| 2007/0255861 A1 | 11/2007 | Kain et al. |
| 2007/0263643 A1 | 11/2007 | Wadhawan |
| 2007/0266004 A1* | 11/2007 | Wall .................... G06F 16/2477 |
| 2008/0028395 A1 | 1/2008 | Motta et al. |
| 2008/0033786 A1 | 2/2008 | Boaz et al. |
| 2008/0033920 A1 | 2/2008 | Colclasure et al. |
| 2008/0046205 A1 | 2/2008 | Gilbert et al. |
| 2008/0052384 A1 | 2/2008 | Marl et al. |
| 2008/0071482 A1 | 3/2008 | Zweigle et al. |
| 2008/0074285 A1 | 3/2008 | Guthrie |
| 2008/0077806 A1 | 3/2008 | Cui et al. |
| 2008/0086222 A1 | 4/2008 | Kagan |
| 2008/0103631 A1 | 5/2008 | Koliwad et al. |
| 2008/0104149 A1* | 5/2008 | Vishniac ................ G06F 16/22 |
| 2008/0130639 A1 | 6/2008 | Costa-Requena et al. |
| 2008/0147334 A1 | 6/2008 | Kagan |
| 2008/0168434 A1 | 7/2008 | Gee et al. |
| 2008/0172192 A1 | 7/2008 | Banhegyesi |
| 2008/0187116 A1 | 8/2008 | Reeves et al. |
| 2008/0195562 A1 | 8/2008 | Worth et al. |
| 2008/0195794 A1 | 8/2008 | Banker |
| 2008/0201723 A1 | 8/2008 | Bottaro et al. |
| 2008/0215264 A1 | 9/2008 | Spanier et al. |
| 2008/0228830 A1* | 9/2008 | Hawtin .................. G06Q 10/06 |
| 2008/0234957 A1 | 9/2008 | Banhegyesi et al. |
| 2008/0235355 A1 | 9/2008 | Spanier et al. |
| 2008/0238406 A1 | 10/2008 | Banhegyesi |
| 2008/0238713 A1 | 10/2008 | Banhegyesi et al. |
| 2008/0243404 A1 | 10/2008 | Banhegyesi |
| 2008/0291054 A1 | 11/2008 | Groft |
| 2009/0012728 A1 | 1/2009 | Spanier et al. |
| 2009/0037163 A1 | 2/2009 | Kong et al. |
| 2009/0055912 A1 | 2/2009 | Choi et al. |
| 2009/0070168 A1 | 3/2009 | Thompson et al. |
| 2009/0070447 A1 | 3/2009 | Jubinville et al. |
| 2009/0082879 A1 | 3/2009 | Dooley et al. |
| 2009/0082980 A1 | 3/2009 | Thurmond et al. |
| 2009/0094317 A1 | 4/2009 | Venkitaraman |
| 2009/0096654 A1 | 4/2009 | Zhu et al. |
| 2009/0115626 A1 | 5/2009 | Vaswani et al. |
| 2009/0119476 A1* | 5/2009 | Jernigan ................ G06F 16/214 711/204 |
| 2009/0172519 A1 | 7/2009 | Xu et al. |
| 2009/0190486 A1 | 7/2009 | LaVigne et al. |
| 2009/0196187 A1 | 8/2009 | Ooba et al. |

(56) References Cited

U.S. PATENT DOCUMENTS

| | | |
|---|---|---|
| 2009/0196206 A1 | 8/2009 | Weaver et al. |
| 2009/0228224 A1 | 9/2009 | Spanier et al. |
| 2009/0235075 A1 | 9/2009 | Cho et al. |
| 2009/0235090 A1 | 9/2009 | Chang |
| 2009/0276102 A1 | 11/2009 | Smith et al. |
| 2009/0292894 A1 | 11/2009 | Henry et al. |
| 2009/0300165 A1 | 12/2009 | Tuckey et al. |
| 2009/0307178 A1 | 12/2009 | Kuhns et al. |
| 2009/0327483 A1 | 12/2009 | Thompson et al. |
| 2010/0004350 A1 | 1/2010 | Zalich et al. |
| 2010/0007354 A1 | 1/2010 | Deaver et al. |
| 2010/0030734 A1 | 2/2010 | Chunilal |
| 2010/0031076 A1 | 2/2010 | Wan et al. |
| 2010/0054276 A1 | 3/2010 | Wang et al. |
| 2010/0057387 A1 | 3/2010 | Kagan et al. |
| 2010/0057628 A1 | 3/2010 | Trinidad et al. |
| 2010/0058355 A1 | 3/2010 | Gernaey |
| 2010/0073192 A1 | 3/2010 | Goldfisher et al. |
| 2010/0094851 A1* | 4/2010 | Bent .................. G06F 16/2282 707/706 |
| 2010/0121996 A1 | 5/2010 | Schmidt et al. |
| 2010/0169709 A1 | 7/2010 | Chiu et al. |
| 2010/0169876 A1 | 7/2010 | Mann |
| 2010/0175062 A1 | 7/2010 | Kim |
| 2010/0211682 A1 | 8/2010 | Capomassi et al. |
| 2010/0217871 A1 | 8/2010 | Gammon |
| 2010/0238003 A1 | 9/2010 | Chan et al. |
| 2010/0278187 A1 | 11/2010 | Hart et al. |
| 2010/0299441 A1 | 11/2010 | Hughes et al. |
| 2010/0324845 A1 | 12/2010 | Spanier et al. |
| 2011/0004350 A1 | 1/2011 | Cheifetz et al. |
| 2011/0004426 A1 | 1/2011 | Wright et al. |
| 2011/0015961 A1 | 1/2011 | Chan |
| 2011/0016021 A1 | 1/2011 | Manning |
| 2011/0029461 A1 | 2/2011 | Hardin, Jr. |
| 2011/0040809 A1 | 2/2011 | Spanier et al. |
| 2011/0069709 A1 | 3/2011 | Morris et al. |
| 2011/0072423 A1 | 3/2011 | Fukata |
| 2011/0078305 A1 | 3/2011 | Varela |
| 2011/0093843 A1 | 4/2011 | Endo et al. |
| 2011/0106589 A1 | 5/2011 | Blomberg et al. |
| 2011/0107357 A1 | 5/2011 | Cullimore |
| 2011/0157837 A1 | 6/2011 | Balgard et al. |
| 2011/0178651 A1 | 7/2011 | Choi et al. |
| 2011/0184671 A1 | 7/2011 | Abiprojo et al. |
| 2011/0282508 A1 | 11/2011 | Goutard et al. |
| 2011/0296496 A1 | 12/2011 | O'Donnell et al. |
| 2012/0041696 A1 | 2/2012 | Sanderford et al. |
| 2012/0059932 A1 | 3/2012 | Messer et al. |
| 2012/0078547 A1 | 3/2012 | Murdoch |
| 2012/0079471 A1 | 3/2012 | Vidal et al. |
| 2012/0099478 A1 | 4/2012 | Fu et al. |
| 2012/0109999 A1 | 5/2012 | Futty et al. |
| 2012/0126995 A1 | 5/2012 | Sobotka et al. |
| 2012/0173032 A1 | 7/2012 | Pamulaparthy et al. |
| 2012/0179648 A1* | 7/2012 | Loo ...................... G06F 16/125 707/E17.005 |
| 2012/0209057 A1 | 8/2012 | Siess et al. |
| 2012/0216244 A1 | 8/2012 | Kumar et al. |
| 2012/0245595 A1 | 9/2012 | Kesavadas et al. |
| 2012/0265357 A1 | 10/2012 | Song et al. |
| 2012/0296746 A1 | 11/2012 | Bleadall et al. |
| 2012/0299744 A1 | 11/2012 | Sfaelos |
| 2013/0031201 A1 | 1/2013 | Kagan et al. |
| 2013/0055389 A1 | 2/2013 | Alvarez et al. |
| 2013/0066965 A1 | 3/2013 | Foti |
| 2013/0073059 A1 | 3/2013 | Brian et al. |
| 2013/0073374 A1 | 3/2013 | Heath |
| 2013/0084882 A1 | 4/2013 | Khorashadi et al. |
| 2013/0103657 A1 | 4/2013 | Ikawa et al. |
| 2013/0151849 A1 | 6/2013 | Graham et al. |
| 2013/0158918 A1 | 6/2013 | Spanier et al. |
| 2013/0198507 A1 | 8/2013 | Kasuya |
| 2013/0200702 A1 | 8/2013 | Schöppner |
| 2013/0204450 A1 | 8/2013 | Kagan et al. |
| 2013/0293390 A1 | 11/2013 | Buhan et al. |
| 2013/0318627 A1 | 11/2013 | Lundkvist et al. |
| 2014/0025321 A1 | 1/2014 | Spanier |
| 2014/0058572 A1 | 2/2014 | Stein et al. |
| 2014/0094194 A1 | 4/2014 | Schwent et al. |
| 2014/0149836 A1 | 5/2014 | Bedard et al. |
| 2014/0172885 A1 | 6/2014 | Sekharan |
| 2014/0236371 A1 | 8/2014 | Ishihara et al. |
| 2014/0277788 A1 | 9/2014 | Forbes, Jr. |
| 2014/0281620 A1 | 9/2014 | Rallo et al. |
| 2014/0325679 A1 | 10/2014 | Heo et al. |
| 2015/0039279 A1 | 2/2015 | Volovoi |
| 2015/0089061 A1 | 3/2015 | Li et al. |
| 2015/0143108 A1 | 5/2015 | Demeter et al. |
| 2015/0178865 A1 | 6/2015 | Anderson et al. |
| 2015/0185748 A1 | 7/2015 | Ishchenko et al. |
| 2015/0286394 A1 | 10/2015 | Koval |
| 2015/0294013 A1 | 10/2015 | Ozer |
| 2015/0316907 A1 | 11/2015 | ElBsat et al. |
| 2015/0317151 A1 | 11/2015 | Falcy et al. |
| 2015/0317589 A1 | 11/2015 | Anderson et al. |
| 2015/0324896 A1 | 11/2015 | Marson et al. |
| 2015/0341969 A1 | 11/2015 | Brochu et al. |
| 2016/0011616 A1 | 1/2016 | Janous et al. |
| 2016/0034437 A1 | 2/2016 | Yong et al. |
| 2016/0156184 A1 | 6/2016 | Sharma et al. |
| 2016/0283256 A1 | 9/2016 | Standley et al. |
| 2016/0294953 A1 | 10/2016 | Prabhakar et al. |
| 2016/0359684 A1 | 12/2016 | Rizqi et al. |
| 2016/0364648 A1 | 12/2016 | Du et al. |
| 2017/0011320 A1 | 1/2017 | Anderson et al. |
| 2017/0039372 A1 | 2/2017 | Koval et al. |
| 2017/0063566 A1 | 3/2017 | Seminario et al. |
| 2017/0078455 A1 | 3/2017 | Fisher et al. |
| 2017/0140149 A1 | 5/2017 | Dumas et al. |
| 2017/0147329 A1 | 5/2017 | Shutt et al. |
| 2017/0162320 A1 | 6/2017 | Rumrill |
| 2017/0180137 A1 | 6/2017 | Spanier et al. |
| 2017/0185056 A1 | 6/2017 | Satou |
| 2017/0238805 A1 | 8/2017 | Addison et al. |
| 2017/0270414 A1 | 9/2017 | Ignatova et al. |
| 2017/0285114 A1 | 10/2017 | Bickel et al. |
| 2017/0317495 A1 | 11/2017 | Pavlovski et al. |
| 2017/0323208 A1 | 11/2017 | Al-Mohssen et al. |
| 2017/0373500 A1 | 12/2017 | Shafi et al. |
| 2018/0025423 A1 | 1/2018 | Utsumi et al. |
| 2018/0066860 A1 | 3/2018 | Carlson et al. |
| 2018/0260695 A1 | 9/2018 | Majumdar et al. |
| 2018/0260920 A1 | 9/2018 | Saratsis et al. |
| 2018/0275898 A1 | 9/2018 | Bhansali et al. |
| 2019/0086891 A1 | 3/2019 | Kawamoto et al. |
| 2019/0102411 A1 | 4/2019 | Hung et al. |
| 2019/0138964 A1 | 5/2019 | Morita et al. |
| 2019/0205116 A1 | 7/2019 | Chen et al. |
| 2019/0260204 A1 | 8/2019 | Koval et al. |
| 2019/0340545 A1 | 11/2019 | Minegishi et al. |
| 2019/0349733 A1 | 11/2019 | Nolan et al. |
| 2020/0143522 A1 | 5/2020 | Vogels et al. |
| 2020/0266628 A1 | 8/2020 | Kato et al. |
| 2020/0273268 A1 | 8/2020 | Bhattacharyya et al. |
| 2020/0333767 A1 | 10/2020 | Engelstein et al. |
| 2022/0279220 A1 | 9/2022 | Khavronin et al. |

FOREIGN PATENT DOCUMENTS

| | | |
|---|---|---|
| JP | 2001312712 A | 11/2001 |
| JP | 2009225629 A | 10/2009 |
| KR | 101522175 B1 | 5/2015 |
| WO | 2008099035 A1 | 8/2008 |
| WO | 2009044369 A2 | 4/2009 |
| WO | 2009044369 A3 | 5/2009 |

OTHER PUBLICATIONS

ION Technology, 7500 ION 7600 ION High Visibility Energy & Power Quality Compliance Meters, Power Measurement, specification, pp. 1-8, revision date Nov. 30, 2000.

(56) References Cited

OTHER PUBLICATIONS

Microsoft TechNet, Using DNS Servers with DHCP, Jan. 21, 2005; Accessed from https://technet.microsoft.com/en-us/library/cc787034 on Jun. 9, 2015; pp. 1-4.

"The Debian New Maintainer's Guide", Debian.org, 2011, Chapters 1, 6, and B. retrieved from https://lweb.archive.org/web/2011051401193B/http://www.debian.org/doc/manuals/maint-guide/start.en.html (Apr. 28, 2021). (Year: 2011).

Allard, Jeremie, et al., "Jini meets UPnP: an architecture for Jini/UPnP interoperability.", Proceedings of the 2003 Symposium on Applications and the Internet, 2003. IEEE, 2003, 8 pages.

Andersen, M.P. and Culler, D.E., 2016. Btrdb: Optimizing storage system design for timeseries processing. In 14th {USENIX}Conference on File and Storage Technologies ({FAST} 16) (pp. 39-52). (Year: 2016).

Braden, R (editor), "Requirements for Internet Hosts-Application and Support", RFC 1123, pp. 1-97, Oct. 1989.

Chima, Chikodi, "How Social Media Will Make the smart Energy Grid More Efficient", mashable.com, Feb. 8, 2011, pp. 1-4.

Communicator EXT 3.0 User Manual Revision 1.32, Electro Industries/Gauge Tech, 558 pages, Aug. 27, 2007.

Deutsch, P., Emtage, A., and Marine, A., "How to Use Anonymous FTP", RFC1635, pp. 1-13, May 1994.

Dong Yu, Wayne Xiong, Jasha Droppo, Andreas Stolcke, Guoli Ye, Jinyu Li, Geoffrey Zweig, 2016. Proc. Interspeech: Deep Convolutional Neural Networks with Layer-wise Context Expansion and Attention, 5 pages, Sep. 2016.

Duncan, Brent K. et al., "Protection, metering, monitoring, and control of medium-voltage power systems.", IEEE Transactions on Industry Applications, vol. 40, No. 1, Jan./Feb. 2004; pp. 33-40.

Futura+Series, "Advanced Power Monitoring and Analysis for the 21st Century", Electro Industries/Gauge Tech, specification, 8 pages, Apr. 13, 2000.

Gonzales, Jesus and Papa, Mauricio, "Passive Scanning in Modbus Networks;" 2008, in IFIP International Federation for Information Processing, vol. 253, Critical Infrastructure Protection; 2008; pp. 175-187.

Hubbert, "What is flat file?", WhatIs.com, http://searchsqlserver.techtarget.com/definition/flat-file, Jul. 2006, 1 pp.

HW Virtual Serial Port, "HW Virtual Serial Port" Jul. 2003, http://www.trcontrolsolutions.com/pdfs/hw_vsp_v104_en.pdf; pp. 1-4.

IEC 61000-4-15: Electromagnetic compatibility (EMC) Part 4: Testing and measuring techniques, Section 15: Flickermeter—Functional and design specifications; CENELEC—European Committee for Electrotechnical Standardization; pp. 1-25; Apr. 1998.

ION Technology 7700 ION 3-Phase Power Meter, Analyzer and Controller, Power Measurement, specification, pp. 1-10, revision date Dec. 8, 1998.

ION Technology, 7500 ION High Visibility 3-Phase Energy & Power Quality Meter, Power Measurement, specification, pp. 1-8, revision date Mar. 21, 2000.

ION7550/ion7650 PowerLogic power-monitoring units, Technical data sheets, pp. 1-12, Copyright 2006 Schneider Electric.

Janetzko, H., Stoffel, F., Mittelstadt, S. and Keim, DA, 2014. Anomaly detection for visual analytics of power consumption data. Computers & Graphics, 38, pp. 27-37. (Year: 2014).

Kezunovic, M., 2011. Smart fault location for smart grids. IEEE transactions on smart grid, 2(1), pp. 11-22. (Year: 2011).

Microsoft, Microsoft Computer Dictionary, 5th Ed. 2002; pp. 174, 215, and 276 (excerpt includes table of contents and frontmatter). (Year: 2002).

Natarajan "4 Easy Steps to Upgrade Linksys Wireless Router" thegeekstuff.com, 2009, 3 pages. retreived from https://www.thegeekstuff.com/2009/06/how-to-upgrade-linksys-wireless-router-firmware on Jun. 7, 2019 (Year: 2009).

Nexus 1250 Installation and Operation Manual Revision 1.20, Electro Industries/Gauge Tech, 50 pages, Nov. 8, 2000.

Nexus 1250, Precision Power Meter & Data Acquisition Node, Accumeasure Technology, Electro Industries/Gauge Tech, specification, 16 pages, Nov. 1999.

Pan, J., Zi, Y., Chen, J., Zhou, Z. and Wang, B., 2017. LiftingNet: A novel deep learning network with layerwise feature learningfrom noisy mechanical data for fault classification. I EEE Transactions on Industrial Electronics, 65(6), pp. 4973-4982. (Year: 2017).

Performance Power Meter & Data Acquisition Node, Electro Industries/Gauge Tech, Nexus 1250 specification, 8 pages, Dec. 14, 2000.

Postel, J.B., and Reynolds, J.K. "File Transfer Protocol (FTP)", RFC959, pp. 1-66, Oct. 1985.

PowerLogic Series 4000 Circuit Monitors, pp. 1-4; Document #3020HO0601; Jan. 2006.

RFC2228 FTP Security Extensions; Network Working Group, Internet Society, 1997; Retrieved from https://tools.ietf.org/html/rfc2228 Apr. 18, 2019; (Year: 1997); pp. 1-28.

Speirs, "What is binary file?", WhatIs.com, http://whatis.techtarget.com/definition/binary-file, Apr. 2005, 1 pp.

Trunov, A.S., Voronova, L.I., Voronov, V.I., Sukhachev, D.I. and Strelnikov, V.G., Mar. 2018. Legacy applications modelintegration to support scientific experiment. In 2018 Systems of Signals Generating and Processing in the Field of on BoardCommunications (pp. 1-7). IEEE. (Year: 2018).

Tufekci, P., 2014. Prediction of full load electrical power output of a base load operated combined cycle power plant using machinelearning methods. International Journal of Electrical Power & Energy Systems, 60, pp. 126-140. (Year: 2014).

UPnP Forum, "UPnP Device Architecture 1.0", Rev. Apr. 24, 2008, pp. 1-80.

User's Installation & Operation and User's Programming Manual. The Futura Series, Electro Industries, pp. 1-64, Copyright 1995.

WhatIs.com, "What is a Network Interface Card?", hUps://www.techtarget.com/searchnetworking/definition/network-interface-card?_gl=1*13qjdky*_ga*NzA1MzE3NjAyLjE2Mzl3NzU5NjA.*_ga_TQKE4GS5P9*MTYzMjk1 MDkzNC4yLjEuMTYzMjk1MTY3Ny4w&_ga=2.164813883.525309060.1632950935-705317602.1632775960, Sep. 27, 2021; 5 pp. (Year: 2021).

White, Russ, "Working with IP addresses"; http://web.archive.org/web/20060508172602/http://www.cisco.com/web/about/ac123/ac147/archived_issues/ipj_9-1/ip_addresses.tml, May 8, 2006; Copyright 1992-2006 Cisco Systems, Inc., pp. 1-8.

Wikipedia, File Transfer Protocol, https://web.archive.org/web/20051216071210/http:en.wikipedia.org/wiki/File_Transfer_Protocol, Dec. 16, 2005, 9 pp.

Wikipedia, Universal Plug and Play, https://web.archive.org/web/20010140155336/http://en.wikipedia.org/wiki/Universal_Plug_and_Play, Oct. 14, 2007, 14 pp.

Wikipedia, User Datagram Protocol, https://web.archive.org/web/20050823032448/https://en. wikipedia .org/wiki/User_Datagram_Protocol, Aug. 23, 2005, 2 pp. (Year: 2005).

Wils, Andrew, et al., "Device discovery via residential gateways.", IEEE Transactions on Consumer Electronics, vol. 48, No. 3; Aug. 2002; pp. 478-483.

Yum, Secured Remote Data, Manual Page. 2012; Retrieved from yum.baseurl.org/wiki/securedRemoteData on Apr. 18, 2019. (Dated Reference from Archive.org attached) (Year: 2012) pp. 1-2.

Zeinalipour-Yazti et ai, MicroHash: An Efficient Index Structure for Flash-Based Sensor Devices, Proceedings of the 4th Conference on USENIX Conference on File and Storage Technologies, vol. 4, Dec. 2005, pp. 14.

Zhang, Chun, et al., "On supporting containment queries in relational database management systems.", ACM SIGMOD Record. vol. 30. No. 2. ACM, 2001; pp. 425-436.

Milanovic, J.V., Aung, M.T. and Gupta, C.P., 2005. The influence of fault distribution on stochastic prediction of voltage sags. IEEE Transactions on Power Delivery, 20(1), pp. 278-285. (Year:2005).

"Use Excel as a Web Browser" at https://www.youtube.com/watch?v=A7LukCXev78, one (1) page (Year: 2010).

Codingfreak, "https://web.archive.org/web/201 00426123449/http://codingfreak.blogspot.com/201 0/01 /iptables-rate-limitincoming.htm", pp. 1-3, Apr. 26, 2010.

Crockford, Douglas, "https://web.archive.org/web/20030621080211 /http://www.crockford.com/javascript/jsmin.html", pp. 1-2, Oct. 28, 2002.

Microsoft, Computer Dictionary, 2002, 5th Ed. (Year: 2002) Definition of Javascript, pp. 1-3.

(56) References Cited

OTHER PUBLICATIONS

Paladion, https://www.paladion.net/blogs/introduction-to-code-obfuscation, 2004, pp. 1-52 (Year: 2004).

Khan, ZA and Jayaweera, 0.,2017. Approach for smart meter load profiling in Monte Carlo simulation applications. IETGeneration, Transmission & Distribution, 11 (7), pp. 1856-1864. (Year: 2017).

The Study Genius, "What is N IC (Network Interface Card)? How NIC works?", https://web.archive.org/web/20201117135313/https://www.thestudygenius.com/what-is-nic-network-interface-card/, 9 pp., Nov. 17, 2020 (Year: 2020).

Wikipedia, Dojo Toolkit, hUps://web.archive.org/web/20130201004903/hUps://en.wikipedia.org/wiki/Dojo_ Toolkit, Feb. 1, 2013, 10 pp.(Year: 2013).

Xia et al. 2018 IEEE Access, "Secure Session Key Management Scheme for Meter-Reading System Based on LoRa Technology", pp. 75015-75024 (Year: 2018).

Wiratama et al., "Gas Billing System based on Automatic Meter Reading on Diaphragm Gas Meter with Email Notification", IEEE, 2018 International Electronics Symposium on Knowledge Creation and Intelligent Computing (IES-KCIC), 2018, pp. 395-402.

\* cited by examiner

Assignment of an "Unassigned" Meter to a Group

SYSTEMS AND METHODS FOR COLLECTING, ANALYZING, BILLING, AND REPORTING DATA FROM INTELLIGENT ELECTRONIC DEVICES

PRIORITY

This application is a continuation application of U.S. patent application Ser. No. 13/799,832, filed Mar. 13. 2013, which is a continuation-in-part application of U.S. patent application Ser. No. 13/644,877 filed on Oct. 4, 2012, entitled "INTELLIGENT ELECTRONIC DEVICE COMMUNICATION SOLUTIONS FOR NETWORK TOPOLOGIES", the contents of which are hereby incorporated by reference in its entirety.

This application claims priority to U.S. Provisional Patent Application No. 61/755,112 filed Jan. 22, 2013, entitled "SYSTEMS AND METHODS FOR COLLECTING, ANALYZING, BILLING, AND REPORTING DATA FROM INTELLIGENT ELECTRONIC DEVICES", the contents of which are hereby incorporated by reference in its entirety.

BACKGROUND

Field

The present disclosure relates generally to intelligent electronic devices (IEDs) and, in particular, to systems and methods for collecting, analyzing, billing and reporting data from intelligent electronic devices.

Description of the Related Art

Monitoring of electrical energy by consumers and providers of electric power is a fundamental function within any electric power distribution system. Electrical energy may be monitored for purposes of usage, equipment performance and power quality. Electrical parameters that may be monitored include volts, amps, watts, vars, power factor, harmonics, kilowatt hours, kilovar hours and any other power related measurement parameters. Typically, measurement of the voltage and current at a location within the electric power distribution system may be used to determine the electrical parameters for electrical energy flowing through that location.

Devices that perform monitoring of electrical energy may be electromechanical devices, such as, for example, a residential billing meter or may be an intelligent electronic device ("IED"). Intelligent electronic devices typically include some form of a processor. In general, the processor is capable of using the measured voltage and current to derive the measurement parameters. The processor operates based on a software configuration. A typical consumer or supplier of electrical energy may have many intelligent electronic devices installed and operating throughout their operations. IEDs may be positioned along the supplier's distribution path or within a customer's internal distribution system. IEDs include revenue electric watt-hour meters, protection relays, programmable logic controllers, remote terminal units, fault recorders and other devices used to monitor and/or control electrical power distribution and consumption. IEDs are widely available that make use of memory and microprocessors to provide increased versatility and additional functionality. Such functionality includes the ability to communicate with remote computing systems, either via a direct connection, e.g., a modem, a wireless connection or a network. IEDs also include legacy mechanical or electromechanical devices that have been retrofitted with appropriate hardware and/or software allowing integration with the power management system.

Typically, an IED is associated with a particular load or set of loads that are drawing electrical power from the power distribution system. The IED may also be capable of receiving data from or controlling its associated load. Depending on the type of IED and the type of load it may be associated with, the IED implements a power management function that is able to respond to a power management command and/or generate power management data. Power management functions include measuring power consumption, controlling power distribution such as a relay function, monitoring power quality, measuring power parameters such as phasor components, voltage or current, controlling power generation facilities, computing revenue, controlling electrical power flow and load shedding, or combinations thereof.

Conventional IEDs include the ability to communicate with remote computing systems. Traditionally, IEDs would transfer data using serial based download commands. These commands would be accessed via an RS232, and RS485 or an Ethernet port encapsulating the serial request with an Ethernet message using any Ethernet protocol such as HTTP or TCP/IP. For instance, host software or a "master" would make a request for a set of data from one or more memory registers in an IED slave. At that point, the IED slave would then communicate the data stored in the memory registers back to the host software utilizing a serial transfer. A need exists for systems and methods for efficiently collecting data from various devices, e.g., IEDs. A further need exists for systems and methods for analyzing and reporting such collected data.

SUMMARY

In accordance with embodiments of the present disclosure, IEDs, systems, network topologies and methods thereof may be employed to implement an enterprise-wide energy management reporting, analysis and billing system. The system and method of the present disclosure imports historical log energy usage data from meters, IEDs and other sources and generates detailed and useful energy reports for analyzing energy use, planning and load curtailment. In one embodiment, the system operates on a client/server architecture (although other architectures may be employed), where a server/settings editor imports data from various sources enabling at least one client to access the data and generate reports therefrom. The system and method enables multiple users to generate customized energy reports to study energy usage and demand enterprise-wide. For example, a user may be enabled to display Peak Energy Usage for the day, week, and month, or compare usage between meters, locations, and customers. The system's automated billing module allows a user to generate submetering bills based on customized rate structures for energy and other commodities such as water and gas.

According to some embodiments, a system for managing sensor data may comprise a plurality of intelligent electronic devices, each intelligent electronic device being configured to obtain sensor data related to power parameters distributed to a load. The system may also includes a server configured to receive the sensor data from the plurality of intelligent electronic devices, the server further configured to store the sensor data in a database. Also included in the system may be a plurality of client devices, each client device being configured to retrieve the sensor data from the database. The system may also includes a network enabling communication among the server, the plurality of intelligent electronic devices, and the plurality of client devices Other embodiments may include systems comprising a network, a server, and a plurality of data sources. The network enables each of a plurality of components to communicate with at least one other component. The data sources are configured to provide data to the server via the network. For example, the data may be related to electrical parameters sensed by one or more intelligent electronic devices. The server may be configured to receive the data from the data sources, normalize the data in a common format, and store the normalized data. The server is further configured to analyze the normalized data to determine if the normalized data contains at least one anomaly. When the normalized data contains at least one anomaly, the server is further configured to work the normalized data to achieve acceptable results and is further configured to store the worked data.

The present disclosure further describes embodiments of systems comprising a network, server, and data sources. The network enables each of a plurality of devices to communicate with at least one other device. The data source is configured to provide commodity data to the server via the network. Also, the data source is configured to adopt a unique identification code associated with a customer location. When providing the commodity data to the server, the data source is further configured to provide the unique identification code associated with the customer location to the server.

In accordance with other embodiments of the present disclosure, a system may comprise a network, a server, a plurality of meters, and at least one non-meter entity. The network enables each of a plurality of devices to communicate with at least one other device. The plurality of meters may be configured to sense usage of a commodity and provide commodity usage data to the server via the network. The at least one non-meter entity may be configured to provide non-meter data to the server via the network. The server is configured to receive the commodity usage data from the plurality of meters and receive non-meter data from the at least one non-meter entity. Furthermore, the server may be further configured to calculate a new data set from the commodity usage data and non-meter data.

BRIEF DESCRIPTION OF THE DRAWINGS

These and other objects, features and advantages of the present disclosure will be apparent from a consideration of the following Detailed Description considered in conjunction with the drawing Figures, in which.

DETAILED DESCRIPTION

Embodiments of the present disclosure will be described herein below with reference to the accompanying drawings. In the following description, well-known functions or constructions are not described in detail to avoid obscuring the present disclosure in unnecessary detail. The word "exemplary" is used herein to mean "serving as an example, instance, or illustration." Any configuration or design described herein as "exemplary" is not necessarily to be construed as preferred or advantageous over other configurations or designs. Herein, the phrase "coupled" is defined to mean directly connected to or indirectly connected with through one or more intermediate components. Such intermediate components may include both hardware and software based components.

It is further noted that, unless indicated otherwise, all functions described herein may be performed in either hardware or software, or some combination thereof. In one embodiment, however, the functions are performed by at least one processor, such as a computer or an electronic data processor, digital signal processor or embedded microcontroller, in accordance with code, such as computer program code, software, and/or integrated circuits that are coded to perform such functions, unless indicated otherwise.

It should be appreciated that the present disclosure can be implemented in numerous ways, including as a process, an apparatus, a system, a device, a method, or a computer readable medium such as a computer readable storage medium or a computer network where program instructions are sent over optical or electronic communication links.

Embodiments of the present disclosure will be described herein below with reference to the accompanying drawings.

As used herein, intelligent electronic devices ("IEDs") sense electrical parameters and compute data and can be any device including, but not limited to, Programmable Logic Controllers ("PLC's"), Remote Terminal Units ("RTU's"), electric power meters, panel meters, protective relays, fault recorders, phase measurement units, serial switches, smart input/output devices and other devices which are coupled with power distribution networks to manage and control the distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power that they are metering.

Figure 1:
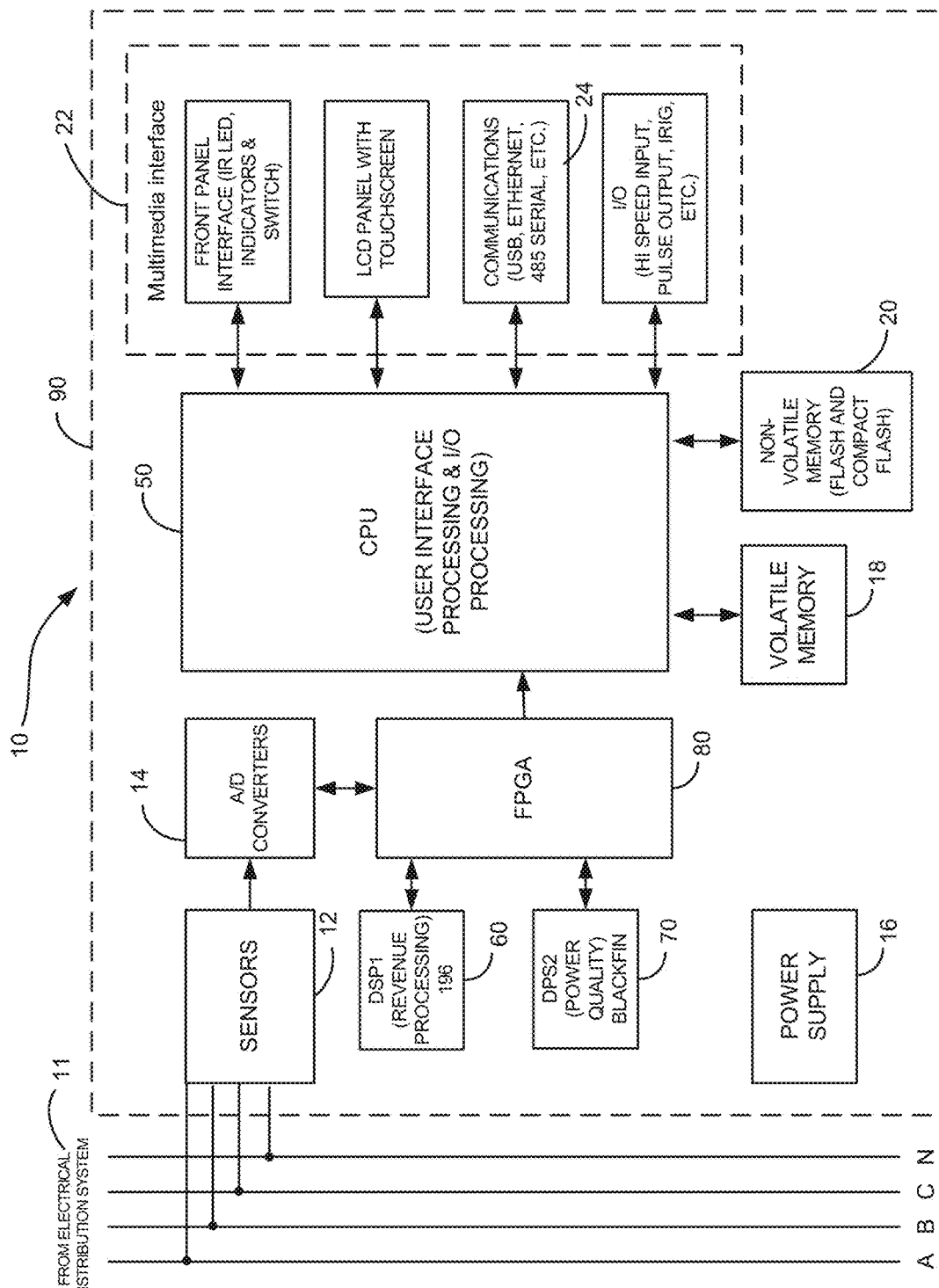
FIG. 1 is a block diagram of an intelligent electronic device (IED), according to an embodiment of the present disclosure.

FIG. 1 is a block diagram of an intelligent electronic device (IED) 10 for monitoring and determining power usage and power quality for any metered point within a power distribution system and for providing a data transfer system for faster and more accurate processing of revenue and waveform analysis.

The IED 10 of FIG. 1 includes a plurality of sensors 12 coupled to various phases A, B, C and neutral N of an electrical distribution system 11, a plurality of analog-to-digital (A/D) converters 14, including inputs coupled to the sensor 12 outputs, a power supply 16, a volatile memory 18, a non-volatile memory 20, a multimedia user interface 22, and a processing system that includes at least one central processing unit (CPU) 50 (or host processor) and one or more digital signal processors, two of which are shown, i.e., DSP1 60 and DSP2 70. The IED 10 also includes a Field Programmable Gate Array 80 which performs a number of functions, including, but not limited to, acting as a communications gateway for routing data between the various processors 50, 60, 70, receiving data from the A/D converters 14 performing transient detection and capture and performing memory decoding for CPU 50 and the DSP processor 60. In one embodiment, the FPGA 80 is internally comprised of two dual port memories to facilitate the various functions. It is to be appreciated that the various components shown in FIG. 1 are contained within housing 90. Exemplary housings will be described below in relation to FIGS. 2A-2H.

The plurality of sensors 12 sense electrical parameters, e.g., voltage and current, on incoming lines, (i.e., phase A, phase B, phase C, neutral N), from an electrical power distribution system 11 e.g., an electrical circuit. In one embodiment, the sensors 12 will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current. The output of each transformer will be coupled to the A/D converters 14 configured to convert the analog output voltage from the transformer to a digital signal that can be processed by the CPU 50, DSP1 60, DSP2 70, FPGA 80 or any combination thereof.

A/D converters 14 are respectively configured to convert an analog voltage output to a digital signal that is transmitted to a gate array, such as Field Programmable Gate Array (FPGA) 80. The digital signal is then transmitted from the FPGA 80 to the CPU 50 and/or one or more DSP processors 60, 70 to be processed in a manner to be described below.

The CPU 50 or DSP Processors 60, 70 are configured to operatively receive digital signals from the A/D converters 14 (see FIG. 1) to perform calculations necessary to determine power usage and to control the overall operations of the IED 10. In some embodiments, CPU 50, DSP1 60 and DSP2 70 may be combined into a single processor, serving the functions of each component. In some embodiments, it is contemplated to use an Erasable Programmable Logic Device (EPLD) or a Complex Programmable Logic Device (CPLD) or any other programmable logic device in place of the FPGA 80. In some embodiments, the digital samples, which are output from the A/D converters 14, are sent directly to the CPU 50 or DSP processors 60, 70, effectively bypassing the FPGA 80 as a communications gateway.

The power supply 16 provides power to each component of the IED 10. In one embodiment, the power supply 16 is a transformer with its primary windings coupled to the incoming power distribution lines and having windings to provide a nominal voltage, e.g., 5 VDC, +12 VDC and −12 VDC, at its secondary windings. In other embodiments, power may be supplied from an independent power source to the power supply 16. For example, power may be supplied from a different electrical circuit or an uninterruptible power supply (UPS).

In one embodiment, the power supply 16 can be a switch mode power supply in which the primary AC signal will be converted to a form of DC signal and then switched at high frequency, such as, for example, 100 Khz, and then brought through a transformer to step the primary voltage down to, for example, 5 Volts AC. A rectifier and a regulating circuit would then be used to regulate the voltage and provide a stable DC low voltage output. Other embodiments, such as, but not limited to, linear power supplies or capacitor dividing power supplies are also contemplated.

The multimedia user interface 22 is shown coupled to the CPU 50 in FIG. 1 for interacting with a user and for communicating events, such as alarms and instructions to the user. The multimedia user interface 22 may include a display for providing visual indications to the user. The display may be embodied as a touch screen, a liquid crystal display (LCD), a plurality of LED number segments, individual light bulbs or any combination. The display may provide information to the user in the form of alpha-numeric lines, computer-generated graphics, videos, animations, etc. The multimedia user interface 22 further includes a speaker or audible output means for audibly producing instructions, alarms, data, etc. The speaker is coupled to the CPU 50 via a digital-to-analog converter (D/A) for converting digital audio files stored in a memory 18 or non-volatile memory 20 to analog signals playable by the speaker. An exemplary interface is disclosed and described in commonly owned pending U.S. application Ser. No. 11/589,381, entitled "POWER METER HAVING AUDIBLE AND VISUAL INTERFACE", which claims priority to expired U.S. Provisional Patent Appl. No. 60/731,006, filed Oct. 28, 2005, the contents of which are hereby incorporated by reference in their entireties.

The IED 10 will support various file types including but not limited to Microsoft Windows Media Video files (.wmv), Microsoft Photo Story files (.asf), Microsoft Windows Media Audio files (.wma), MP3 audio files (.mp3), JPEG image files (.jpg, .jpeg, .jpe, .jfif), MPEG movie files (.mpeg, .mpg, .mpe, .mlv, .mp2v.mpeg2), Microsoft Recorded TV Show files (.dvr-ms), Microsoft Windows Video files (.avi) and Microsoft Windows Audio files (.wav).

The IED 10 further comprises a volatile memory 18 and a non-volatile memory 20. In addition to storing audio and/or video files, volatile memory 18 will store the sensed and generated data for further processing and for retrieval when called upon to be displayed at the IED 10 or from a remote location. The volatile memory 18 includes internal storage memory, e.g., random access memory (RAM), and the non-volatile memory 20 includes removable memory such as magnetic storage memory; optical storage memory, e.g., the various types of CD and DVD media; solid-state storage memory, e.g., a CompactFlash card, a Memory Stick, SmartMedia card, MultiMediaCard (MMC), SD (Secure Digital) memory; or any other memory storage that exists currently or will exist in the future. By utilizing removable memory, an IED can be easily upgraded as needed. Such memory will be used for storing historical trends, waveform captures, event logs including timestamps and stored digital samples for later downloading to a client application, web-server or PC application.

In a further embodiment, the IED 10 will include a communication device 24, also know as a network interface, for enabling communications between the IED or meter, and a remote terminal unit, programmable logic controller and other computing devices, microprocessors, a desktop computer, laptop computer, other meter modules, etc. The communication device 24 may be a modem, network interface card (NIC), wireless transceiver, etc. The communication device 24 will perform its functionality by hardwired and/or wireless connectivity. The hardwire connection may include but is not limited to hard wire cabling e.g., parallel or serial cables, RS232, RS485, USB cable, Firewire (1394 connectivity) cables, Ethernet, and the appropriate communication port configuration. The wireless connection will operate under any of the various wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission or any other type of communication protocols, communication architecture or systems currently existing or to be developed for wirelessly transmitting data including spread spectrum 900 MHz, or other frequencies, Zigbee, WiFi, or any mesh enabled wireless communication.

The IED 10 may communicate to a server or other computing device via the communication device 24. The IED 10 may be connected to a communications network, e.g., the Internet, by any means, for example, a hardwired or wireless connection, such as dial-up, hardwired, cable, DSL, satellite, cellular, PCS, wireless transmission (e.g., 802.11a/b/g), etc. It is to be appreciated that the network may be a local area network (LAN), wide area network (WAN), the Internet or any network that couples a plurality of computers to enable various modes of communication via network messages. Furthermore, the server will communicate using various protocols such as Transmission Control Protocol/Internet Protocol (TCP/IP), File Transfer Protocol (FTP), Hypertext Transfer Protocol (HTTP), etc. and secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, etc. The server will further include a storage medium for storing a database of instructional videos, operating manuals, etc., the details of which will be described in detail below.

In an additional embodiment, the IED 10 will also have the capability of not only digitizing waveforms, but storing the waveform and transferring that data upstream to a central computer, e.g., a remote server, when an event occurs such as a voltage surge or sag or a current short circuit. This data will be triggered and captured on an event, stored to memory, e.g., non-volatile RAM, and additionally transferred to a host computer within the existing communication infrastructure either immediately in response to a request from a remote device or computer to receive said data in response to a polled request. The digitized waveform will also allow the CPU 50 to compute other electrical parameters such as harmonics, magnitudes, symmetrical components and phasor analysis. Using the harmonics, the IED 10 will also calculate dangerous heating conditions and can provide harmonic transformer derating based on harmonics found in the current waveform.

In a further embodiment, the IED 10 will execute an e-mail client and will send e-mails to the utility or to the customer direct on an occasion that a power quality event occurs. This allows utility companies to dispatch crews to repair the condition. The data generated by the meters are use to diagnose the cause of the condition. The data is transferred through the infrastructure created by the electrical power distribution system. The email client will utilize a POP3 or other standard mail protocol. A user will program the outgoing mail server and email address into the meter. An exemplary embodiment of said metering is available in U.S. Pat. No. 6,751,563, which all contents thereof are incorporated by reference herein.

The techniques of the present disclosure can be used to automatically maintain program data and provide field wide updates upon which IED firmware and/or software can be upgraded. An event command can be issued by a user, on a schedule or by digital communication that will trigger the IED 10 to access a remote server and obtain the new program code. This will ensure that program data will also be maintained allowing the user to be assured that all information is displayed identically on all units.

It is to be understood that the present disclosure may be implemented in various forms of hardware, software, firmware, special purpose processors, or a combination thereof. The IED 10 also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, or firmware, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

Figure 2A:
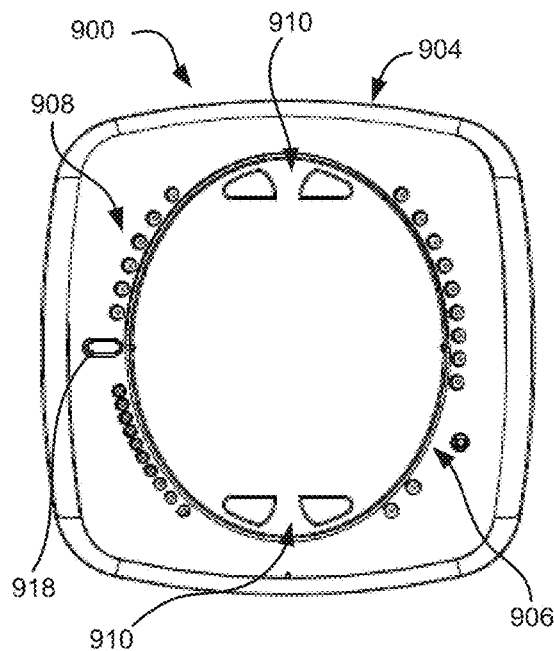
FIGS. 2A-2H illustrate exemplary form factors for an intelligent electronic device (IED) in accordance with an embodiment of the present disclosure.
Figure 2B:
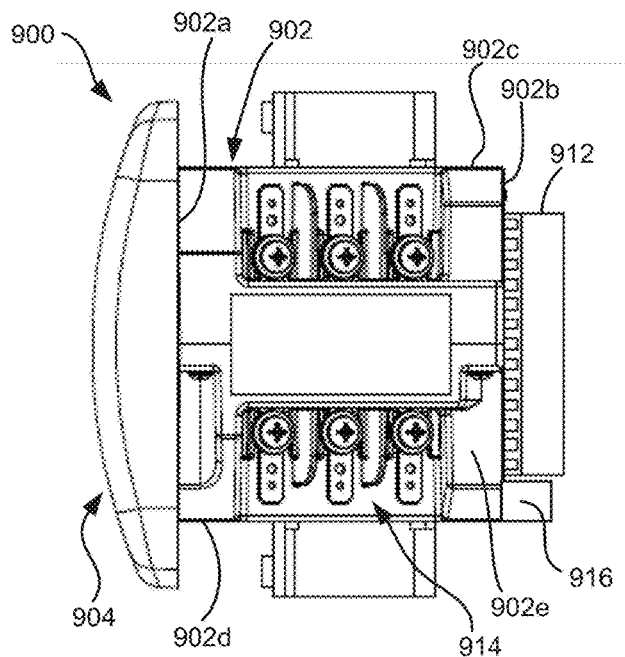

Furthermore, it is to be appreciated that the components and devices of the IED 10 of FIG. 1 may be disposed in various housings depending on the application or environment. For example, the IED 10 may be configured as a panel meter 900 as shown in FIGS. 2A and 2B. The panel meter 900 of FIGS. 2A and 2B is described in more detail in commonly owned U.S. Pat. No. 7,271,996, the contents of which are hereby incorporated by reference. As seen in FIGS. 2A and 2B, the IED 900 includes a housing 902 defining a front surface 902*a*, a rear surface 902*b*, a top surface 902*c*, a bottom surface 902*d*, a right side surface 902*e*, and a left side surface (not shown). Electrical device 900 includes a face plate 904 operatively connected to front surface 902*a* of housing 902. Face plate 904 includes displays 906, indicators 908 (e.g., LEDs and the like), buttons 910, and the like providing a user with an interface for visualization and operation of electrical device 100. For example, as seen in FIG. 2A, face plate 904 of electrical device 900 includes analog and/or digital displays 906 capable of producing alphanumeric characters. Face plate 904 includes a plurality of indicators 908 which, when illuminated, indicate to the user the "type of reading", the "% of load bar", the "parameter designation" which indicates the reading which is being displayed on displays 906, a "scale selector" (e.g., Kilo or Mega multiplier of Displayed Readings), etc. Face plate 904 includes a plurality of buttons 910 (e.g., a "menu" button, an "enter" button, a "down" button, a "right" button, etc.) for performing a plurality of functions, including but not limited to: viewing of meter information; entering display modes; configuring parameters; performing re-sets; performing LED checks; changing settings; viewing parameter values; scrolling parameter values; and viewing limit states. The housing 902 includes voltage connections or inputs 912 provided on rear surface 902*b* thereof, and current inputs 914 provided along right side surface 902*e* thereof. The IED 900 may include a first interface or communication port 916 for connection to a master and/or slave device. Desirably, first communication port 916 is situated in rear surface 902*b* of housing 902. IED 900 may also include a second interface or communication port 918 situated on face plate 904.

Figure 2C:
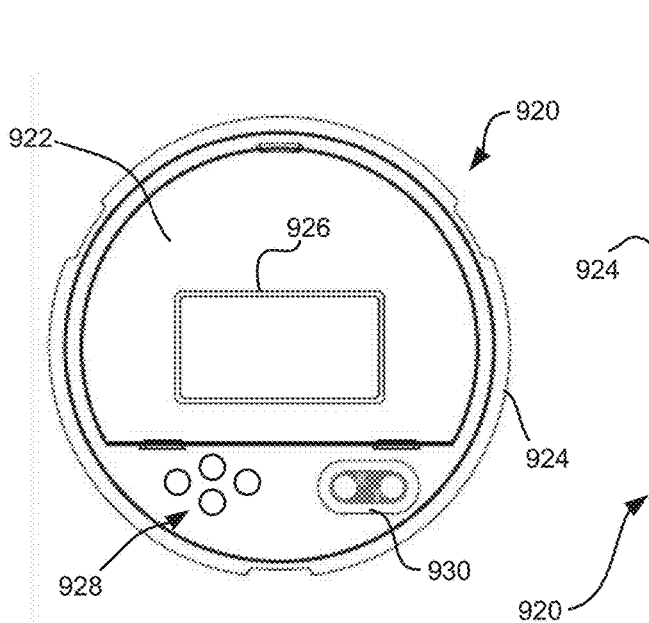
Figure 2D:
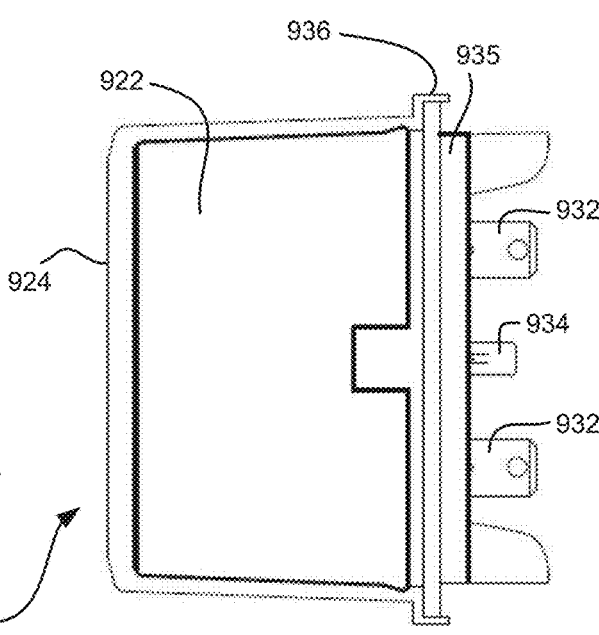

In other embodiment, the IED 10 may be configured as a socket meter 920, also known as a S-base type meter or type S meter, as shown in FIG. 2C an 2D. The socket meter 920 of FIGS. 2C and 2D is described in more detail in commonly owned application Ser. No. 14/578,062 (U.S. Publication No. 2010/0090680), the contents of which are hereby incorporated by reference. Referring to FIGS. 2C and 2D, the meter 920 includes a main housing 922 surrounded by a cover 924. The cover 924 is preferably made of a clear material to expose a display 926 disposed on the main body 922. An interface 928 to access the display and a communication port 930 is also provided and accessible through the cover 924. The meter 920 further includes a plurality of current terminals 932 and voltage terminals 934 disposed on backside of the meter extending through a base 935. The terminals 932, 934 are designed to mate with matching jaws of a detachable meter-mounting device, such as a revenue meter socket. The socket is hard wired to the electrical circuit and is not meant to be removed. To install an S-base meter, the utility need only plug in the meter into the socket. Once installed, a socket-sealing ring 936 is used as a seal between the meter 920 and/or cover 924 and the meter socket to prevent removal of the meter and to indicate tampering with the meter.

Figure 2E:
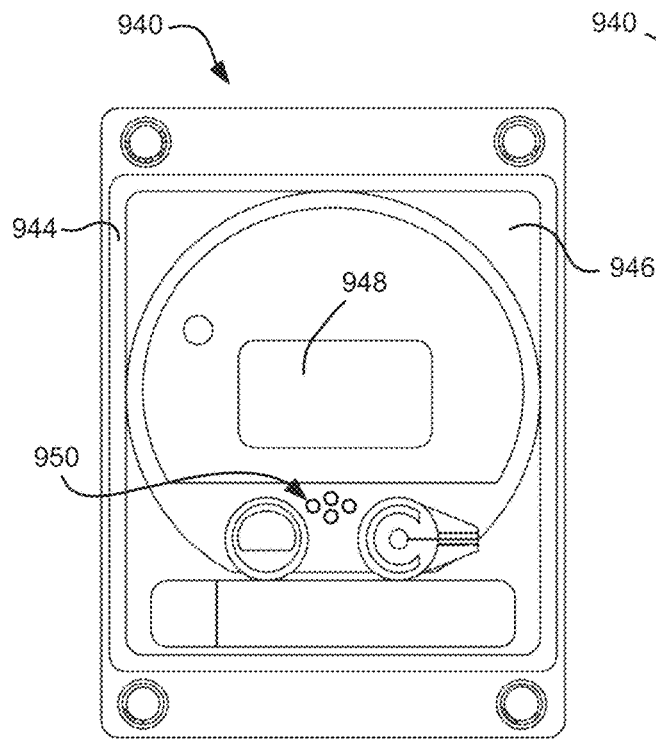
Figure 2F:
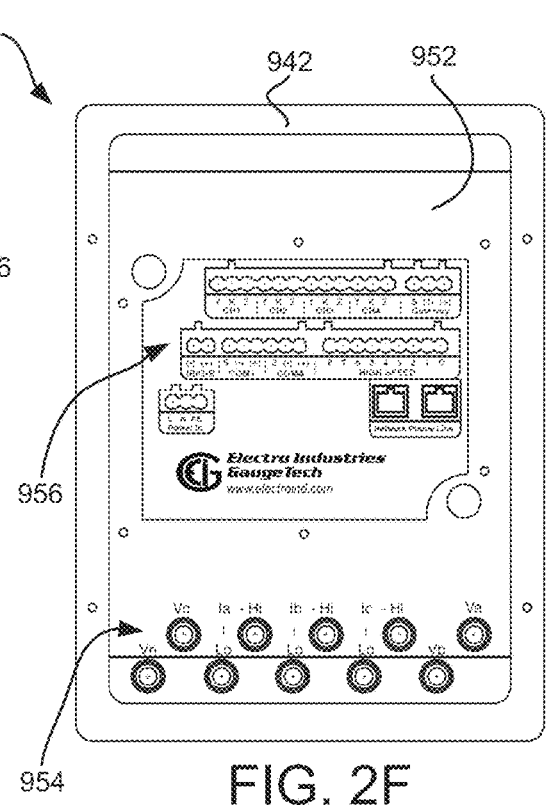

In a further embodiment, the IED 10 of FIG. 1 may be disposed in a switchboard or draw-out type housing 940 as shown in FIGS. 2E and 2F, where FIG. 2E is a front view and FIG. 2F is a rear view. The switchboard enclosure 942 usually features a cover 944 with a transparent face 946 to allow the meter display 948 to be read and the user interface 950 to be interacted with by the user. The cover 944 also has a sealing mechanism (not shown) to prevent unauthorized access to the meter. A rear surface 952 of the switchboard enclosure 942 provides connections for voltage and current inputs 954 and for various communication interfaces 956. Although not shown, the meter disposed in the switchboard enclosure 942 may be mounted on a draw-out chassis which is removable from the switchboard enclosure 942. The draw-out chassis interconnects the meter electronics with the electrical circuit. The draw-out chassis contains electrical connections which mate with matching connectors 954, 956 disposed on the rear surface 952 of the enclosure 942 when the chassis is slid into place.

Figure 2G:
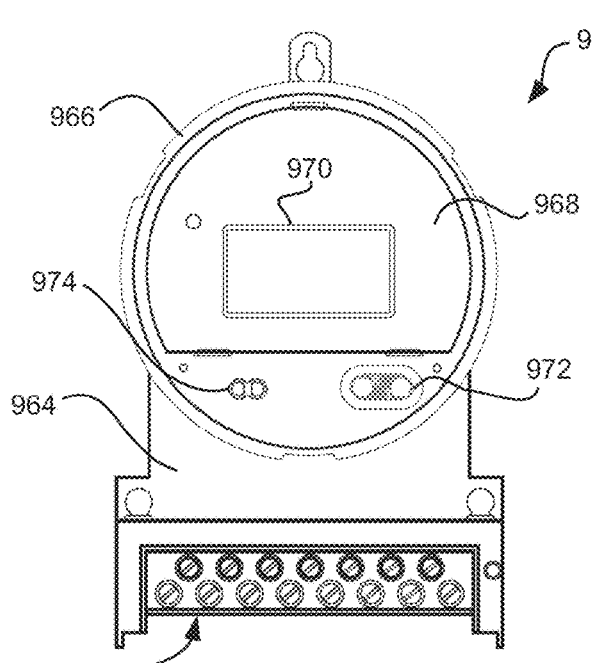
Figure 2H:
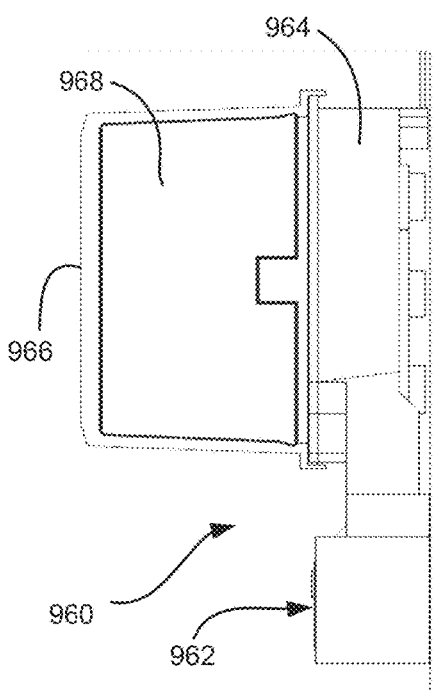

In yet another embodiment, the IED 10 of FIG. 1 may be disposed in an A-base or type A housing as shown in FIGS. 2G and 2H. A-base meters 960 feature bottom connected terminals 962 on the bottom side of the meter housing 964. These terminals 962 are typically screw terminals for receiving the conductors of the electric circuit (not shown). A-base meters 960 further include a meter cover 966, meter body 968, a display 970 and input/output means 972. Further, the meter cover 966 includes an input/output interface 974. The cover 966 encloses the meter electronics 968 and the display 970. The cover 966 has a sealing mechanism (not shown) which prevents unauthorized tampering with the meter electronics.

It is to be appreciated that other housings and mounting schemes, e.g., circuit breaker mounted, are contemplated to be within the scope of the present disclosure.

Figure 3:
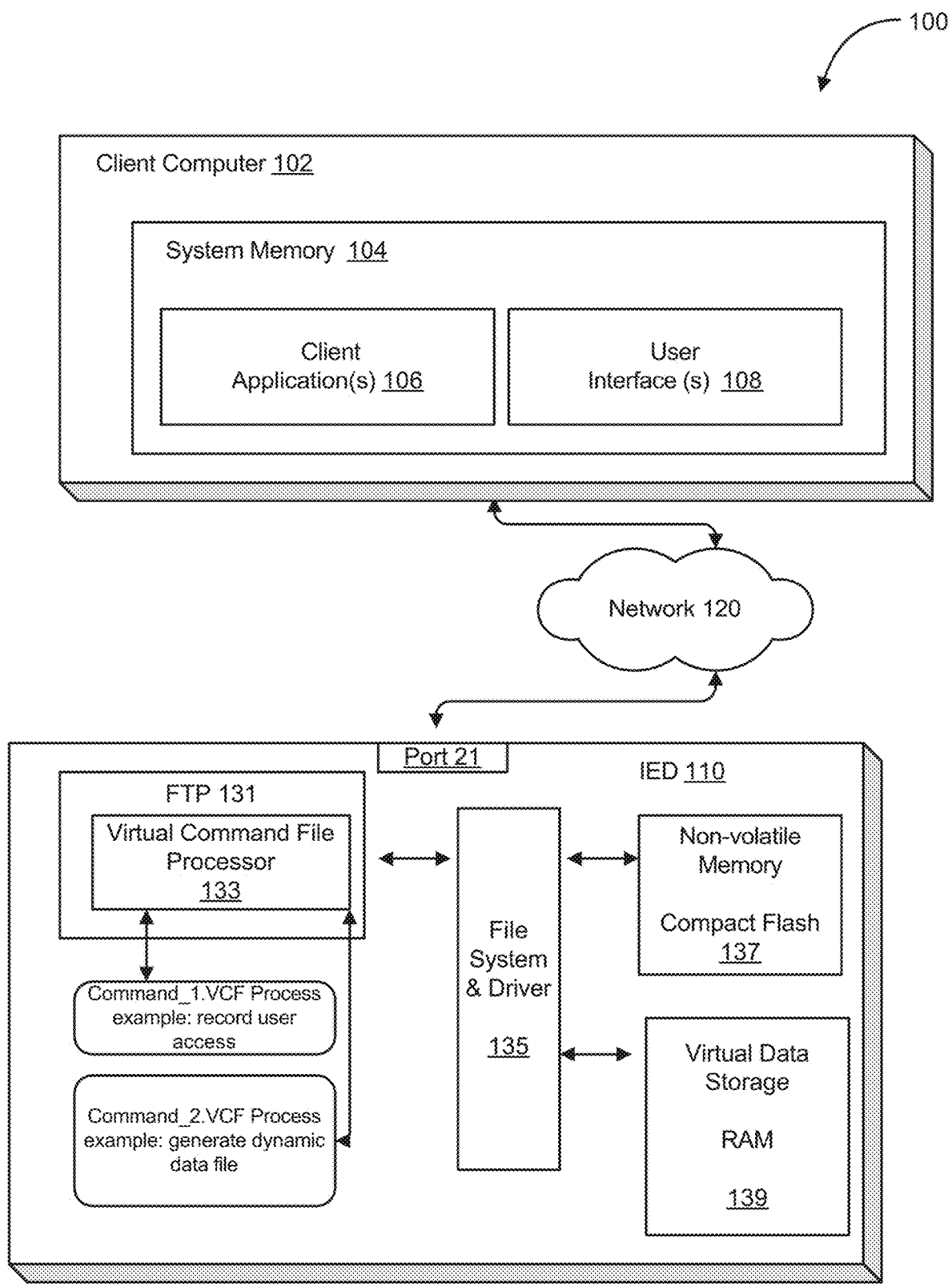
FIG. 3 illustrates an environment in which the present disclosure may be utilized.

FIG. 3 illustrates an exemplary environment 100 in which the present disclosure may be practiced. The network 120 may be the Internet, a public or private intranet, an extranet, wide area network (WAN), local area network (LAN) or any other network configuration to enable transfer of data and commands. An example network configuration uses the Transport Control Protocol/Internet Protocol ("TCP/IP") network protocol suite; however, other Internet Protocol based networks are contemplated by the present disclosure. Communications may also include IP tunneling protocols such as those that allow virtual private networks coupling multiple intranets or extranets together via the Internet. The network 120 may support existing or envisioned application protocols, such as, for example, telnet, POP3, Mime, HTTP, HTTPS, PPP, TCP/IP, SMTP, proprietary protocols, or any other network protocols. During operation, the IED 110 may communicate using the network 120 as will be hereinafter discussed.

It is to be appreciated that there are at least two basic types of networks, based on the communication patterns between the machines: client/server networks and peer-to-peer networks. On a client/server network, every computer, device or IED has a distinct role: that of either a client or a server. A server is designed to share its resources among the client computers on the network. A dedicated server computer often has faster processors, more memory, and more storage space than a client because it might have to service dozens or even hundreds of users at the same time. High-performance servers typically use from two to eight processors (which does not include multi-core CPUs), have many gigabytes of memory installed, and have one or more server-optimized network interface cards (NICs), RAID (Redundant Array of Independent Drives) storage consisting of multiple drives, and redundant power supplies. Servers often run a special network OS—such as Windows Server, Linux, or UNIX—that is designed solely to facilitate the sharing of its resources. These resources can reside on a single server or on a group of servers. When more than one server is used, each server can "specialize" in a particular task (file server, print server, fax server, email server, and so on) or provide redundancy (duplicate servers) in case of server failure. For demanding computing tasks, several servers can act as a single unit through the use of parallel processing. A client device typically communicates only with servers, not with other clients. A client system is a standard PC that is running an OS such as Windows. Current operating systems contain client software that enables the client computers to access the resources that servers share. Older operating systems, such as Windows 3.x and DOS, required add-on network client software to join a network. By contrast, on a peer-to-peer network, every computer or device is equal and can communicate with any other computer or device on the network to which it has been granted access rights. Essentially, every computer or device on a peer-to-peer network can function as both a server and a client; any computer or device on a peer-to-peer network is considered a server if it shares a printer, a folder, a drive, or some other resource with the rest of the network. Note that the actual networking hardware (interface cards, cables, and so on) is the same in both client/server networks and peer-to-peer networks. Only the logical organization, management, and control of the networks vary.

The PC client 102 may comprise any computing device, such as a server, mainframe, workstation, personal computer, hand held computer, laptop telephony device, network appliance, other IED, Programmable Logic Controller, Power Meter, Protective Relay etc. The PC client 102 includes system memory 104, which may be implemented in volatile and/or non-volatile devices. One or more client applications 106, which may execute in the system memory 104, are provided. Such client applications may include, for example, FTP client applications. File Transfer Protocol (FTP) is an application for transfer of files between computers attached to Transmission Control Protocol/Internet Protocol (TCP/IP) networks, including the Internet. FTP is a "client/server" application, such that a user runs a program on one computer system, the "client", which communicates with a program running on another computer system, the "server". Additionally, user interfaces 108 may be included for displaying system configuration, retrieved data and diagnostics associated with the IED 110.

The intelligent electronic device (IED) 110, in one embodiment, is comprised of at least an FTP Server 131 including a Virtual Command File Processor 133, a File System and Driver 135, a non-volatile memory 137 and a virtual data store 139. Of course, the IED 110 may contain other hardware/software for performing functions associated with the IED; however, many of these functions have been described above with respect to FIG. 1 and will therefore not be further discussed.

IED 110 runs the FTP Server 131 as an independent process in the operating system, allowing it to function independently of the other running processes. Additionally, it allows for multiple connections, using the port/socket architecture of TCP/IP.

By running the FTP Server 131 as an independent process, this means that other systems, such as a Modbus TCP handler, can run on IED 110 concurrently with the FTP Server 131. This also means that multiple FTP connections can be made with the only limitation being the system's available resources.

The FTP Server 131 provides access to the file system 135 of the IED 110 on the standard FTP port (port 21). When a connection is made, PC client 102 sends an FTP logon sequence, which includes a USER command and a PASS command. The PC client 102 then interacts with the IED 110, requesting information and writing files, ending in a logout.

The FTP Server 131 uses two ports for all actions. The first port 21, is a clear ASCII telnet channel, and is called the command channel. The second port, which can have a different port number in different applications, is initiated whenever it is necessary to transfer data in clear binary, and is called the data channel.

The virtual data store 139 is an ideal storage medium for files that are written to very frequently, such as, for example, status information, diagnostics, and virtual command files. In contrast to these types of files are files which require more long term storage, such as, for example, logs, settings, and configurations, more suitably stored using a compact flash drive.

The File Transfer Protocol (FTP) (Port 21) is a network protocol used to transfer data from one computer to another through a network, such as over the Internet. FTP is a commonly used protocol for exchanging files over any TCP/IP based network to manipulate files on another computer on that network regardless of which operating systems are involved (if the computers permit FTP access). There are many existing FTP client and server programs. FTP servers can be set up anywhere between game servers, voice servers, internet hosts, and other physical servers.

FTP runs exclusively over TCP. FTP servers by default listen on port 21 for incoming connections from FTP clients. A connection to this port from the FTP Client forms the control stream on which commands are passed to the FTP server from the FTP client and on occasion from the FTP server to the FTP client. FTP uses out-of-band control, which means it uses a separate connection for control and data. Thus, for the actual file transfer to take place, a different connection is required which is called the data stream. Depending on the transfer mode, the process of setting up the data stream is different.

In active mode, the FTP client opens a dynamic port (for example, 49152-65535), sends the FTP server the dynamic port number on which it is listening over the control stream and waits for a connection from the FTP server. When the FTP server initiates the data connection to the FTP client it binds the source port to port 20 on the FTP server.

To use active mode, the client sends a PORT command, with the IP and port as argument. The format for the IP and port is "h1,h2,h3,h4,p1,p2". Each field is a decimal representation of 8 bits of the host IP, followed by the chosen data port. For example, a client with an IP of 192.168.0.1, listening on port 49154 for the data connection will send the command "PORT 192,168,0,1,192,2". The port fields should be interpreted as p1×256+p2=port, or, in this example, 192×256+2=49154.

In passive mode, the FTP server opens a dynamic port (49152-65535), sends the FTP client the server's IP address to connect to and the port on which it is listening (a 16 bit value broken into a high and low byte, like explained before) over the control stream and waits for a connection from the FTP client. In this case the FTP client binds the source port of the connection to a dynamic port between 49152 and 65535.

To use passive mode, the client sends the PASV command to which the server would reply with something similar to "227 Entering Passive Mode (127,0,0,1,192,52)". The syntax of the IP address and port are the same as for the argument to the PORT command.

In extended passive mode, the FTP server operates exactly the same as passive mode, except that it only transmits the port number (not broken into high and low bytes) and the client is to assume that it connects to the same IP address that it was originally connected to.

The objectives of FTP are to promote sharing of files (computer programs and/or data), to encourage indirect or implicit use of remote computers, to shield a user from variations in file storage systems among different hosts and to transfer data reliably, and efficiently.

In one embodiment of the present disclosure, the IED 110 has the ability to provide an external PC client 102 with an improved data transfer rate when making data download requests of data stored within an IED. This is achieved by configuring the IED 110 to include an FTP server 131 including a Virtual Command File Processor 133. An improved data transfer rate from the IED 110 may be realized by the external PC client 102 issuing virtual commands to the IED 110. In response, the IED 110 processes the received virtual commands in the Virtual Command File processor 133 to construct FTP commands therefrom to be applied to a novel file system 135 of the IED 110, coupled to the FTP server 131, wherein the novel file system 135 is configured as a PC file structure amenable to receiving and responding to the constructed FTP commands. The Virtual command files and the novel file system 135 are discussed in greater detail in co-pending application Ser. No. 12/061,979.

While FTP file transfer comprises one embodiment for encapsulating files to improve a data transfer rate from an IED to external PC clients, the present disclosure contemplates the use of other file transfer protocols, such as the Ethernet protocol such as HTTP or TCP/IP for example. Of course, other Ethernet protocols are contemplated for use by the present disclosure. For example, for the purpose of security and firewall access, it may be preferable to utilize HTTP file encapsulation as opposed to sending the data via FTP. In other embodiments, data can be attached as an email and sent via SMTP, for example. Such a system is described in a co-owned U.S. Pat. No. 6,751,563, titled "Electronic Energy meter", the contents of which are incorporated herein by reference. In the U.S. Pat. No. 6,751,563, at least one processor of the IED or meter is configured to collect the at least one parameter and generate data from the sampled at least one parameter, wherein the at least one processor is configured to act as a server for the IED or meter and is further configured for presenting the collected and generated data in the form of web pages.

Figure 4:
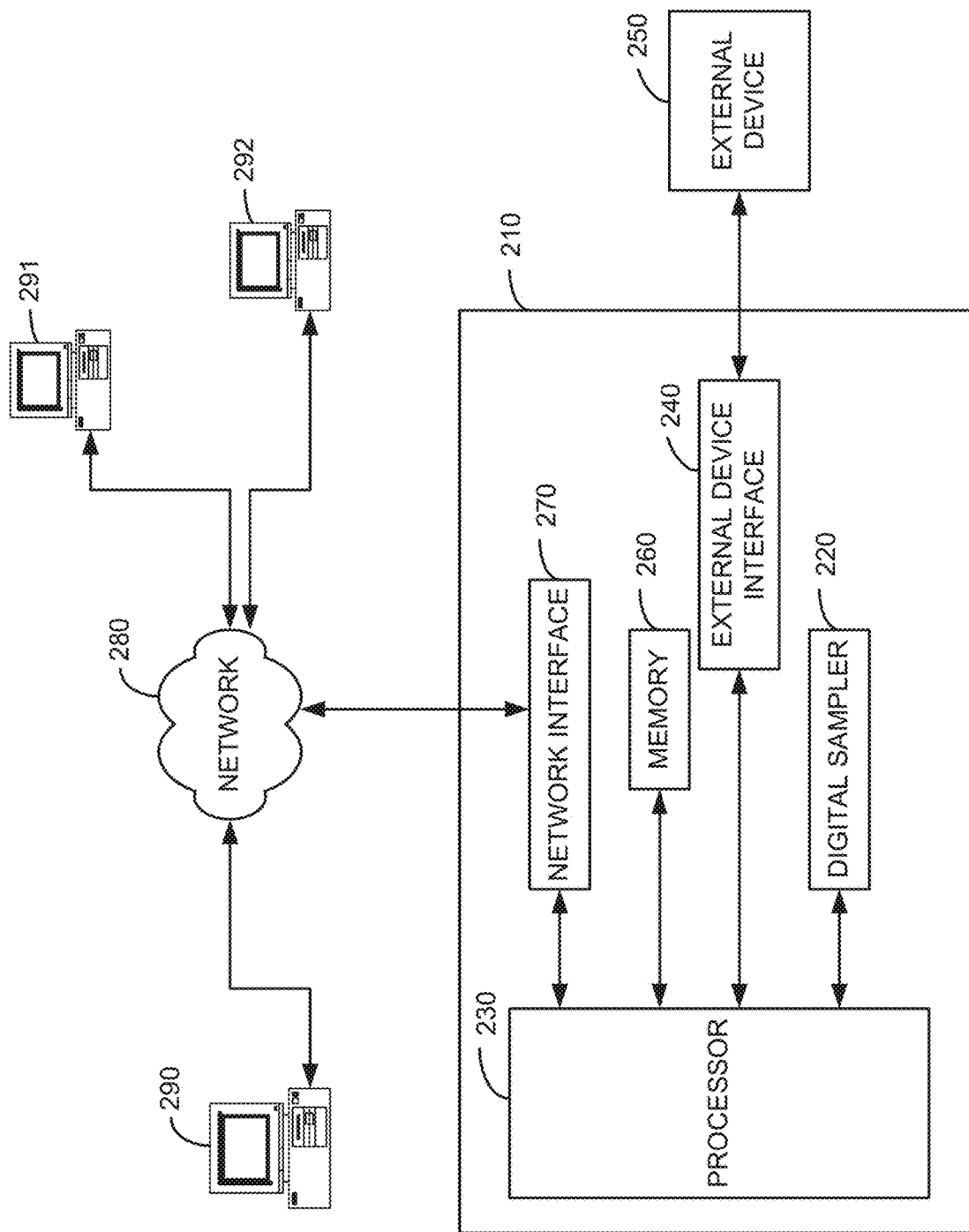
FIG. 4 is a block diagram of a web server power quality and revenue meter, according to an embodiment of the present disclosure.

With reference to U.S. Pat. No. 6,751,563, FIG. 4 is a block diagram of a web server power quality and revenue meter 210. The meter is connected to monitor electric distribution power lines (not shown), to monitor voltage and current at the point of connection. Included therein is digital sampler 220 for digitally sampling the voltage and current of the power being supplied to a customer or monitored at the point of the series connection in the power grid. Digital sampler 220 digitally samples the voltage and current and performs substantially similarly to the A/D converters 14 described above in relation to FIG. 1. The digital samples are then forwarded to processor 230 for processing. It is to be appreciated that the processor 230 may be a single processing unit or a processing assembly including at least one CPU 50, DSP1 60, DSP2 70 and FPGA 80, or any combination thereof. Also connected to processor 230 is external device interface 240 for providing an interface for external devices 250 to connect to meter 210. These external devices might include other power meters, sub-station control circuitry, on/off switches, etc. Processor 230 receives data packets from digital sampler 220 and external devices 250, and processes the data packets according to user defined or predefined requirements. A memory 260 is connected to processor 230 for storing data packets and program algorithms, and to assist in processing functions of processor 230. These processing functions include the power quality data and revenue calculations, as well as formatting data into different protocols which will be described later in detail. Processor 230 provides processed data to network 280 through network interface 270. Network 280 can be the Internet, the World Wide Web (WWW), an intranet, a wide area network (WAN), or local area network (LAN), among others. In one embodiment, the network interface converts the data to an Ethernet TCP/IP format. The use of the Ethernet TCP/IP format allows multiple users to access the power meter 210 simultaneously. In a like fashion, network interface 270 might be comprised of a modem, cable connection, or other devices that provide formatting functions. Computers 290-292 are shown connected to network 280.

A web server program (web server) is contained in memory 260, and accessed through network interface 270. The web server 210 provides real time data through any known web server interface format. For example, popular web server interface formats consist of HTML and XML formats. The actual format of the programming language used is not essential to the present disclosure, in that any web server format can be incorporated herein. The web server provides a user friendly interface for the user to interact with the meter 210. The user can have various access levels to enter limits for e-mail alarms. Additionally, the user can be provided the data in multiple formats including raw data, bar graph, charts, etc. The currently used HTML or XML programming languages provide for easy programming and user friendly user interfaces.

The processor 230 formats the processed data into various network protocols and formats. The protocols and formats can, for example, consist of the web server HTML or XML formats, Modbus TCP, RS-485, FTP or e-mail. Dynamic Host Configuration Protocol (DHCP) can also be used to assign IP addresses. The network formatted data may then be available to users at computers 290-292 through network 280, which connects to meter 210 at the network interface 270. In one embodiment, network interface 270 is an Ethernet interface that supports, for example, 100 base-T or 10 base-T communications. This type of network interface can send and receive data packets between WAN connections and/or LAN connections and the meter 210. This type of network interface allows for situations, for example, where the web server 210 may be accessed by one user while another user is communicating via the Modbus TCP, and a third user may be downloading a stored data file via FTP. The ability to provide access to the meter by multiple users, simultaneously, is a great advantage over the prior art. This can allow for a utility company's customer service personnel, a customer and maintenance personnel to simultaneously and interactively monitor and diagnose possible problems with the power service.

Figure 5:
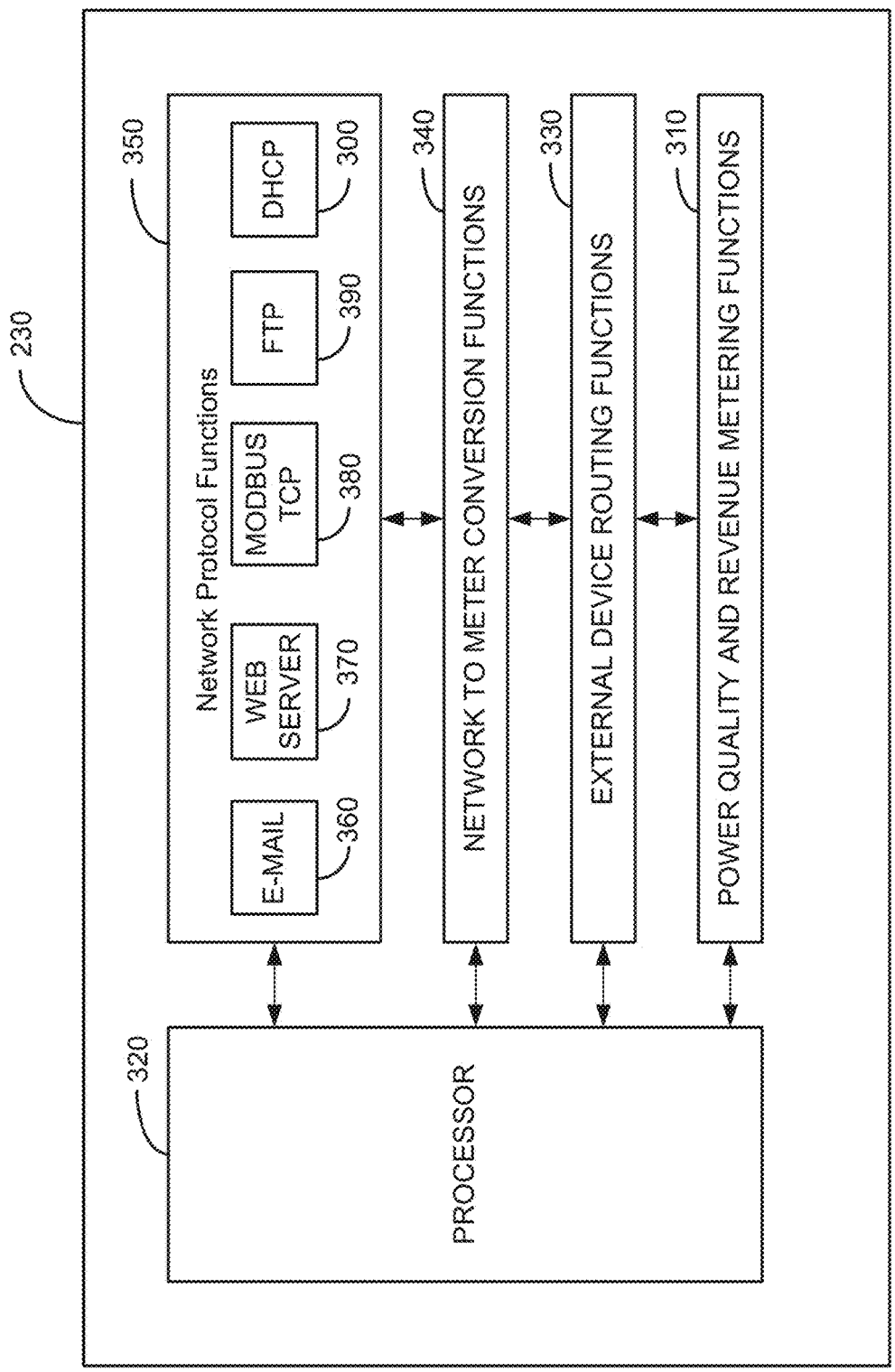
FIG. 5 is a functional block diagram of the processor of the web server power quality and revenue meter system shown in FIG. 4, according to the embodiment of the present invention.

FIG. 5 is a functional block diagram of processor 230 of the web server power quality and revenue meter system 210 according to some embodiments of the present invention. Processor 230 is shown containing four main processing functions. The functions shown are illustrative and not meant to be inclusive of all possible functions performed by processor 230. Power Quality and Revenue Metering functions (metering functions) 310 consist of a complete set of functions which are needed for power quality and revenue metering. Packet data collected by digital sampler 220 is transmitted to processor 320. Processor 320 calculates, for example, power reactive power, apparent power, and power factor. The metering function 310 responds to commands via the network or other interfaces supported by the meter. External Device Routing Functions 330 handle the interfacing between the external device 250 and meter 210. Raw data from external device 250 is fed into meter 210. The external device 250 is assigned a particular address. If more than one external device is connected to meter 210, each device will be assigned a unique particular address. The Network Protocol Functions 350 of meter 210 are executed by processor 320 which executes multiple networking tasks that are running concurrently. As shown in FIG. 5, these include, but are not limited to, the following network tasks included in network protocol functions 350: e-mail 360, web server 370, Modbus TCP 380, FTP 390, and DHCP 300. The e-mail 360 network protocol function can be utilized to send e-mail messages via the network 280 to a user to, for example, notify the user of an emergency situation or if the power consumption reaches a user-set or pre-set high level threshold. As the processor 320 receives packets of data it identifies the network processing necessary for the packet by the port number associated with the packet. The processor 320 allocates the packet to a task as a function of the port number. Since each task is running independently, the meter 210 can accept different types of requests concurrently and process them transparently from each other. For example, the web server 370 may be accessed by one user while another user is communicating via Modbus TCP 380 and at the same time a third user may download a log file via FTP 390. The Network to Meter Protocol Conversion Functions 340 are used to format and protocol convert the different network protocol messages to a common format understood by the other functional sections of meter 210. After the basic network processing of the packet of data, any "commands" or data which are to be passed to other functional sections of meter 210 are formatted and protocol converted to a common format for processing by the Network to Meter Protocol Conversion Functions 340. Similarly, commands or data coming from the meter for transfer over the network are pre-processed by this function into the proper format before being sent to the appropriate network task for transmission over the network. In addition, this function first protocol converts and then routes data and commands between the meter and external devices.

Although the above described embodiments enable users outside of the network the IED or meter is residing on to access the internal memory or server of the IED or meter, IT departments commonly block this access through a firewall to avoid access by dangerous threats into corporate networks. A firewall is a system designed to prevent unauthorized access to or from a private network, e.g., an internal network of a building, a corporate network, etc. Firewalls can be implemented in both hardware and software, or a combination of both. Firewalls are frequently used to prevent unauthorized Internet users from accessing private networks connected to the Internet, especially intranets. All messages entering or leaving the intranet pass through the firewall, which examines each message and blocks those that do not meet the specified security criteria. A firewall may employ one or more of the following techniques to control the flow of traffic in and of the network it is protecting: 1) packet filtering: looks at each packet entering or leaving the network and accepts or rejects it based on user-defined rules; 2) Application gateway: applies security mechanisms to specific applications, such as FTP and Telnet servers; 3) Circuit-level gateway: applies security mechanisms when a TCP or UDP connection is established; once the connection has been made, packets can flow between the hosts without further checking; 4) Proxy server: intercepts all messages entering and leaving the network, effectively hides the true network addresses; and 5) Stateful inspection: does not examine the contents of each packet but instead compares certain key parts of the packet to a database of trusted information; if the comparison yields a reasonable match, the information is allowed through; otherwise it is discarded. Other techniques and to be developed techniques are contemplated to be within the scope of the present disclosure.

In one embodiment, the present disclosure provides for overcoming the problem of not being allowed firewall access to an IED or meter installed within a facility, i.e., the meter is residing on a private network, by enabling an IED to initiate one way communication through the firewall. In this embodiment, the IED or meter posts the monitored and generated data on an Internet site external to the corporate or private network, i.e., on the other side of a firewall. The benefit is that any user would be able to view the data on any computer or web enabled smart device without having to pierce or bypass the firewall. Additionally, there is a business opportunity to host this data on a web server and charge a user a monthly fee for hosting the data. The features of this embodiment can be incorporated into any telemetry application including vending, energy metering, telephone systems, medical devices and any application that requires remotely collecting data and posting it on to a public Internet web site.

Figure 6:
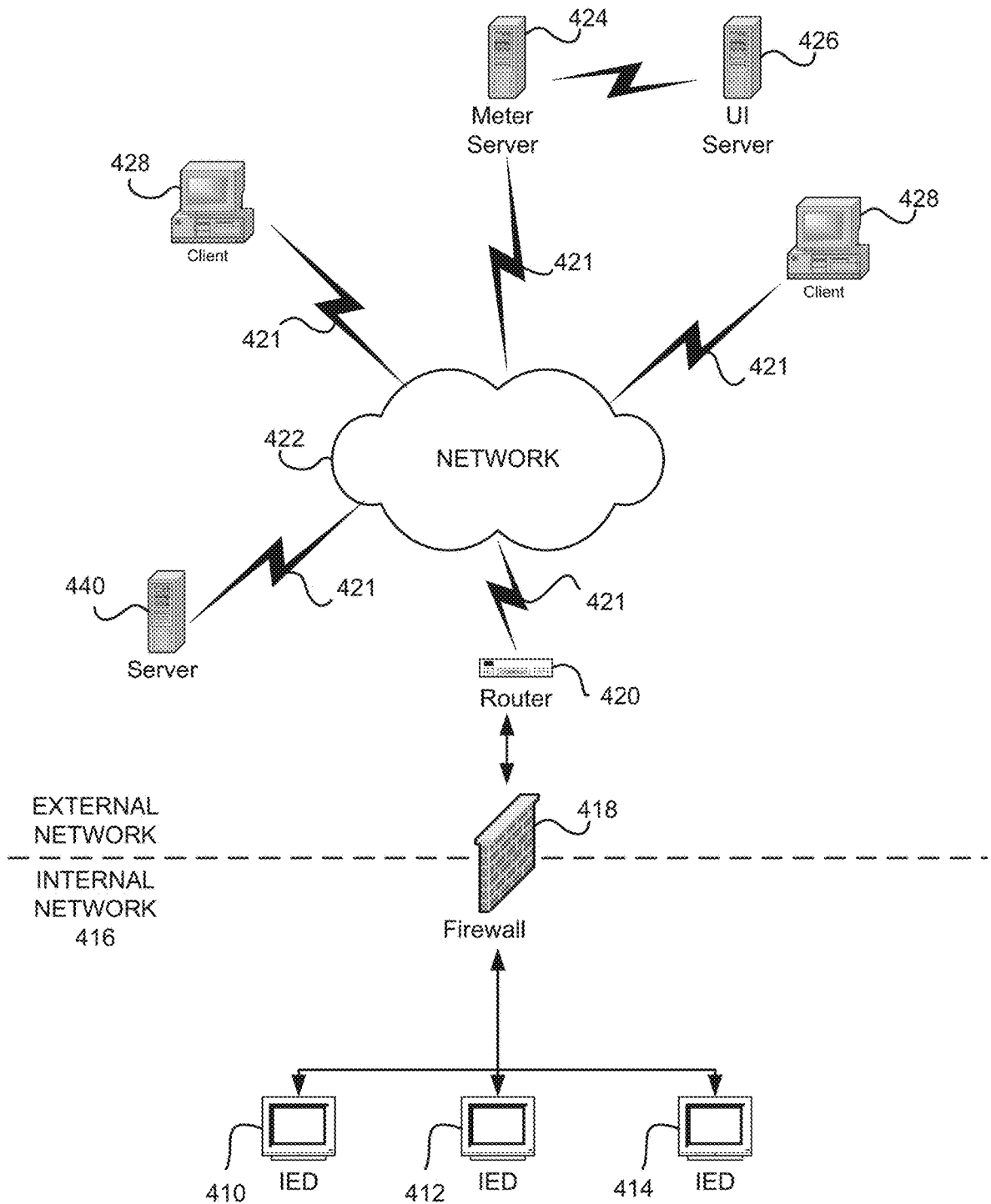
FIG. 6 illustrates another environment in which the present disclosure may be utilized.

In one embodiment, the IED or metering device will communicate through the firewall using a protocol such as HTTP via a port that is open through the firewall. Referring to FIG. 6, IEDs or meters 410, 412 414 reside on an internal network 416, e.g., an intranet, private network, corporate network, etc. The internal network 416 is coupled to an external network 422, e.g., the Internet, via a router 420 or similar device over any known hardwire, fiber optic or wireless connection 421. A firewall 418 is disposed between the internal network 416 and external network 422 to prevent unauthorized access from outside the internal network 416 to the IEDs or meters 410, 412, 414. Although the firewall 418 is shown between the internal network 416 and the router 420 it is to be appreciated that other configurations are possible, for example, the firewall 418 being disposed between the router 420 and external network 422. In other embodiments, the firewall 418 and router 420 may be configured as a single device. It is further to be appreciated that firewall 418 can be implemented in both hardware and software, or a combination of both.

The communication device or network interface of the meter (as described above in relation to FIG. 1) will communicate through the firewall 418 and read a web site server 424. It is to be appreciated that the one way communication from the IED through the firewall may be enabled by various techniques, for example, by enabling outbound traffic to the IP address or domain name of the server 424 or by using a protocol that has been configured, via the firewall settings, to pass through the firewall such as HTTP (Hyper Text Transfer Protocol), IP (Internet Protocol), TCP (Transmission Control Protocol), FTP (File Transfer Protocol), UDP (User Datagram Protocol), ICMP (Internet Control Message Protocol), SMTP (Simple Mail Transport Protocol), SNMP (Simple Network Management Protocol), Telnet, etc. Alternatively, the IED may have exclusive access to a particular port on the firewall, which is unknown to other users on either the internal or external network. Other methods or techniques are contemplated, for example, e-mail, HTTP tunneling, SNTP trap, MSN, messenger, IRQ, Twitter™, Bulletin Board System (BBS), forums, Universal Plug and Play (UPnP), User Datagram Protocol (UDP) broadcast, UDP unicast, Virtual Private Networks (VPN), etc.

The server 424 will provide instructions in computer and/or human readable format to the IED or meter. For instance, the web server 424 might have XML tags that state in computer readable format to provide data for the last hour on energy consumption by 15 minute intervals. The meter 410, 412, 414 will then read those instructions on that web server 424 and then post that data up on the server 424. In this manner, the IED or meter initiates communication in one direction, e.g., an outbound direction, to the server 424.

Another server (or possibly the same server) will read the data that the meter 410, 412, 414 posts and will format the meter data into data that can be viewed for humans on a web site or a software application, i.e., UI Server 426. Servers 424, 426 can also store the data in a database or perform or execute various control commands on the data. Clients 428 may access the IED data stored or posted on servers 424, 426 via a connection to the network 422.

Since the meters are only communicating in an outbound direction only, the meters 410, 412, 414 can read data or instructions from an external network application (e.g., server 424), but the external network application cannot request information directly from the meter. The server 424 posts the data or instructions on the web site and waits for the meter to check the site to see if there has been a new post, i.e., new instructions for the meter. The meter can be programmed at the user's discretion as to frequency for which the meter 410, 412, 414 exits out to the external network to view the postings.

The meter instruction server 424 will post instructions in a directory programmed/located on the server or into XML or in any fashion that the meter is configured to understand and then the meter will post whatever data it is instructed to do. The meter can also be configured to accomplish control commands. In addition to the meter instruction server 424, a user interface (UI) server 426 is provided that can be used to enable a user interface to the user. The user can provide input on the UI server 426 that might trigger the meter instruction server 424 to produce a message to control the energy next time the meter reads that server.

Figure 7:
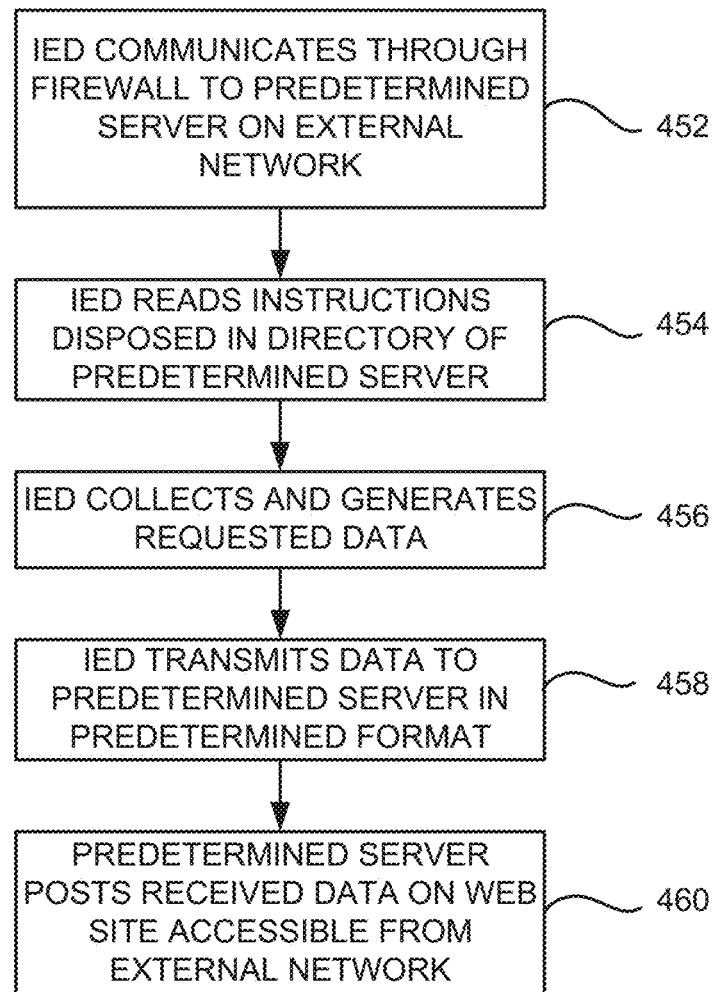
FIG. 7 is a flow chart illustrating a method for communicating data from an IED on an internal network to a server on an external network through a firewall.

Referring to FIG. 7, a method for communicating data from an IED on an internal network to a server on an external network through a firewall is illustrated. In step 452, the IED 410 communicates through the firewall 418 to a predetermined server 424 on an external network 422. The IED 410 may be programmed to periodically communicate to the server at predefined intervals. During this communication session, the IED 410 reads instructions disposed in a directory or folder on the predetermined server 424, step 454. Next, in step 456, the IED 410 collects data from its internal memory or generates data based on the read instructions. The IED 410 then transmits the data to the server 424 in a predetermined format, e.g., extensible markup language (XML), comma-separated value (CSV), etc., step 458. In step 460, the predetermined server 424 posts the received data on a web site accessible from the external network 422. The data may be posted on the server 424 or a UI (user interface) server 426 configured to provide data for end users, e.g., clients 428. It is to be appreciated that the UI server 426 may be configured to post data from several locations in one convenient interface for, for example, an organization managing the several locations. A provider of the servers 424, 426 may charge a fee to the end user for the hosting of the web site and providing the data in a convenient and accessible format.

Figure 8:
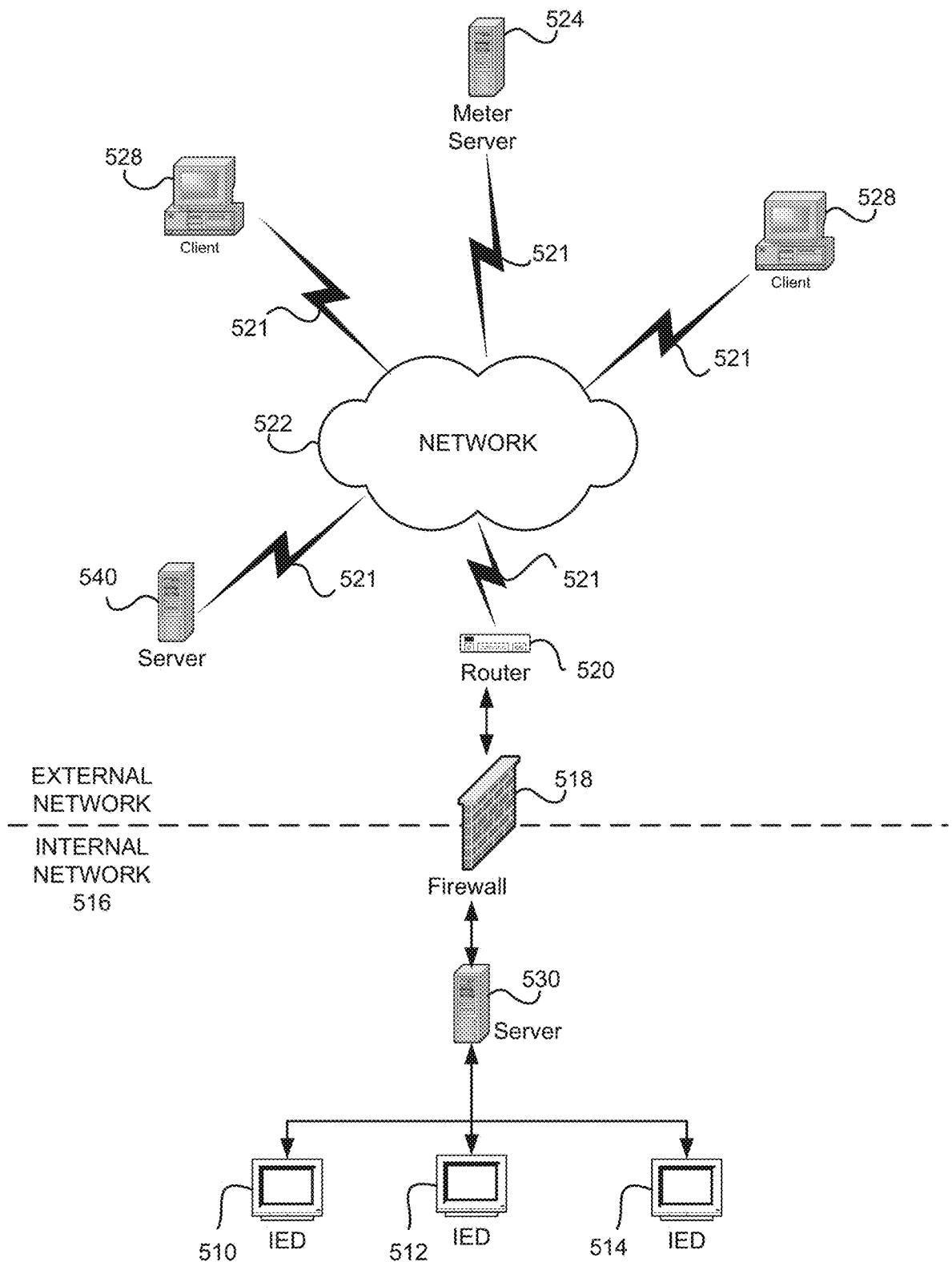
FIG. 8 illustrates yet another environment in which the present disclosure may be utilized.

In another embodiment, the IED or metering device will communicate through the firewall using a server 530 disposed on an internal network protected by a firewall. Referring to FIG. 8, IEDs or meters 510, 512, 514 reside on an internal network 516, e.g., an intranet, private network, corporate network, etc. The internal network 516 is coupled to an external network 522, e.g., the Internet, via a router 520 or similar device over any known hardwire or wireless connection 521. A firewall 518 is disposed between the internal network 516 and external network 522 to prevent unauthorized access from outside the internal network 516 to the IEDs or meters 510, 512, 514. Although the firewall 518 is shown between the internal network 516 and the router 520 it is to be appreciated that other configurations are possible, for example, the firewall 518 being disposed between the router 520 and external network 522. In other embodiments, the firewall 518 and router 520 may be configured as a single device. It is further to be appreciated that firewall 518 can be implemented in both hardware and software, or a combination of both.

In this embodiment, server 530 aggregates data from the various IEDs 510, 512, 514 coupled to the internal or private network 516. Since the server 530 and the IEDs 510, 512, 514 are all on the same side of the firewall 518, generally communications and data transfers among the server 530 and the IEDs 510, 512, 514 is unrestricted. Server 530 then communicates or transfers the data from the IEDs to server 524 on the external network on the other side of the firewall 518. The communication between servers 530 and 524 may be accomplished by any one of the communication means or protocols described in the present disclosure. The server 524 then posts the data from the IEDs 510, 512, 514 making the data accessible to clients 528 on external networks, as described above.

Figure 9:
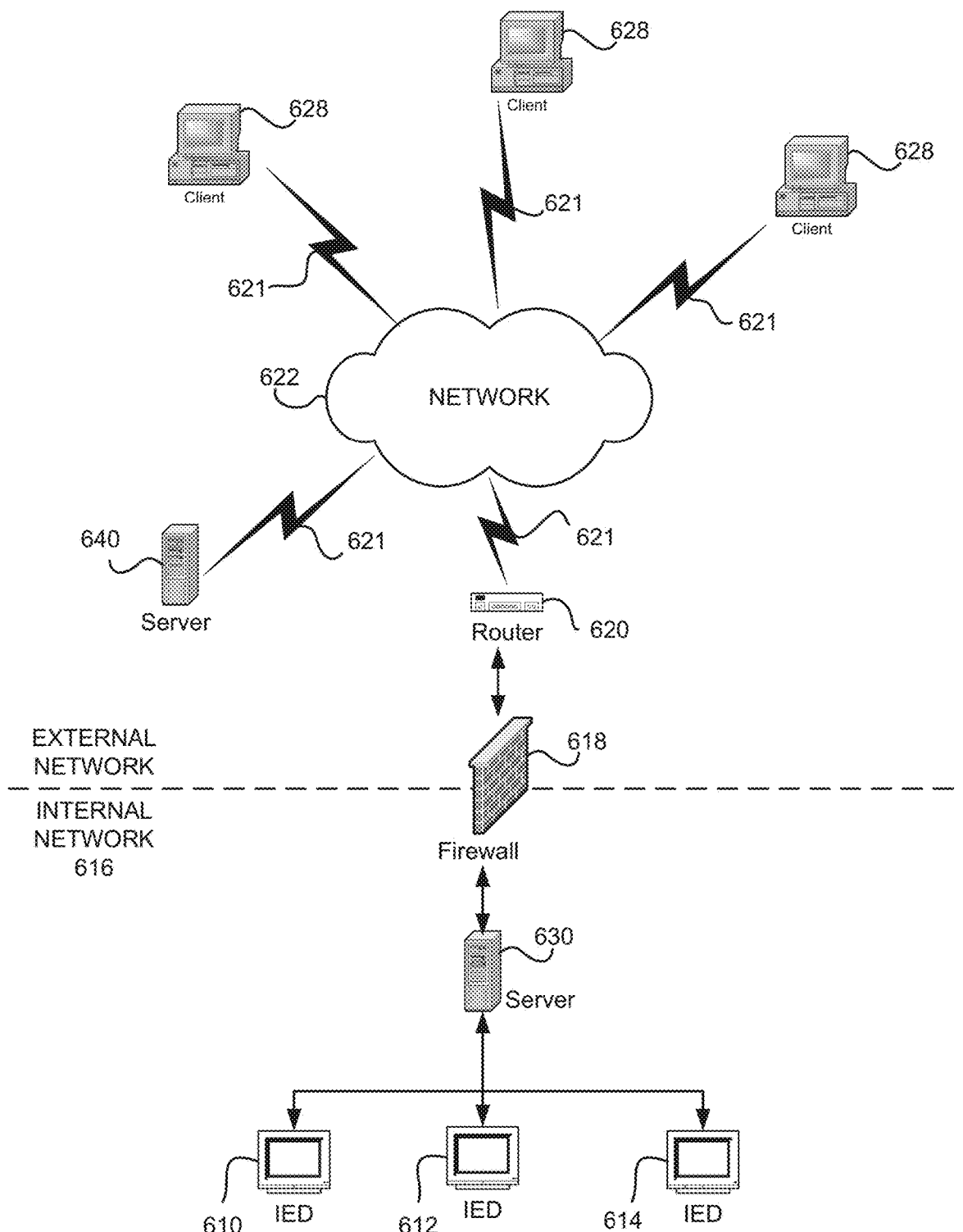
FIG. 9 illustrates a further environment in which the present disclosure may be utilized.

In a further embodiment, the IED or metering device will communicate through the firewall using a server 630 disposed on an internal network protected by a firewall. Referring to FIG. 9, IEDs or meters 610, 612, 614 reside on an internal network 616, e.g., an intranet, private network, corporate network, etc. The internal network 616 is coupled to an external network 622, e.g., the Internet, via a router 620 or similar device over any known hardwire or wireless connection 621. A firewall 618 is disposed between the internal network 516 and external network 622 to prevent unauthorized access from outside the internal network 616 to the IEDs or meters 610, 612, 614. Although the firewall 618 is shown between the internal network 616 and the router 620 it is to be appreciated that other configurations are possible, for example, the firewall 618 being disposed between the router 620 and external network 622. In other embodiments, the firewall 618 and router 620 may be configured as a single device. It is further to be appreciated that firewall 618 can be implemented in both hardware and software, or a combination of both.

In this embodiment, server 630 aggregates data from the various IEDs 610, 612, 614 coupled to the internal or private network 616. Since the server 630 and the IEDs 610, 612, 614 are all on the same side of the firewall 618, generally communications and data transfers among the server 630 and the IEDs 610, 612, 614 is unrestricted. Server 630 then communicates or transfers the data from the IEDs to clients 628 on the external network on the other side of the firewall 618. The communication between server 630 and clients 628 may be accomplished by any one of the communication means or protocols described in the present disclosure.

In another embodiment, each IED 610, 612, 614 may be configured to act as a server to perform the functionality described above obviating the need for server 630.

Furthermore in another embodiment, each IED 610, 612, 614 and each client device 628 may be configured as a server to create a peer-to-peer network, token ring or a combination of any such topology.

The systems and methods of the present disclosure may utilize one or more protocols and/or communication techniques including, but not limited to, e-mail, File Transfer Protocol (FTP), HTTP tunneling, SNTP trap, MSN, messenger, IRQ, Twitter™, Bulletin Board System (BBS), forums, Universal Plug and Play (UPnP), User Datagram Protocol (UDP) broadcast, UDP unicast, Virtual Private Networks (VPN), etc.

In one non-limiting embodiment, each IED sends data to a recipient via electronic mail, also known as email or e-mail. An Internet email message consists of three components, the message envelope, the message header, and the message body. The message header contains control information, including, minimally, an originator's email address and one or more recipient addresses. Usually descriptive information is also added, such as a subject header field and a message submission date/time stamp. Network-based email was initially exchanged on the ARPANET in extensions to the File Transfer Protocol (FTP), but is now carried by the Simple Mail Transfer Protocol (SMTP), first published as Internet standard 10 (RFC 821) in 1982. In the process of transporting email messages between systems, SMTP communicates delivery parameters using a message envelope separate from the message (header and body) itself. Messages are exchanged between hosts using the Simple Mail Transfer Protocol with software programs called mail transfer agents (MTAs); and delivered to a mail store by programs called mail delivery agents (MDAs, also sometimes called local delivery agents, LDAs). Users can retrieve their messages from servers using standard protocols such as POP or IMAP, or, as is more likely in a large corporate environment, with a proprietary protocol specific to Novell Groupwise, Lotus Notes or Microsoft Exchange Servers. Webmail interfaces allow users to access their mail with any standard web browser, from any computer, rather than relying on an email client. Programs used by users for retrieving, reading, and managing email are called mail user agents (MUAs). Mail can be stored on the client, on the server side, or in both places. Standard formats for mailboxes include Maildir and mbox. Several prominent email clients use their own proprietary format and require conversion software to transfer email between them. Server-side storage is often in a proprietary format but since access is through a standard protocol such as IMAP, moving email from one server to another can be done with any MUA supporting the protocol.

In one embodiment, the IED composes a message using a mail user agent (MUA). The IED enters the email address of a recipient and sends the message. The MUA formats the message in email format and uses the Submission Protocol (a profile of the Simple Mail Transfer Protocol (SMTP), see RFC 6409) to send the message to the local mail submission agent (MSA), for example, run by the IED's internet service provider (ISP). The MSA looks at the destination address provided in the SMTP protocol (not from the message header). An Internet email address is a string of the form "recipient@meter." The part before the "@" symbol is the local part of the address, often the username of the recipient, and the part after the "@" symbol is a domain name or a fully qualified domain name. The MSA resolves a domain name to determine the fully qualified domain name of the mail exchange server in the Domain Name System (DNS). The DNS server for the domain responds with any MX records listing the mail exchange servers for that domain, for example, a message transfer agent (MTA) server run by the recipient's ISP. The MSA sends the message to MTA using SMTP. This server may need to forward the message to other MTAs before the message reaches the final message delivery agent (MDA). The MDA delivers it to the mailbox of the recipient. The recipient retrieves the message using either the Post Office Protocol (POP3) or the Internet Message Access Protocol (IMAP4).

Other types of e-mail systems may also be employed, for example, web-based email, POP3 (Post Office Protocol 3) email services, IMAP (Internet Message Protocol) e-mail servers, and MAPI (Messaging Application Programming Interface) email servers to name a few.

In a further embodiment, File Transfer Protocol (FTP) may be employed. Techniques for transferring data from an IED to a device is described in commonly owned pending U.S. patent application Ser. No. 12/061,979, the contents of which are incorporated by reference.

In one embodiment, IEDs employ Universal Plug and Play (UPnP) protocol, which is a set of networking protocols that permits networked devices to discover each other's presence, and notify clients of services available on these devices. UPnP takes the form of UDP broadcast messages, which are sent across a local network, to notify other devices of available services, and http requests to query the details of those devices and services.

In one embodiment, UPnP is employed to allow the network addresses of devices, such as meters, to automatically be discovered by a client. This enables the client software to display a list of all devices which are available. In addition, this could also allow the client software to enable the user to connect to these devices, without having to configure the network address of that device. In addition, the UPnP notify may be used to indicate the health status of the device, including starting up, running, errors in configuration, and resetting.

In another embodiment, UPnP is employed to allow devices, such as meters, to notify the clients of what services they support, such as Modbus, dnp, web, ftp, log download, and data streaming. This could be extended by including information particular to that service or protocol, such as to allow the client to interface with that service with no user input. This could enable the client software to display the device such that the user can focus on the details of the device, rather then worrying about the minutiae of connection information.

In another embodiment, an automated server is configured to perform actions related to these automatically discovered services, such as retrieving real time information, downloading logs, or registering for notification of events. For example, as shown in FIG. 8, a server 530 could be on a network 516 to collect log information from meters 510,

512, 514, and whenever a meter broadcast that it provided log data, the server 530 could automatically collect that data from the meter. As another example, the server 530 could automatically poll and log the real-time readings of all meters on the network, automatically including them as they become available on the network. As described above, the server 530 may then post the data to server 524. Furthermore, the server 530 may automatically download new firmware, retrieve files and change or modify programmable settings in the meters 510, 512, 514.

In one embodiment, HTTP tunneling is employed to send a message (including the IED's or meter's data) to a server, which listens for such messages, and parses out the IED's or meter's data. This could be performed by embedding the meter's data in a HTTP message, which could be sent to the server, for example, server 424 as shown in FIG. 6. The HTTP wrapper would allow this data to pass through firewalls which only allow web traffic. For example, in the architecture of FIG. 6, IED 410 may send a HTTP message containing measured or calculated data through firewall 418 to server 424 or server 430. In another example as shown in FIG. 8, server 530 may collect data from the various IEDs 510, 512, 514 and forward the collected data in a HTTP message through firewall 518 to server 524.

It is to be appreciated that HTTP tunneling applies to system architectures where a server is provided as the receiver of the IED or meter data, as the clients would be unable to process such information. Referring to FIG. 9, server 630 is the destination (and collects) the messages generated from the various IEDs 610, 612, 614, but device 628 is a client, and without server software, would be unable to receive the messages. However, by programming device 628 with server software, the client device 628 becomes a server and can receive the messages.

It is further to be appreciated that the HTTP message can be sent based on various triggers including, but not limited to, time-based trigger, event-based trigger, storage capacity based trigger, etc.

In another embodiment, the IEDs can communicate through to devices using a Simple Network Management Protocol (SNMP) trap. SNMP traps enable an agent, e.g., an agent running on an IED, to notify a management station, e.g., a server, of significant events by way of an unsolicited SNMP message. Upon occurrence of an event, an agent that sends an unsolicited or asynchronous trap to the network management system (NMS), also known as a manager. After the manager receives the event, the manager displays it and can choose to take an action based on the event. For instance, the manager can poll the agent or IED directly, or poll other associated device agents to get a better understanding of the event. For the management system to understand a trap sent to it by an agent, the management system must know what the object identifier (OID) of the trap or message defines. Therefore, the management system or server must have the Management Information Base (MIB) for that trap loaded. This provides the correct OID information so that the network management system can understand the traps sent to it. Additionally, a device does not send a trap to a network management system unless it is configured to do so. A device must know that it should send a trap. The trap destination is usually defined by an IP address, but can be a host name, if the device is set up to query a Domain Name System (DNS) server.

Common chat protocols, such as MSN, AIM, IRQ, IRC, and Skype, could be used to send a message, containing the meter's data, to a public chat server, e.g., server 440, 540, 640, which could then route that message to any desired client. Another possible implementation could be to have a special client that listens for these messages, parses the data contents, and presents them as another manner. In one embodiment, the messages are proprietary format Ethernet messages, typically sent over TCP. It is to be appreciated that the actual format depends on the specific chat protocol.

A public social server that supports a common web interface for posting information, such as Twitter™, Facebook™, BBS's, could be used to post a status, containing the meter's data, to a user on the public social server for that service, e.g., server 440, 540, 640. This post could then be viewed by the clients to see the meter's data, or read by another server for further parsing and presentation. The data could be formatted as human readable text (e.g., "The voltage is 120.2v"), as machine parsable text (e.g., "voltage.an=120.2"), hex representing binary data (e.g., "0152BF5E"). The HTTP interface could be used, which would work the same way as users updating it from their browser (HTTP push). Some of these servers also provide a proprietary format Ethernet message, typically sent over TCP.

In one non-limiting example, a public social server such as the system employed by Facebook may be utilized to post the IEDs data so the data is accessible on the external network outside of the firewall. Facebook uses a variety of services, tools and programming languages to make up its infrastructure which may be employed in the systems and methods of the present disclosure to implement the technique described herein. In the front end, the servers run a LAMP (Linux, Apache, MySQL and PHP) stack with Memcache. Linux is a Unix-like operating system kernel. It is open source, highly customizable, and good for security. Facebook's server runs the Linux operating system Apache HTTP server. For the database, Facebook uses MySQL for its speed and reliability. MySQL is used primarily as a key store of value when the data are randomly distributed among a large number of cases logical. These logical instances extend across physical nodes and load balancing is done at physical node. Facebook uses PHP, since it is a good web programming language and is good for rapid iteration. PHP is a dynamically typed language/interpreter. Memcache is a caching system that is used to accelerate dynamic web sites with databases (like Facebook) by caching data and objects in RAM to reduce reading time. Memcache is the main form of caching on Facebook and helps relieve the burden of database.

Having a caching system allows Facebook to be as fast as it is to remember information. Furthermore, Facebook back-end services are written in a variety of different programming languages like C++, Java, Python, and Erlang. Additionally, it employs the following services: 1.) Thrift—a lightweight remote procedure call framework for scalable cross-language services development, which supports C++, PHP, Python, Perl, Java, Ruby, Erlang, and others; 2.) Escribano (server logs)—a server for aggregating log data streamed in real time on many other servers, it is a scalable framework useful for recording a wide range of data; 3.) Cassandra (database)—a database designed to handle large amounts of data spread out across many servers; 4.) HipHop for PHP—a transformer of source code for PHP script code and was created to save server resources, HipHop transforms PHP source code in C++ optimized, among others. It is to be appreciated that any of the above systems, devices and/or services may be implemented in the various architectures disclosed in the present disclosure to achieve the teaching and techniques described herein.

A public web site, e.g., hosting on server 440, 540, 640, which allows the posting of information, such as a Forum, could be used to post a message, containing the meter's data, to a group, thread, or other location. This post would take place by a HTTP POST to the web site's server, where by the server would store that information, and present it on the web site. This message could then be viewed by the clients to see the meter's data, or read by another server for further parsing and presentation. The data could be formatted as human readable text (e.g., "The voltage is 120.2v"), as machine parsable text (e.g., "voltage.an=120.2"), hex representing binary data (e.g., "0152BF5E"). The HTTP interface could be used, which would work the same way as users updating it from their browser (HTTP push).

User Datagram Protocol (UDP) messages could be used to send a message from the IEDs or meters to a server, which listens for such messages, and parses out the meter's data. When employing UDP broadcasts, messages could be sent from the IEDs or meters to a server, e.g., servers 530, 630, since UDP broadcasts do not work across networks. The messages containing the IED's or meter's data can then be sent to external networks via any of the described (or to be developed) communication methods. Alternatively, a UDP unicast could support sending to any server, e.g., server 424, 524.

A Virtual Private Network (VPN) could be created such that each meter on the internal network is part of the same virtual private network as each of the clients. A Virtual Private Network (VPN) is a technology for using the Internet or another intermediate network to connect computers to isolated remote computer networks that would otherwise be inaccessible. A VPN provides security so that traffic sent through the VPN connection stays isolated from other computers on the intermediate network. VPNs can connect individual IEDs or meters to a remote network or connect multiple networks together. Through VPNs, users are able to access resources on remote networks, such as files, printers, databases, or internal websites. VPN remote users get the impression of being directly connected to the central network via a point-to-point link. Any of the other described (or to be developed) protocols could then be used to push data to another server or clients on the VPN.

Hosted data services, such as a hosted database, cloud data storage, Drop-Box, or web service hosting, could be used as an external server to store the meter's data. Hosted data services can be referred to as Hosting. Each of these Hosts, e.g., servers 440, 540, 640, could then be accessed by the clients to query the Hosted Data. Many of these hosted data services support HTTP Push messages to upload the data, or direct SQL messages. As many web service and cloud hosts allow their users to use their own software, a hosted data service could be further extended by placing proprietary software on them, thus allowing them to act as the external meter server for any of the previously mentioned methods (e.g., servers 424, 524).

In another embodiment, the IEDs can communicate to devices using Generic Object Oriented Substation Event (GOOSE) messages, as defined by the IEC-61850 standard, the content of which are herein incorporated by reference. A GOOSE message is a user-defined set of data that is "published" on detection of a change in any of the contained data items sensed or calculated by the IED. Any IED or device on the LAN or network that is interested in the published data can "subscribe" to the publisher's GOOSE message and subsequently use any of the data items in the message as desired. As such, GOOSE is known as a Publish-Subscribe message. With binary values, change detect is a False-to-True or True-to-False transition. With analog measurements, IEC61850 defines a "deadband" whereby if the analog value changes greater than the deadband value, a GOOSE message with the changed analog value is sent. In situation where changes of state are infrequent, a "keep alive" message is periodically sent by the publisher to detect a potential failure. In the keep-alive message, there is a data item that indicates "The NEXT GOOSE will be sent in XX Seconds" (where XX is a user definable time). If the subscriber fails to receive a message in the specified time frame, it can set an alarm to indicate either a failure of the publisher or the communication network.

The GOOSE message obtains high-performance by creating a mapping of the transmitted information directly onto an Ethernet data frame. There is no Internet Protocol (IP) address and no Transmission Control Protocol (TCP). For delivery of the GOOSE message, an Ethernet address known as a Multicast address is used. A Multicast address is normally delivered to all devices on a Local Area Network (LAN). Many times, the message is only meant for a few devices and doesn't need to be delivered to all devices on the LAN. To minimize Ethernet traffic, the concept of a "Virtual" LAN or VLAN is employed. To meet the reliability criteria of the IEC-61850, the GOOSE protocol automatically repeats messages several times without being asked. As such, if the first GOOSE message gets lost (corrupted), there is a very high probability that the next message or the next or the next will be properly received.

It is to be appreciated that the above-described one-way communication embodiments may apply to systems other than for energy metering. For example, the present disclosure may be applied to a vending machine or system, wherein the vending machine located in a building or structure having a private or corporate network. The vending machine will include, among other data collecting components, at least a communication device or network interface as described above. The communication device or network interface will coupled the vending machine to the internal network which may be further coupled to the Internet via a firewall. The vending machine may vend or dispense a plurality of items, such as soda cans, candy bars, etc., similar to the vending machine described in U.S. Pat. No. 3,178,055, the contents of which are incorporated by reference. In accordance with the present disclosure, the vending machine will monitor and collect data related to the items sold. Such data may include quantities of items sold, a re-stock limit that has been reached, total revenue generated by the vending machine, etc. In one embodiment, the vending machine will post to a web site, residing on a server outside of the internal network such as the Internet, quantities of specific items sold by the vending machine that are required to fill the vending machine. In this manner, an operator that maintains the vending machine can check the web site before going to the location of the vending machine and know exactly how many items are required to fill the vending machine before going to the location to refill the vending machine.

In another embodiment, the teachings of the present disclosure may be applied to a medical device, for example, a medical monitoring device configured to be worn on a patient. In this embodiment, the medical monitoring device will include at least a communication device or network interface as described above and monitor a certain parameter relating to a patient, e.g., a heartbeat. In one embodiment, the at least a communication device or network interface operates on a wireless connection and coupled the medical monitoring device to internal network (e.g., a home network) which may be further coupled to the Internet via a firewall, e.g., a router provided by the Internet Service Provider. At predetermined intervals, the medical monitoring device will communicate to and post the monitored data on a remote website. A user such as a doctor may then view the data of the patient by accessing the web site and not directly connecting to the medical monitoring device.

Other embodiments may include security systems such as fire alarm systems, security alarm systems, etc., which need to report data. Also envisioned are manufacturing sensing equipment, traffic sensing equipment, scientific instrumentation or other types of reporting instrumentation.

Based on the sensitivity of the data being communicated and posted through the firewall to various external networks, various data security techniques are employed by the IEDs (e.g., meters, vending machines, medical monitoring device, etc.) contemplated by the present disclosure, some of which are described below.

The original FTP specification is an inherently insecure method of transferring files because there is no method specified for transferring data in an encrypted fashion. This means that under most network configurations, user names, passwords, FTP commands and transferred files can be "sniffed" or viewed by anyone on the same network using a packet sniffer. This is a problem common to many Internet protocol specifications written prior to the creation of SSL such as HTTP, SMTP and Telnet. The common solution to this problem is to use simple password protection or simple encryption schemes, or more sophisticated approaches using either SFTP (SSH File Transfer Protocol), or FTPS (FTP over SSL), which adds SSL or TLS encryption to FTP as specified in RFC 4217. The inventors have contemplated the use of each of these schemes in the IEDs described above.

In one embodiment, the FTP server 131 in the IED 110 shown in FIG. 3 uses a set of username and passwords which are programmed through Modbus. These username and passwords can only be programmed when a user performs a logon with administrative rights. Each programmed user account can be given differing permissions, which grant or restrict access to different roles within the file system. Each role controls read and write access to specific files and directories within the file system through FTP. These roles can be combined to customize the access a specific user is given. When passwords are disabled by the user, a default user account is used, with full permissions, and a username and password of "anonymous".

Password protection schemes are measured in terms of their password strength which may be defined as the amount of resiliency a password provides against password attacks. Password strength can be measured in bits of entropy. Password strength is an important component of an overall security posture, but as with any component of security, it is not sufficient in itself. Strong passwords can still be exploited by insider attacks, phishing, keystroke login, social engineering, dumpster diving, or systems with vulnerabilities that allow attackers in without passwords. To overcome these drawbacks it is contemplated to use some form of password encryption scheme (e.g., 8-bit, 10-bit, 16-bit) in concert with the password protection system to facilitate secure communication between an external device, such as PC client 102 and the FTP server 131. However, there are drawbacks associated even with these schemes. For example, a username and password may be encoded as a sequence of base-64 characters. For example, the user name Aladdin and password open sesame would be combined as Aladdin:open sesame, which is equivalent to QWxhZGRpbjpvcGVuIHNlc2FtZQ== when encoded in base-64. Little effort is required to translate the encoded string back into the user name and password, and many popular security tools will decode the strings "on the fly", so an encrypted connection should always be used to prevent interception.

In another embodiment, an encrypted connection scheme is used. In particular, the FTP server 131 in the IED 110 uses some form of FTP security encryption, such as, for example, FTPS (FTP over SSL), Secure FTP (sometimes referred to as FTP over SSH, i.e., FTP over Secure Shell encryption (SSH)), Simple File Transfer Protocol (SFTP), or SSH file transfer protocol (SFTP). The FTP security encryption protocol provides a level of security unattainable with the previously described password encryption schemes.

FTP over SSH refers to tunneling a normal FTP session over an SSH connection. In the present disclosure, FTP uses multiple TCP connections, thus it is particularly difficult to tunnel over SSH. With many SSH clients, attempting to set up a tunnel for the control channel (the initial client-to-server connection on port 21) will protect only that channel; when data is transferred, the FTP software at either end will set up new TCP connections (i.e., data channels) which will bypass the SSH connection, and thus have no confidentiality, integrity protection, etc. If the FTP client, e.g., PC client 102, is configured to use passive mode and to connect to a SOCKS server interface, it is possible to run all the FTP channels over the SSH connection. Otherwise, it is necessary for the SSH client software to have specific knowledge of the FTP protocol, and monitor and rewrite FTP control channel messages and autonomously open new forwardings for FTP data channels.

In further embodiments, the networks may be configured to adhere to cyber security standards to minimize the number of successful cyber security attacks. The cyber security standards apply to devices, IEDs, computers and computer networks. The objective of cyber security standards includes protection of information and property from theft, corruption, or natural disaster, while allowing the information and property to remain accessible and productive to its intended users. The term cyber security standards means the collective processes and mechanisms by which sensitive and valuable information and services are protected from publication, tampering or collapse by unauthorized activities or untrustworthy individuals and unplanned events respectively. In the various embodiments and implementations of the present disclosure, the systems, devices and methods may be configured to be in accordance with, for example, the Standard of Good Practice (SoGP) as defined by the Information Security Forum, Critical Infrastructure Protection (CIP) standards as defined by the North American Electric Reliability Corporation (NERC), and the ISA-99 standard as defined by the International Society for Automation (ISA), the contents of each being incorporated by reference herein. It is to be appreciated that this lists of cyber security standards is merely an exemplary list and is not meant to be exhaustive.

Figure 10:
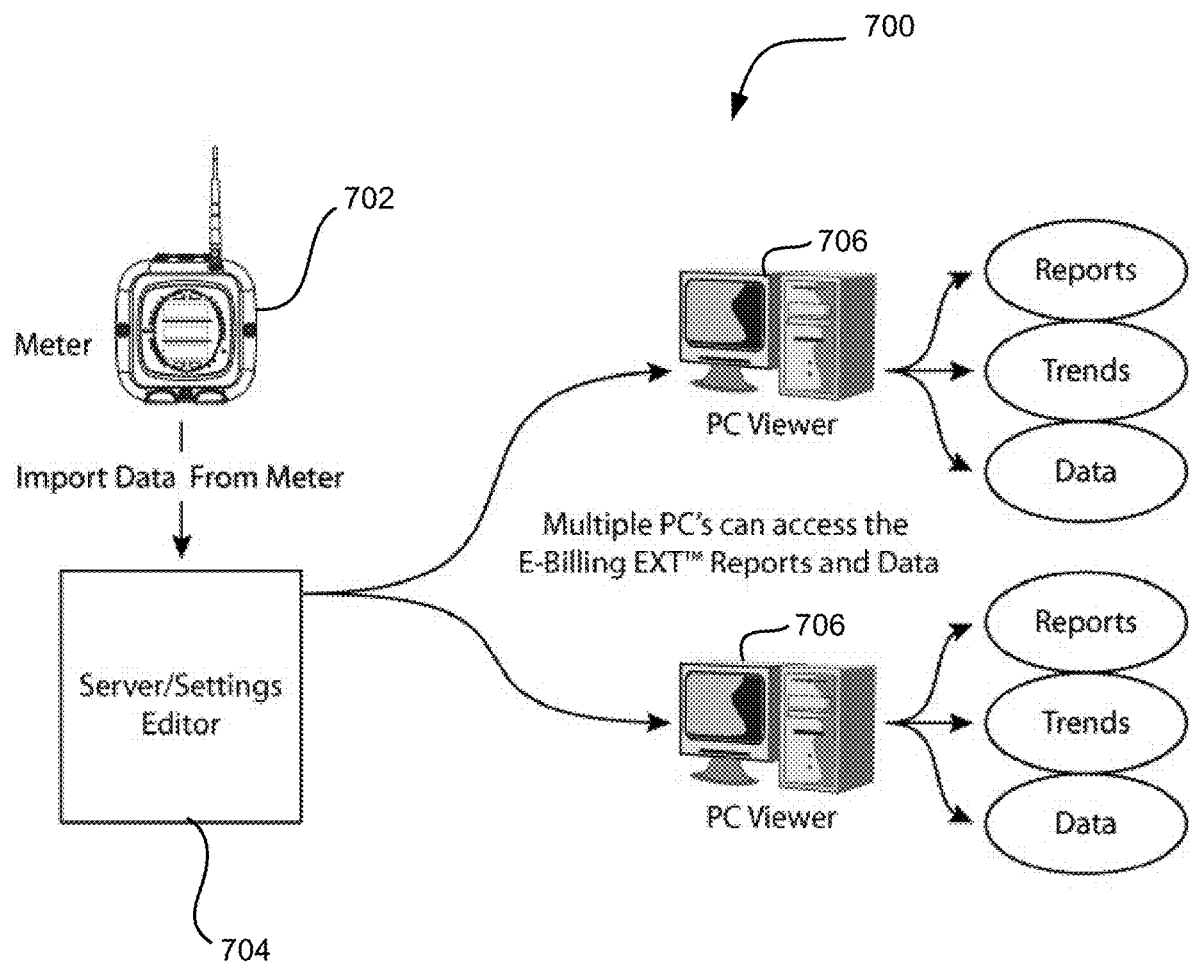
FIG. 10 illustrates an energy management reporting, analysis and billing system in accordance with an embodiment of the present disclosure.

In another embodiment, the IEDs, systems, network topologies and methods thereof may be employed to implement an enterprise-wide energy management reporting, analysis and billing system. As shown in FIG. 10, the system 700 and method of the present disclosure imports historical log energy usage data from meters, IEDs and other sources 702 and generates detailed and useful energy reports for analyzing energy use, planning and load curtailment. In one embodiment, the system 700 operates on a client/server architecture, where a server/settings editor 704 imports data from various sources 702 enabling at least one client 706 to access the data and generate reports therefrom. The system 700 and associated methods enable multiple users to generate customized energy reports to study energy usage and demand enterprise-wide. For example, a user may display Peak Energy Usage for the day, week, and month, or compare usage between meters, locations, and customers. An automated billing module of the system 700 allows a user to generate sub-metering bills based on customized rate structures for energy and other commodities such as water and gas.

It is to be appreciated that the enterprise-wide energy management reporting, analysis and billing system 700 of the present disclosure may be implemented on any of the various network topologies described above, in addition to other developed or to be developed network topologies.

The system 700 and method (also known as E-Billing ExT system or meter billing system) integrates three components, to provide data collection, analysis, and reporting on metered locations. To achieve this, the server/setting editor 704 brings in data from data sources, such as meters, analyzes it through the billing software, and stores it in an internal database. The meter billing system and method then also provides the ability to retrieve the analyzed data at a later time, and generate reports off that data. From this information, users can then view the larger picture of the location that meters are recording.

Data is collected and stored in a single place, such as a database. Since the data may include private information and billable data such as energy usage, the software provides accountability for any deviation from the original values. Additionally, the configuration that affects these values will only be able to be modified by users which are given the proper permission for those changes.

Figure 11:
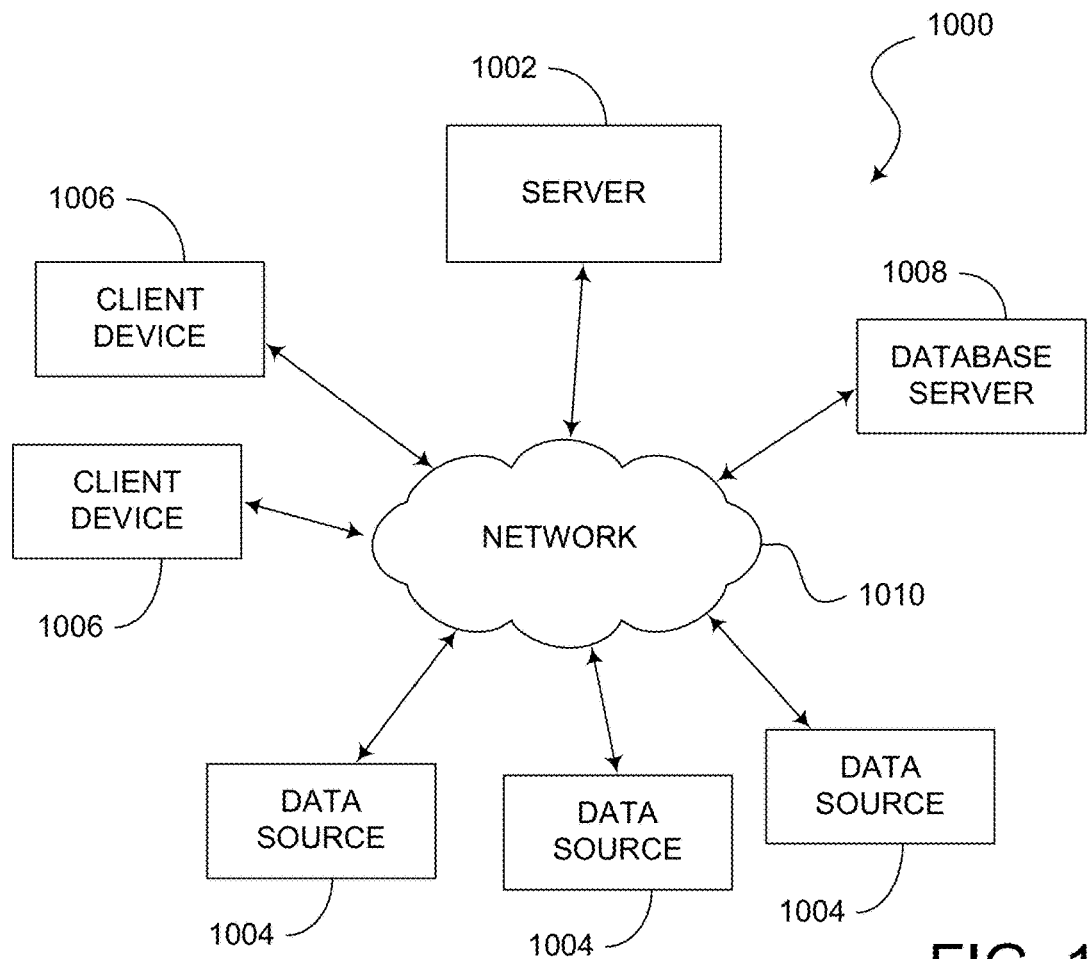
FIG. 11 illustrates a system for communicating and managing meter data and/or non-meter data in accordance with an embodiment of the present disclosure.

Embodiments of a system architecture for handling sensor data and other meter information from meters and non-meter sources are described herein. FIG. 11 illustrates a system 1000 according to various implementations. System 1000 includes a server 1002, one or more data sources 1004, one or more client devices 1006, and a database server 1008. The components of system 1000 are configured to communicate with each other via a communication network 1010. In some embodiments, a database may be configured in association with the server 1002 and the database server 1008 may accordingly be omitted.

In some embodiments, the data sources 1004 may be configured as intelligent electronic devices (IEDs) or other types of meters for measuring one or more commodities, such electricity, gas, steam, water, etc. In yet other embodiments, the data sources 1004 may be configured to provide or relay data (such as commodity data or sensor data) to the server 1002. Also, the data provided by the data sources 1004 may be either meter data or non-meter data. Non-meter data may include changeable properties (such as weather conditions) and/or may include static properties (such as a floor plan of a building). When provided with meter data, sensor data, commodity data, non-meter data, etc., the server 1002 may be configured to calculate new data sets based on at least two different types of data.

According to some implementations, the system 1000 may be configured for managing sensor data. As such, the system 1000 may include a plurality of intelligent electronic devices 1004, where each intelligent electronic device 1004 is configured to obtain sensor data related to power parameters distributed to a load. The server 1002 is configured to receive the sensor data from the plurality of intelligent electronic devices 1004 and is further configured to store the sensor data in a database. The server 1002 may normalize the data into a common format and store the normalized data. The server 1002 may also analyze the data to determine if it contains at least one anomaly or error. If an anomaly or error is discovered, the server 1002 can work the data in order to achieve acceptable results. The client devices 1006 are each configured to retrieve the sensor data and worked data from the database.

The system 1000 may also be configured as a Virtual Meter system in which a data source 1004 adopts a unique identification code that is associated with a customer location. When providing the commodity data to the server 1002, the data source 1004 is configured to provide the unique identification code associated with the customer location to the server 1002 as well. The data source 1004 may include an interface for transmitting the commodity data to the server 1002 and may further include a memory configured to store the unique identification code. The interface of the data source 1004 also configured to transmit the ID code when the commodity data is transmitted.

Figure 12:
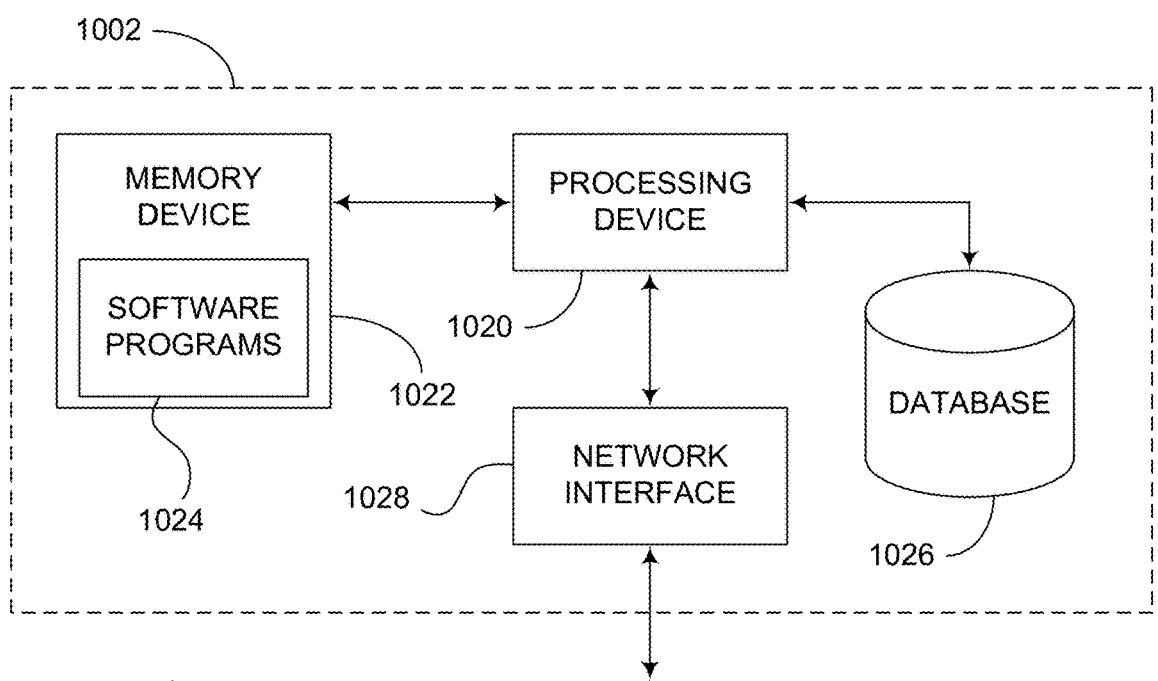
FIG. 12 illustrates an embodiment of the server shown in FIG. 11 in accordance with the present disclosure.

FIG. 12 illustrates an embodiment of the server 1002 shown in FIG. 11. In this embodiment, the server 1002 includes a processing device 1020, a memory device 1022 including software programs 1024, a database 1026 or other storage device for storing information related to meters, and a network interface 1028. The server 1002 may be configured to manage sensor data from the IEDs 1004. In some embodiments, the server 1002 can normalize the data and analyze it to determine if one or more anomalies exist. If so, the processing device 1020 can work the data to achieve acceptable results and stored the worked data in the memory device 1022.

The network interface 1028 is configured in communication with a network (e.g., network 1010) to enable communication with at least one intelligent electronic device (e.g., IED 1004) and at least one client device (e.g., client device 1006). The network interface 1028 is further configured to receive sensor data from the at least one intelligent electronic device 1004, the sensor data being related to power parameters distributed to a load. The processing device 1020 may be configured to store the sensor data or in the database 1026. In addition, the network interface 1028 is configured to transmit the sensor data from the database 1026 to the at least one client device 1006.

Figure 13:
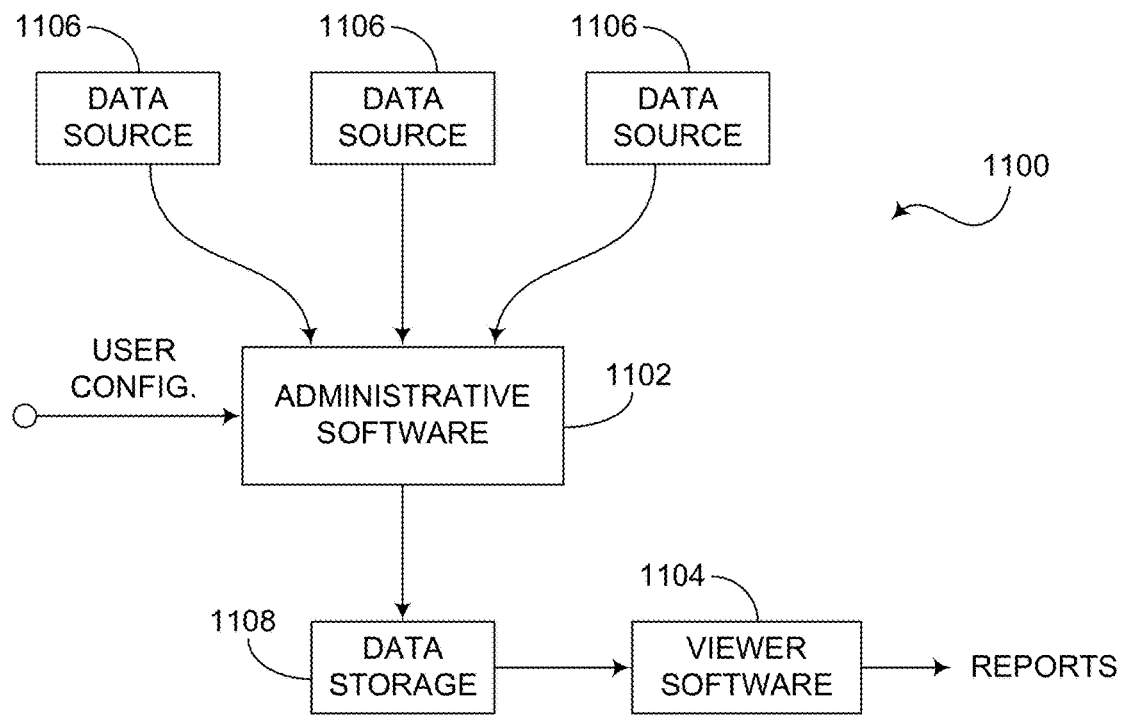
FIG. 13 illustrates component connections of the energy management reporting, analysis and billing system shown in FIG. 10 in accordance with an embodiment of the present disclosure.

FIG. 13 illustrates a meter billing system 1100 according to various embodiments of the present disclosure. As shown in FIG. 13, the meter billing system 1100 includes Administrative Software 1102, Viewer Software 1104, Data Sources 1106, and Data Storage 1108. The Administrative Software 1102 includes software, or executable instructions, that provides the system configuration, analysis, and correction functionality. In some embodiments, the Administrative Software 1102 is executed in server 704 shown in FIG. 10 or server 1002 shown in FIG. 11. Separating the administrative functionality from the viewer functionality helps segregate those users who are allowed to edit the system from users who are not. Normally, a user is not authorized to modify system configurations using the Viewer Software 1104.

The Data Sources 1106 include the various sources of the metered data. The Data Sources 1106 may include logs from one or more meters, software log(s), data file(s), queried service(s), or other sources. This data may be transformed into data which is useful for the other components of the meter billing system 1100. The Data Storage 1108 includes the internal storage for the transformed data. The Data Storage 1108 stores both the original data for accountability reasons, and "converted" data (as explained below), which can be used for reports or for other purposes. The Viewer Software 1104 includes software that provides data interrogation and reporting functionality. In one embodiment, the Viewer Software is executed on client 706.

The following description of the meter billing system 1100 and associated methods includes embodiments of Database Storage, Analysis and Correction, Virtual Groups, Virtual Meters, Non-Meter Data Sources, Commodities, Perpetual Calendars, Reporting, and Automation.

Database Storage systems and methods are described hererin.

Data has traditionally been stored in one of two ways: using flat file databases or using relational databases.

Flat file databases are custom files or data structures, with custom interfaces. They are often hard coded to only contain a specific set of data, following a specific set of rules, and as such react poorly to changes in the input or configuration. Conversely, because of their specialized design, they are often optimized for their specific use.

Relational databases are typically general use databases, with common interfaces, that allow for a very flexible set of data and conditions. However, this is often at the expense of space and speed. They can be optimized, but this typically entails hard coding the relations between values, resulting in a database that is only marginally more flexible then a flat file database.

Storing trend data is normally not addressed by many traditional databases. Trend data may be inserted infrequently, often in large batches, and usually inserted in bursts. Trend data may be time-stamped, and often is inserted linearly. This means that the data is often added by appending to the end, and the data is often sorted in time naturally. Storing trend data normally requires very few updates and seldom cross references with other data. Users can perform large queries, but usually only for a small portion of the larger set of data. Typically this is done infrequently. The database for storing trend data may run on a simple desktop computer, which typically does not have the power to run a larger database server. Because of this, a custom database may be used for storing trend data.

However, using a custom database may lead to other problems. For example, it may be difficult to anticipate which of the six or eight voltage or current channels a user may wish to store. Also, without significant work, it may be difficult to query data out of a custom database. These problems can be compounded when data is stored for many meters, as the number of channels can quickly grow to the hundreds of thousands, which can be difficult for a standard desktop computer to process.

One implementation to overcome this problem is to employ the power of a general purpose database, but to store each channel in its own table. Storing each channel in its own table provides several advantages. For example, segregating the channels from each other allows a viewer to query just the data he or she is looking for, without requiring that the channels be hard coded, or uniform. Another advantage is that the table size will be relatively small, which minimizes the processing required to filter the records that are being requested. Also, since each table is unique to a channel, extra information about which channel or meter a record applies to need not be stored, which can save significant space when millions of records are stored. By using a general purpose database, integration does not require a custom database interface. Only the logic of querying the tables needs to be implemented, which accelerates development.

Figure 14:
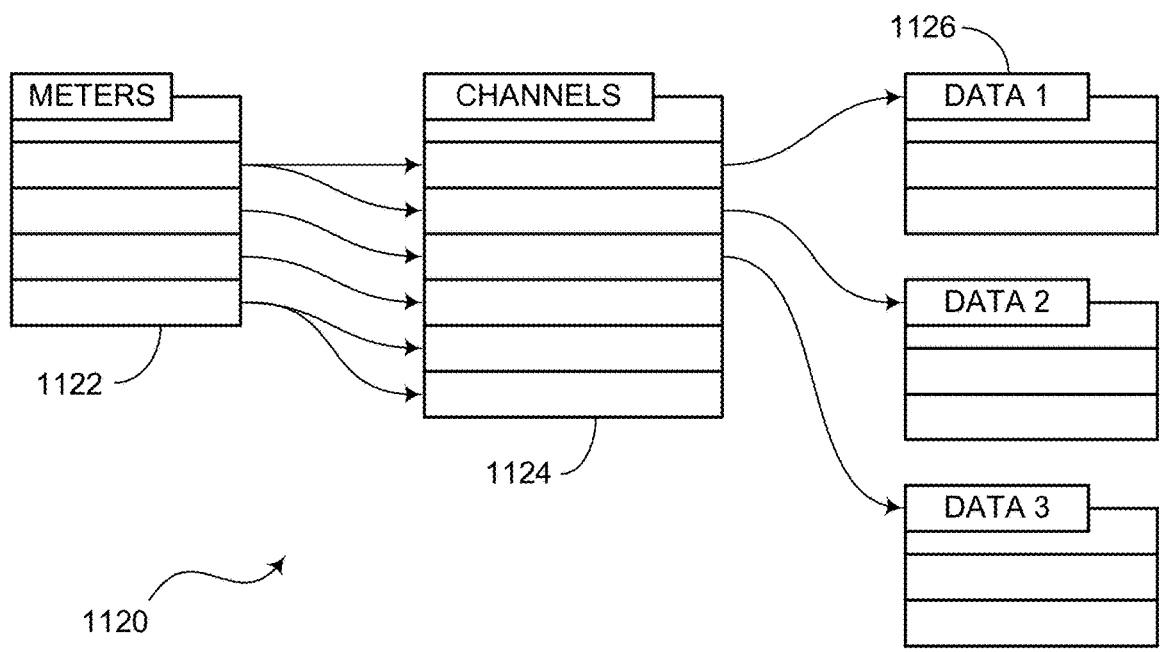
FIG. 14 illustrates a structure of a channel reference table in accordance with an embodiment of the present disclosure.

FIG. 14 illustrates a system 1120 for storing meter data in multiple tables. In the example shown in FIG. 14, the system 1120 utilizes multiple meters 1122 to sense parameters (e.g., electrical parameters of electrical energy usage). The data from each meter 1122 is separated out into a number of channels. For example, the channels may include at least three voltage channels and at least three current channels. Each separate channel includes a dedicated data table 1126 for that channel. To index each of these individual channel tables, a channel reference table 1124, defining the distribution characteristics of the system 1120, may be used to indicate which table 1126 contains which channel. The channel reference table 1124 may also contain analysis information for the channels, such as a time range of when the data contained in the table 1126 was stored, which may help to optimize access to the data without hard coding what the channels contain.

A potential problem with the use of a large number of tables is that some databases may begin to slow down significantly. A related problem may occur due to the sheer volume of data that is being stored. Many traditional databases cannot easily handle hundreds of millions of data points.

Figure 15:
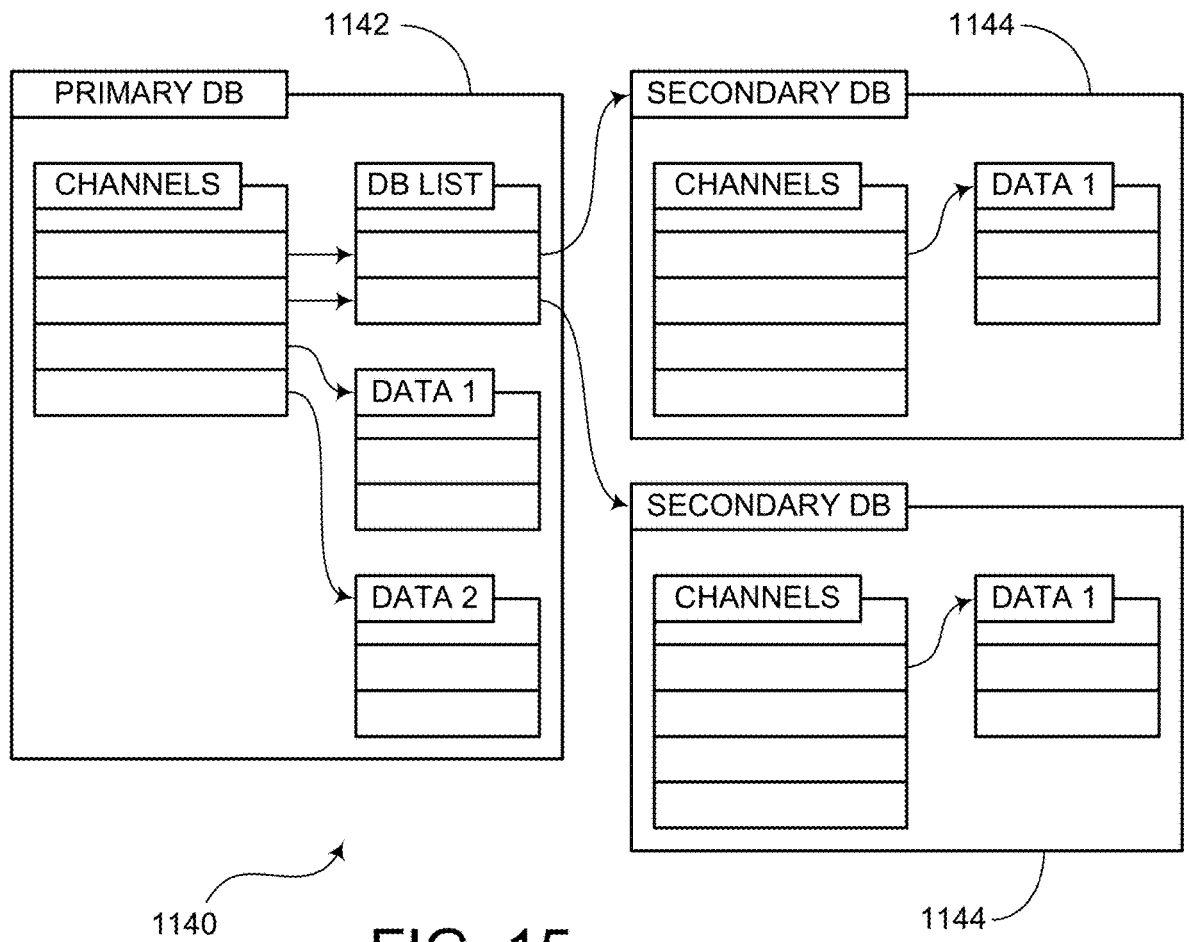
FIG. 15 illustrates a structure of multiple linked databases in accordance with an embodiment of the present disclosure.

One implementation to overcome this problem is to distribute the channel data tables across multiple databases, or even database servers. As shown in FIG. 15, a system 1140 enables the channel data tables to be distributed across multiple databases. In addition to the channel reference table that defines the channel data, a second reference table, associated with system 1140, may also be used. This second table may also reference the database that contains the data. If a first database 1142 is not the one being queried, the second reference table of system 1140 can be used to reference a second database 1144, which can be connected to the first database 1142. Data can then be read from the second database 1144 or from any other additional databases that are connected to the first database.

The implementation of FIG. 15 may further include a database server (e.g., server 426) being aware of this link to other databases, and automatically performing the query to the other databases for the user. The implementation of FIG. 15 may also be configured such that the database server automatically distributes the tables across multiple databases, thus negating the need for the software to maintain these links. While this may slow down the initial query of locating the data, since all the data for a single channel is kept in a single table, and thus not split across multiple databases, the time-consuming data query is only performed against one table. Thus, it remains a fast query.

Figure 16:
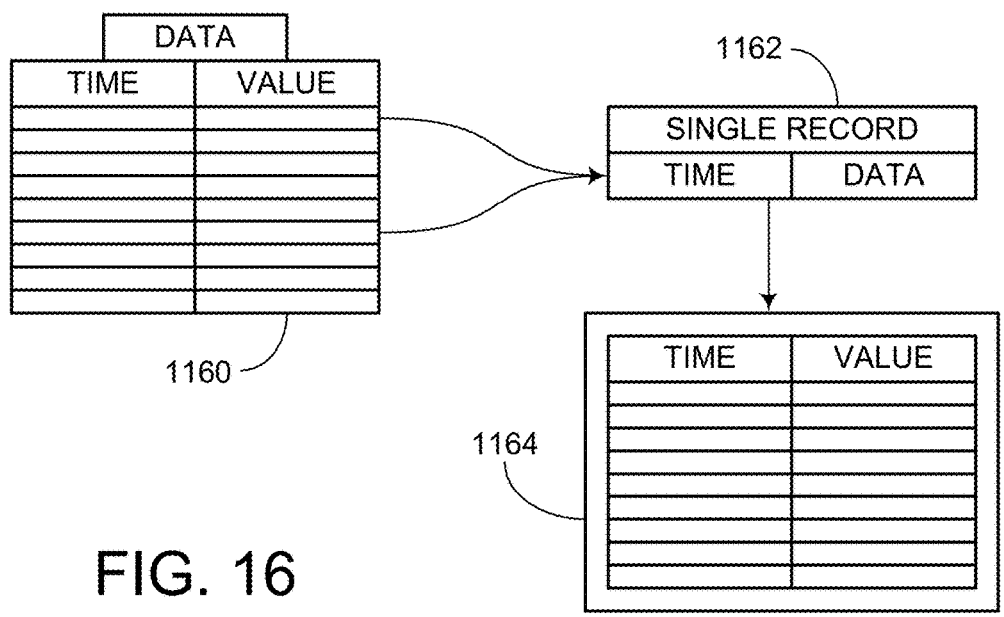
FIG. 16 illustrates a method of condensing records in accordance with an embodiment of the present disclosure.

FIG. 16 illustrates an implementation for condensing groups of the data points into single records. This implementation can also overcome the problem of storing large numbers of data points. For example, condensing groups of data points into a single record may include storing all of the records for a day in a single record or single point of data. This may be accomplished by the processor 230 shown in FIG. 4 or other processing device of a server or client device. Then, when a client requests the data for that day, only the single record need be searched and returned. The client may then filter out the individual data points they want from the single record.

The implementation of FIG. 16 can be configured to store the records normally for a period of time (e.g., the most recent month) and store data, such as time and value information, in a table 1160. In this way, this recent data can be easily accessed as needed. After a certain period of time (e.g., a month) or when the table 1160 is filled or close to being full, the records may be combined into a single record 1162. In the case of time and value information being stored, the single record 1162 may include a single time period (e.g., a month) and a single data value. The data points in table 1164 can be observed by the client from the single record 1162.

The records in table 1160 can be entered along with the time that they were entered. The records can then be scanned with respect to their time entry and combined to form the single record 1162. Any uncombined records which are outside of the current data period can be stored in table 1160 until they may be combined with other records sharing the same time period.

In some embodiments, this process can be implemented by a second maintenance software module on the server. This software module can periodically check the records and combine any uncombined records which are outside of the current data period. This alleviates the need for the client software to do the work of combining the records.

The process could also be implemented as a custom extension to the database server, which handles the combination of the records automatically. For example, this could be implemented as a custom data type that stores a time sorted array of values. As another example, this could be implemented as a custom action, such as a stored procedure, which performs the check and combines whenever records are inserted to the database.

The process of creating a single record from multiple records could be further implemented by automatically separating the data 1164 when the client requests the data. Because the data is stored in a known sorted order, only the record blocks at the beginning and end of the query range would need to actually be processed for comparisons when doing a time range search. All the values could then be expanded to individual records from the combined record block, to be returned to the client in the return set. This alleviates the need for the client software to do the work of separating the records.

According to other implementations, the process may also include compressing the record blocks being stored in the individual records. This further reduces the amount of space that the database needs to store the data, without slowing the ability to query the records. The compression could be implemented by compressing the data at the time of combining the records into the single record 1162. The decompression 1164 could be implemented by the client at the time of request. The decompression 1164 could also be implemented by the data type of the database, expanding to fill the record set being returned to the client on request.

Another problem when dealing with general database servers is that, while most implement a common interface called SQL, they typically have a special way to use commands. This results in commands that are often not being portable between database servers.

Figure 17:
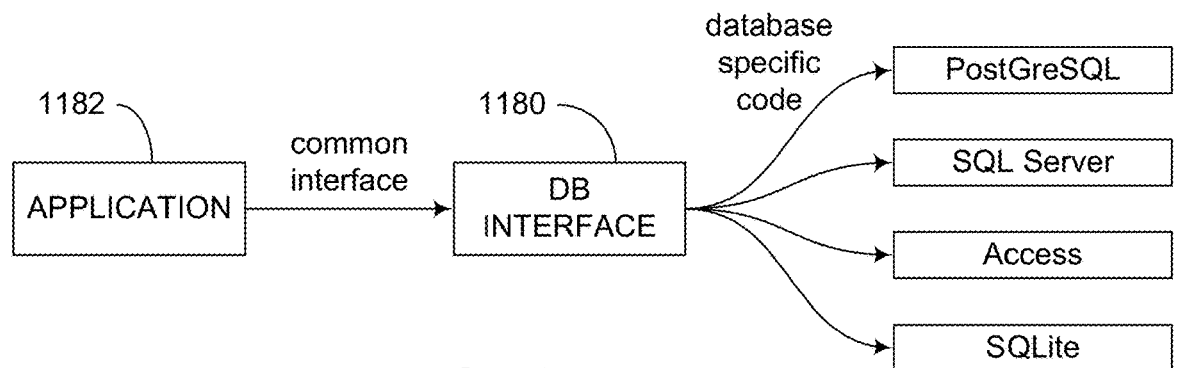
FIG. 17 illustrates a structure of a database interface in accordance with an embodiment of the present disclosure.

One implementation to overcome this command portability problem is to provide a database interface 1180 which provides actions common between these databases, and internally implement the individual database specifics, as shown in FIG. 17. This allows the application 1182 of the top level code to be rapidly developed, without being tied to any specific database. The database interface 1180 receives code from the application 1182 over a common interface and provide the database specific code to databases PostGreSQL, SQL server, Access, SQLite, or other database protocols.

Using the common database interface 1180 enables the software to use a different database server if necessary, depending on the deployment scenario. For example, if the software is to run on a single computer with limited data, a small but lightweight database may be used. As another example, if the software is distributed across a network, one or more networked database servers may be used. As yet another example, if the software is to be used in a system that already has a database server, it can then link into that database. This simplifies direct integration of the software with a client's system.

Many database servers, which are applications which manage the interface to the physical storage of the database, and interact with other applications with protocols such as SQL, are large applications that require significant resources, such as SQLServer. In return, they provide extra functionality that cannot be found in smaller, library-based database engines, such as MS Access. However, on smaller computers, much of the time these servers are not being used, and are just wasting resources.

Figure 18:
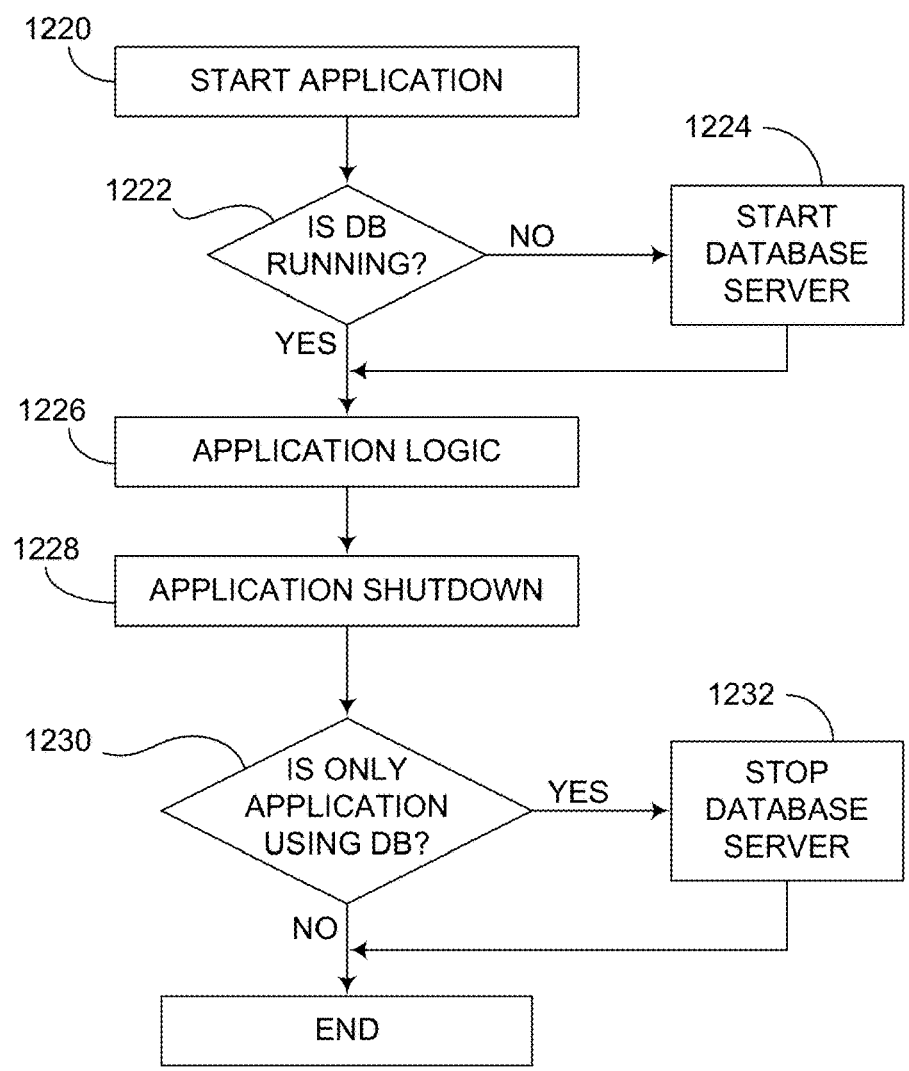
FIG. 18 illustrates a method of starting up a database in accordance with an embodiment of the present disclosure.

FIG. 18 illustrates a method for providing an implementation to overcome the problem of wasted resource. This allows the database server to run only when it is needed by the application that uses it. When the application is started (block 1220), the application checks to see if the database server is running (block 1222). If not, the application starts the database server (block 1224). When it is determined that the database server is running, the application logic is run (block 1226). At the end of its operations, the application shuts down (block 1228). It is then determined whether or not the application is the only application using the database (block 1230). This may be accomplished, according to some embodiments, by keeping a list of applications that use the database server. If it is determined that no other applications are using the database server, the database server is shut down (block 1232) and the method ends.

In the case of network database servers, decision block 1230 may be implemented in another manner. For example, a small lightweight application may be utilized that emulates the database server and listens for database requests from remote applications. This lightweight application may then perform the functions of starting and stopping the database server based on the requests.

As mentioned above, client software may be distributed throughout the network. However, distributing client software across the network may create some problems that can be overcome by utilizing the embodiments of the present disclosure. For example, one problem is that the client may not have all the resources necessary to generate a requested report. The report in this case is defined as the presentation of a collection of information with the intent to summarize that information, clarify a detail of that information, analyze the information and provide new information, or allow the user to see a large picture. Another problem is that, for security reasons, the client may not be allowed to access the data necessary to generate the report. Also, the amount of data required to generate the report may be larger than the final report. A cache synchronization problem is another issue that may be caused by multiple clients retrieving data from the database at any particular time. To overcome this problem, the systems described herein ensure that versions of the data being retrieved are consistent.

One implementation to overcome these issues is to store the generated reports on the server, such that the client only needs to request the reports. For example, a table could contain each of the reports as a part of the final presentation media, one report per record, which the client can request when they want to view the report. The final presentation media is the format which is presented to the user software.

For example, the media may be a PDF of the report. As another example, the media may be a picture, such as a bitmap, jpeg, or png, of the report that may be presented directly to the user. This could be implemented by software which generates the reports when the data becomes available, or on a schedule. This software may be on the same computer as the server, or on a remote server.

As another example, a table could contain information specific to the presentation of the report, so that the client need only request that information to generate the report. This reduces the amount of data that needs to be transferred, especially in the case of a highly graphical report.

One implementation to the cache synchronization problem is to assure that changes to related data in the database are done automatically; i.e., at the same time, such that a client cannot receive mismatched data during a request. Databases typically provide a mechanism to do this, called transactions, which ensure that all the data gets updated at the same time, or not at all. However, so as to not cause problems for the database, transactions should be performed all at once. One implementation to overcome this is to wait for all the changes that the user intends to make before actually performing the transaction. Only when the user is done making modifications is the data saved.

In addition, since the information presented may not match the actual information stored on the server, as it is being modified, the UI (user interface) can notify the user of this difference. Four states could be used to indicate the relation of the information presented on the UI to the actual information stored in the database:
  As Server: The information presented on the UI is the information from the database.
  Modified: The information presented on the UI has been modified by the user, and no longer matches the database.
  Saving: The information presented on the UI has been collected, and is in the process of being stored to the database.
  Saved: The information presented on the UI has been confirmed to have been stored to the database. All other clients will now see this change.

These states could be presented as text on the UI, updated to match the current state. For example, a label could be used to show "Unchanged" when the data is first retrieved, "Modified" when the user starts changing the information on the UI, "Saving" when the user chooses to save the information but before it is verified to have been saved, and "Stored" when the information has been confirmed to have been stored. These states could also be presented as colors that change on the UI, updated to match the current state. These states could also be presented as icons on the UI, updated to match the current state.

With respect to FIGS. 11-18, a system for managing sensor data may be configured to include a plurality of intelligent electronic devices, a server, a plurality of client devices, and a network that enables communication among the devices. The IEDs obtain sensor data, such as data related to power parameters distributed to an electrical load. The server receives the sensor data from the IEDs and stores the sensor data in a database. Then, the client devices may retrieve the sensor data from the database.

In some embodiments, as shown in FIG. 14, the sensor data may comprise at least three voltage phase channels and at least three current phase channels. The database may comprise a plurality of tables and the server may store each channel of the sensor data in a different table 1126. The database may also include a channel reference table 1124 that specifies the channel contained in each table 1126. In some embodiments, the server may store the sensor data in a plurality of databases, as shown in FIG. 15, and each channel may be stored in different tables in the multiple databases. A channel reference table may be contained in each database to specify the tables contained in each database.

The server may be configured to condense groups of data records into single records, as shown in FIG. 16. For example, the system may be configured such that each group of data records is sensed during a specific time period, such as over the length of a day or month. The server may also comprise a first software program that stores sensor data in the database and a second software program that condenses the groups of data records into single records.

The system may further comprise a database server configured to condense groups of data records into single records. The server may receive the sensor data in a push operation or pull operation, and may receive the data in a burst operation. In some embodiments, the system may include a database interface 1180 configured to enable storage of sensor data in different types of databases.

Analysis and Correction systems and methods are described herein.

Many sources of data have invalid values, missing data, and other errors which can lead to misleading and incorrect reports. This can be caused by misconfiguration by the user, faulty software, faulty devices performing the recording, communications errors, facilities problems such as power outages, or even regular maintenance. Often however, these kinds of errors cannot be fixed by the user. Instead, the data must be invalidated, preventing a report from being generated during the period of the errors. When the errors can be corrected by modifying the data source, it is often undesirable to do so, especially if the data values are used for billing purposes. The systems of the present disclosure maintain a high level of accountability for the billing data and avoid modification at the data source.

One implementation to overcome this problem is to analyze the data being imported, and attempt to automatically compute what the value should be. If the imported data contains one or more anomalies, the data is worked in such a way to determine acceptable values. Two items are thus stored for each value imported: the original value, and the computed value. The computed value is a modified version of the original value, as described below. The original value, once imported, is inviolate; that is, it cannot be changed by the software. The computed value can be marked as being a value that has been modified from its original value. For example, it may have a special name such as "[channel] interpolated" to indicate that it is an interpolated value for a particular voltage or current channel. As another example, it may have a flag in the database that indicates that it is a computed value.

Figure 19:
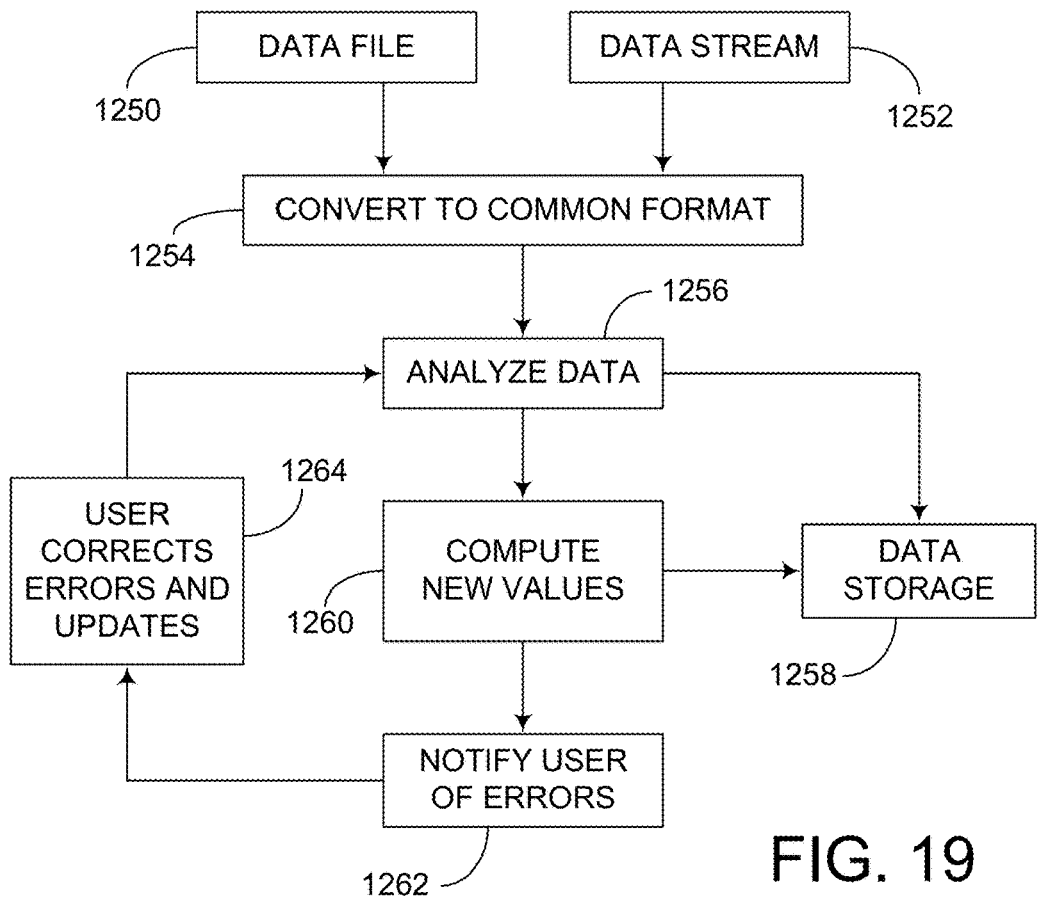
FIG. 19 illustrates a method of importing data in accordance with an embodiment of the present disclosure.

According to one implementation of this conversion and analysis process, a tool is provided which performs multiple stages to transform, work, or manipulate the data source into new values, referred to herein as computed or worked values. For example, FIG. 19 shows a method according to some embodiments for processing the imported data. It is to be appreciated that the method or tool is executed on a server, e.g., server 704 shown in FIG. 10 or server 1002 shown in FIG. 11. Data is received from any suitable data source in the form of a data file 1250 or a data stream 1252. The tool then converts that imported data to a common format, as shown in block 1254. The tool then analyzes the data (block 1256) to detect errors or anomalies in the values. The original import data is stored in the data storage device 1258.

If errors or anomalies are detected, the values are worked (block 1260) to compute new values. For example, the worked values may include an interpolation between two known values, extrapolation beyond known values, or other computational functions. The worked values are also stored in the data storage device 1258. When errors (or anomalies) are detected, the tool notifies the user of the errors (block 1262) and the user is instructed to correct the errors and make updates as needed (block 1264). The user may use a manual correction process to correct the errors.

In the conversion stage 1254, many of the data sources that provide data files 1250 and data streams 1252 may have different formats and different qualities to their data. For the source data to be analyzed, it is first normalized by converting to a common data format 1254. In this context, normalization is the transforming of the source data to a common format, without changing its actual value.

Figure 20:
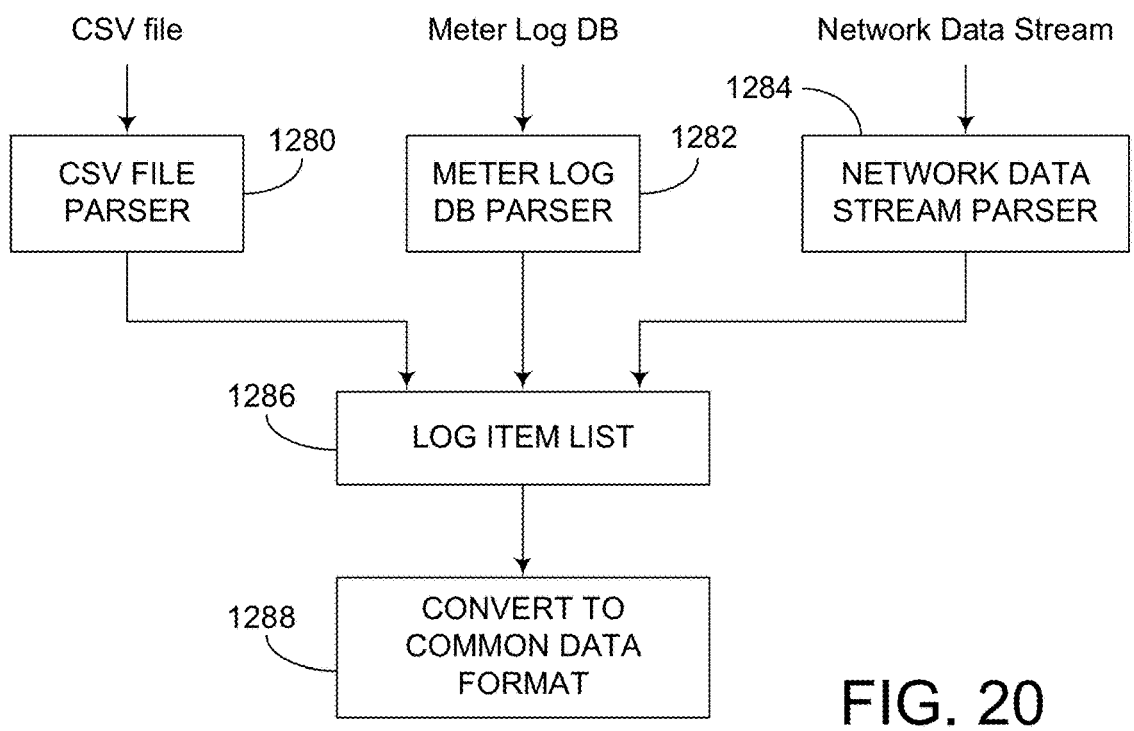
FIG. 20 illustrates a structure of a data source import library in accordance with an embodiment of the present disclosure.

One implementation of the normalization process (block 1254 shown in FIG. 17) is to provide a common code framework, which may be implemented with logic specific to the input file, as shown in FIG. 20. A common code framework may be a software library, such as an application programming interface (API), a software development kit (SDK), or a shared code. In this embodiment, the conversion process may include a CSV file parser 1280, a meter log database parser 1282, a network data stream parser 1284, and other suitable parsers as needed. The CSV file parser 1280 is configured to receive CSV files, the meter log database parser 1282 is configured to receive meter log database files, and the network data stream parser 1284 is configured to receive network data streams. After the elements of the files are divided by the parsers 1280, 1282, and 1284, the parsed data is directed to a log item list 1286, which then leads to a module 1288 for converting the files to a common data format.

For example, an algorithm of a parser may be configured to take as input a proprietary log data file and output a common data structure to the log item list 1286. A proprietary log data file may be a file that contains log data, such as recorded meter data or waveform data, and store this file in a non-common format, such as one only recognized by a single application. This common data structure may contain each of the items in the log file. A first item in the log file may be a timestamp representing the time when the log file is stored. A second item may be the value of the data. These two items are stored as timestamp-value pairs, referred to herein as a log item. Collectively, the log items are saved as the log item list 1286. This log item list 1286 could be stored in memory, passed to another process, stored in a database, or stored in a file. For example, an algorithm of the log item list 1286 may include receiving the outputs of the first stage of parsers.

An algorithm of parser 1280 could be configured to take a comma-separated value (CSV) file (or other file having a common text data file format) and output the same common data structure as the above proprietary conversion algorithm. Each of the conversion algorithms of parsers 1280, 1282, 1284 may be called log import libraries. The log import libraries may include independent code that can be used interchangeably based on the file which is passed to the import process. A log import library can be an abstracted name given to a common code or library for the sake of importing logs.

The decision of which log import library (i.e., parser) to use could be implemented as a comparison of the file extension of the imported file, to a set of known extensions for the log import library. The decision of which log import library to use could also be implemented as an algorithm which analyzes the contents of the import file, and determines the correct log import library to use. The decision of which log import library to use could also be implemented as a choice by the user when they select the file to import. This could also include additional configuration options for how to perform the import, such as but not limited to, time range, and channels to import.

Typically, each log import library provides the ability to import one type of input data. However, these libraries do not necessarily need to be contained in a single binary. The log import libraries could be wrapped in independently compiled binaries, called log import plug-ins. Such a library would be self describing, such as providing a name or the type of input it accepts, which would allow the calling software to determine which library to use for any input. In this case, the libraries could be placed in their own binaries, with, for example, one per import type. This would allow each log import plug-in to assist in making the decision of which log import library to use to convert an import file. This could be implemented by having a function common to each log import plug-in, which decides if a given file can be converted using the log import library it contains, using the decision log described above. Additionally, as separate binaries, each library could be arbitrarily added or removed from the system without modifying the calling software.

The log import libraries could be further extended by implementing one such that it uses a configuration to determine how to parse the import file. This configuration could be given when the import file is specified, when the import file is imported, or at one time and used by all such imports. This would allow the user to easily customize the import to work with any simple data source, without having to implement log import libraries specific to that import file.

This configurable import could be implemented by specifying the base format of the import file, such as comma-separated value (CSV) or a database, and then specifying the fields to read. Each field could be configured to specify what value it is expected to represent. For example, a field could be a timestamp, or a value.

The log import library could be further configured to take as input a binary block of data, allowing the source of the data to be specified by the user of the library. This source of data could come from a network data transfer, inter-process data transfer, a copy-paste action, data manually typed in by the user, data in an email's body or attachment, or a file.

Figure 21:
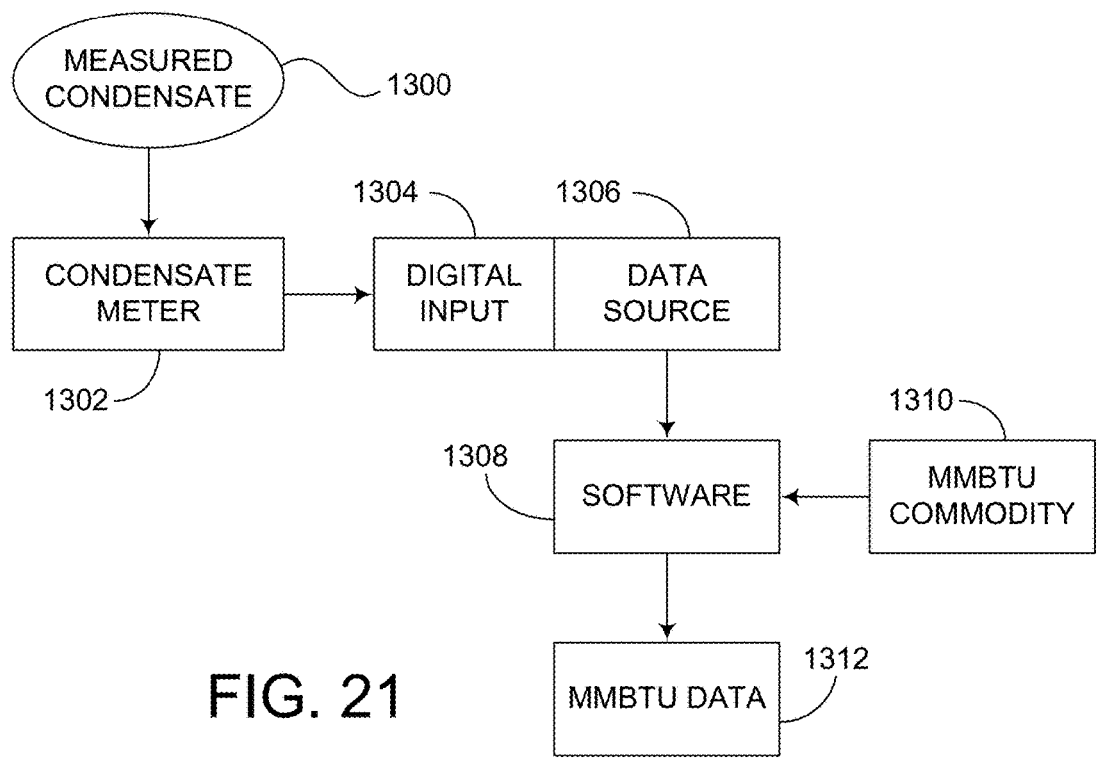
FIG. 21 illustrates a method of scaling data in accordance with an embodiment of the present disclosure.

The conversion of the values in the source data to the output value in the log item list 1286 may further comprise the operation of applying a value, called a scalar, to the input value to transform the units that the value represents, as shown in FIG. 21. For example, an input value may include a measurement of condensate 1300 from an accumulator or condensate meter 1302. The condensate meter 1302 may be configured to measure pulses that represent gallons of steam. The measurement is provided as a digital input 1304 to data source 1306, e.g., a meter, user entered data, software logged values, etc. The software 1308, executed on for example server 704, may be configured to take the measurement of gallons of steam and multiply this value by a scalar 1310 according to the specific commodity to transform gallons of steam to BTUs 1312. As another example, a voltage value could be scaled by its PT ratio to transform it from secondary to primary value. As another example, a scaled energy value could be transformed to a common energy format. This scalar could be used while information is automatically parsed in the input data to determine its value. For example, the PT ratio or the scaled energy settings could be parsed from the settings stored with the data source.

In the second stage shown in FIG. 20, the common log item list 1286 is analyzed for errors. One problem with analysis of generalized input values is that different types of values have different rules for what is valid. One implementation to overcome this is to mark each channel in the input log item list 1286 with its type, and then use that type to determine the set of rules to use while analyzing it. These types could include accumulators, which are values which are guaranteed to be always increasing, except when the value rolls over. Thus, the values could be checked to verify that they do not decrease over time. These types could also include interval accumulators, which are values that accumulate only over a specified period of time, called an interval, and begin accumulating from zero at the beginning of the next interval. These types could also include readings, which are values which describe a single point in time.

One implementation of marking the type of the value is to determine the type from the input data source in the first stage. Another implementation is to specify the type of the value when configuring the import of the file.

One exemplary set of rules for analyzing types, such as accumulators, may order that the data should not be zero, except when the previous value is zero, or there is no previous value, the data should not be negative, the data should not experience sudden changes in the accumulators, and the time interval between each successive value should be an expected interval.

In some embodiments, this analysis for accumulators could also include checking if two successive values indicate that the value has rolled over. Since a storage medium has a finite size for storing values, the values can roll over when they reach a predetermined limit, which means they start at zero again. If the value has rolled over, then the value that it would be had it not rolled over can be used when applying analysis rules.

Determining if a value has rolled over could be implemented by checking if two successive values drop in value. This could further include storing a configured rollover value, which could then be used to determine the exact accumulated value between the two source values by subtracting the difference. This could further include determining the rollover value automatically from the settings of the data source.

One exemplary implementation of analyzing the log items list would be to iterate over each item in the input log item list, and check if it matches any of the analysis rules for its type. For each item that an error is found, the error that it contains could be stored. Marking an item with an error could be configured by storing a list of all the errors that this item has.

For accumulators, detection of errors or anomalies in the data may include computing the slope between each value. The slope can be used to determine if change from one point in time to another is unusual in order to assist in looking for errors.

In a third stage, the log item list is used to compute corrected values for any input value that is determined to be an error. One exemplary implementation of computing corrected values could be to ignore each of the input values with an error, and for each missing value, determined by the expected interval, interpolate or extrapolate the value for that missing interval. One exemplary implementation of computing an interpolated or extrapolated value could be to compute the slope between two good successive values, multiply this slope by the time interval between the first of these good values and the time to interpolate/extrapolate, and add it to the first good value. This creates a linear interpolation or linear extrapolation of values. This interpolation or extrapolation process could be further improved by weighting the linear interpolation/extrapolation by the slope before the first of the successive good values and the slope after the second successive good value.

The interpolation/extrapolation procedure could also include specifying a maximum time over which the interpolation/extrapolation will operate. If the time span between the two good successive values used for interpolation/extrapolation is greater then the maximum time span, then no value is interpolated/extrapolated. The surrounding interpolated/extrapolated values could then be marked with an error to indicate the large gap in time.

In addition to interpolation or extrapolation, computing corrected values could be further improved for accumulators by also computing the interval accumulator values for these interpolated values. This could be implemented by taking the interpolation/extrapolation output, which is guaranteed to be in the correct interval, and computing new log items by subtracting successive values, thus computing the interval values. The output of this new computation value could then be stored in memory, passed to another process, stored in a database, or stored in a file.

There may be some types of errors that normally would not be corrected by automatically computing a new value. For example, if there is a gap in time between two successive good values that is too large, computing values for that interval has a good chance of being incorrect. As another example, an accumulator type value might decrease suddenly, even when it is not near a rollover point. However, for accountability reasons, the original source values are not changed, even though new values maybe computed or worked.

One implementation to overcome the issue of a large gap is to store a modified value along with the source value. This would be a value that the user enters, and that would be used during analysis and reporting instead of the original source value. However, the original value would still be there for accountability purposes. Along with the modified value, a time when the value was modified can be stored, as well as the user that performed the change. This could be further improved by keeping a history of such changes, rather then just the last change. In some embodiments, the modified value could be flagged by the user as a new value, which would prevent the value from being used during analysis and reporting. At any time, however, the user could remove this flag to allow the value to be used again.

One exemplary implementation includes storing the modified value along with the original value imported from the data source. After the value was modified, the analysis procedure could then be run again on the original data, using the modified values, and generating new computed values. This could be further extended by automatically performing the analysis procedure whenever the user modifies a value. This ensures that all the data agrees. The modification process may include waiting until the user has made all the modifications to the data they desire before performing the analysis procedure and only performing the analysis procedure on the range of data that was actually modified.

Another implementation to handle error values is to allow the user to mark errors as 'OK'. When an error is marked as 'OK', the value will be used as is, even if the rules say that it is an error. If there are many errors that cannot be automatically corrected, or a few hidden in a large set of data, it may be difficult for the user to manually find each of these values. To overcome these issues, the user may be presented with a user interface that lists all the errors that have not been corrected. In some embodiments, the users may be able to filter what errors they want to see, what data sources they want to see, what channels they want to see, and what time range of values they want to see. This could be further improved by presenting to the user a list of the values before and after the error value, so that they can be provided with a context to make a decision about what to do with the value.

Furthermore, some implementations may include a suggestion of what the user might want to do with the error, based on what error it is, and the values around it. For example, for a large gap in time between records, the user may want to clear the error. As another example, for a zero value, the user may want to specify what value it should be. In this case, the software could suggest what the value should be. The software could further include automatically stepping to the next error value when the user has made a decision on an error.

According to the implementations mentioned above with respect to FIGS. 19-21, systems for analyzing and correcting values may be configured to include a network, a server, and a plurality of data sources. The network may enable devices to communicate with other devices. The plurality of data sources may be configured to provide data to the server, e.g., server 704 of FIG. 10, via the network, wherein the data may be related to electrical parameters sensed by one or more IEDs. The server may be configured to receive the data, normalize the data in a common format, and then store the normalized data. The server may be further configured to analyze the normalized data to determine if it contains at least one anomaly, error, inconsistency, etc. When the data does contain an anomaly, the server works the data to achieve acceptable results and then stores the worked data as a new value or new values.

In some embodiments, the server may receive the data in a CSV format. The data may be normalized to a format that includes a timestamp and a value. The server may run a conversion algorithm selected from log import libraries to normalize the data. The server may also determine which log import library to select based on a file extension or based on the content of the data file.

The server may be further configured to notify a user associated with the data source when the data contain an anomaly and instruct the user to manually correct the anomaly. The server may also record an identification of a user who corrects the anomaly and record when it was corrected. The server may analyze the data by applying a set of rules based on a particular voltage or current channel of the electrical parameters.

In addition, the systems of FIGS. 19-21 may be configured such that the server analyzes the data by comparing data to previous values to verify a number of conditions. The conditions may include ensuring that a value of the data does not decrease from a previous value, ensuring that the value is not negative or zero, ensuring that the value has not changed suddenly from a previous value, ensuring that a time interval between a value and a previous value is predictable, ensuring that a slop of values with respect to time is substantially consistent, and detecting if the values have rolled over.

The server may work the normalized data by an interpolation or extrapolation process. The server may also work the data by replacing values containing an anomaly with new values. The new values may be computed based on an acceptable slope of valid data.

Systems and methods for the Grouping of meters, locations, and customers are described herein.

Figure 22:
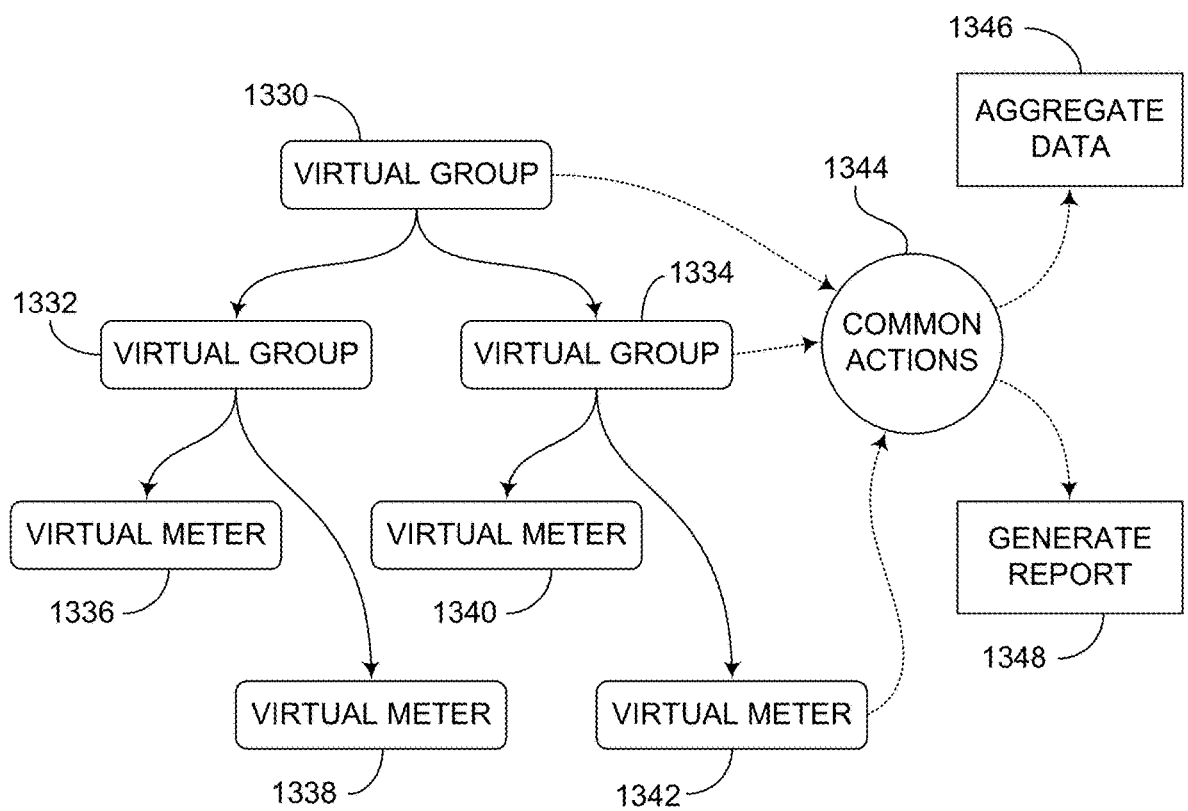
FIG. 22 illustrates a structure of virtual groups of meters or IEDs in accordance with an embodiment of the present disclosure.

In one implementation, the meters may be organized into groups of meters, called Virtual Groups. Every action that could be performed on a single meter may be able to be performed on the group of meters. As shown in FIG. 22, a group of meters can be viewed by the software the same way as a single meter. As shown, one virtual group 1330 may contain one or more other virtual groups 1332 and 1334, or a virtual group may contain one or more virtual meters. In this example, virtual group 1332 contains meters 1336 and 1338, and virtual group 1334 contains meters 1340 and 1342. As such, common actions 1344 may be exercised on the groups as needed. For example, all the values for a channel from each of the meters in a group could be aggregated together (block 1346), providing a single totalized version of the channel. As another example, a report could be generated (block 1348) for all the meters in the group, presenting all the values together. As another example, a bill report could be generated for a location, totalizing the individual charges for each meter's usage.

Additionally, those groups of meters could be grouped together into a larger group. This larger group would allow all the same actions as the included groups. These larger groups could also be grouped again, resulting in a tree of groups, where the leaves of the tree are the original meters. Additionally, a Virtual Group could be just a single meter, allowing everything from a single meter to many meters, to be dealt with the same.

One exemplary implementation of this structure of FIG. 22 would be to group meters into locations, mirroring the locations where the meters are installed. These locations could then be grouped into customers, mirroring the owners, residents, renters, or other person or group associated with these locations. Another exemplary implementation of this would be to group meters into buildings, buildings into facilities, and facilities into management groups, mirroring the hierarchy of responsibility for these locations. Another exemplary implementation of this would be to allow the user to customize the layout of the groups in the tree, so as to allow them to organize the meters as best fits their system.

The aggregation of groups could be further extended by storing information specific to each group, which could be used for other actions. For example, a location group could store an address of that location. The location group may also store a name, such as a customer name, for that location. As another example, a customer group could store the contact email of that customer. As another example, a group could contain the rules to use to compute the billing report for that group of meters.

This hierarchical organization of groups could then be presented to the user in a user interface or graphical user interface. The hierarchy could be presented as a tree, showing to the user the organization of the groups, allowing the user to rapidly navigate to the meter they want to interact with, and to collapse the view of the groups they do not want to view. Additionally, the settings for a meter or a group could be modified by displaying the edit information on the same screen as the display of the tree.

Additionally, the user could perform the actions of the group, such as importing data, analyzing data, and viewing reports, directly by selecting the group to perform the action on, and selecting the action.

Systems and methods regarding the use of Virtual Meters vs. Physical Meters is described herein.

According to some systems, an intermediate device, such as a meter reading device, is used to obtain sensor data from a meter. Once the data is obtained, the intermediate device forwards the sensor data to a server for further processing. In this case, the meter does not communicate directly with the server. With these systems, the intermediate device is considered to be the data source and the meter simply measures the commodity. Thus, the meter and its identity are arbitrary, and the data source is not concerned with the type or identity of the meter, as long as the data source is able to retrieve data from the meter.

However, some of the systems described in the present disclosure, particularly with respect to FIGS. 3-9, allow an intelligent electronic device to communicate directly with a server, without the need for the intermediate device. In this case, the server may obtain information about the meter in order to determine a customer associated with that meter. Some software is capable of tracking intelligent electronic devices by a certain feature, characteristic, or identification of the IEDs themselves. For example, the software can track the serial number of the meter, which is uniquely tied to the specific meter. The server may store or have access to a table that matches the serial numbers of meters with the customer locations associated with the meters.

However, one problem often encountered when organizing data sources and meters in reporting software applications is that the physical device (e.g., meter) that this data comes from will often change. For example, this could be because the device is being serviced, is broken, or being upgraded. In many software applications, this is difficult to resolve, as the entity manipulated in the software is tied to the physical, for example, by the serial number. This makes it difficult, and often time consuming, to switch the source of the data.

Figure 23:
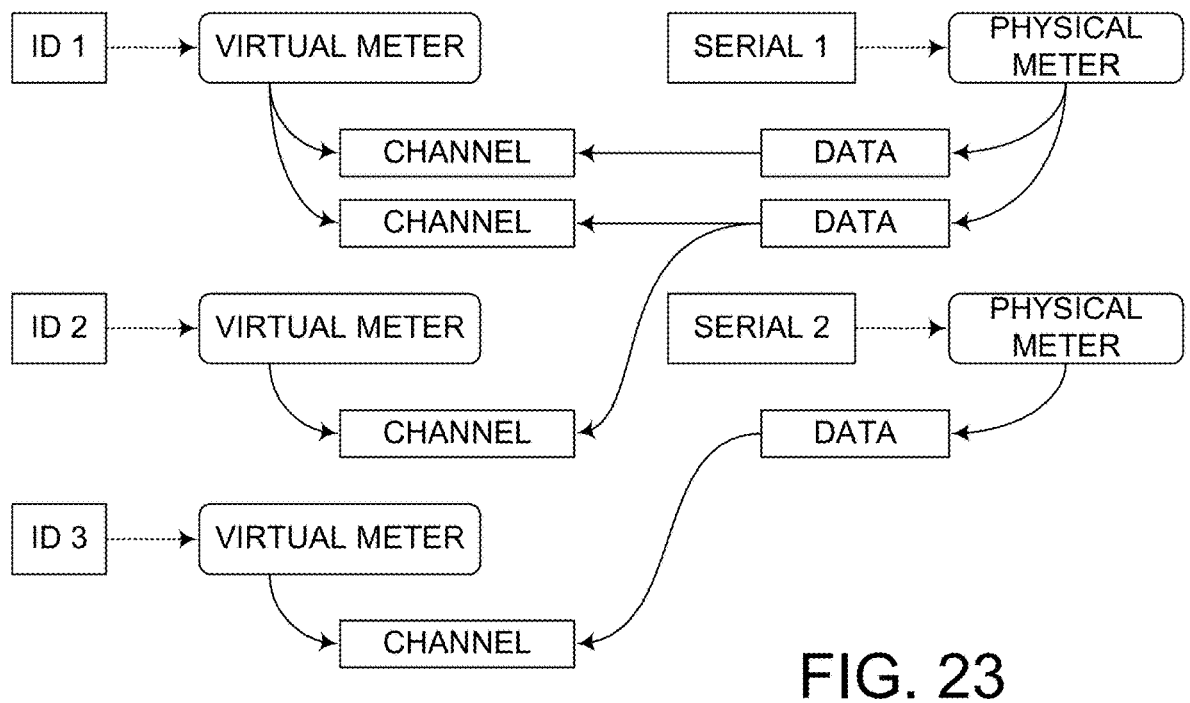
FIG. 23 illustrates a structure of a virtual of meters or IEDs in accordance with an embodiment of the present disclosure.

One implementation to overcome this is to deal with the data source or meter as a Virtual Meter, as shown in FIG. 23. The Virtual Meter is not necessarily associated with any single physical device; instead, the virtual meter would use a unique ID in the software for tracking purposes. Thus, data obtained at or supplied by the virtual meter would be associated with the unique ID. In some embodiments, the physical device information may also be used, although it would normally not be needed for matching the data with the specific customer or customer location. The physical device information may include the serial number or other identification and may be tracked by a user if desired. However, this physical device information would not be used by the software to uniquely identify the device.

Therefore, the Virtual Meters may be recognized as being independent of the actual physical device that measures data values. Furthermore, the Virtual Meters may be recognized as being independent of a data source. The virtual meter would only contain a reference to the data source, and information on how to process the data source. This could allow multiple virtual meters to use the same data source simultaneously.

A similar problem often encountered is when a single physical meter is used to monitor multiple locations, or multiple different channels. For example, a single meter could be used for monitoring the energy usage of multiple rooms in a building (e.g., different apartments of an apartment building), where each room is connected to a separate channel on the meter. In this case, the user may wish to organize each room as a separate meter, for billing purposes. As another example, a single meter could be monitoring multiple commodities, such as electrical energy usage, steam usage, and gas usage. In this case, the user may wish to organize each usage into its own meter, for reporting purposes.

One implementation to handle this meter architecture is to further extend Virtual Meters by allowing a Virtual Meter to specify which channel of the data source to use. For example, as shown in FIG. 23, channels of one or more virtual meters may be virtually tied to the data measured for the channels by one or more physical meters. Once imported from the data source, this data set would then be considered an independent entity, tied to the virtual meter with the identification (e.g., ID 1, ID 2, ID 3, etc.) associated with that virtual meter.

A similar problem often encountered while initially configuring such a system is that the user does not always know how they want to organize the meters in the software. For example, one user may be designated as the person to add all of the meters to the system, while another may be the one to organize it at a later date.

Another example of this problem would be when the configuration of the groups in a system needs to change. For example, the groups may have been configured wrong. As another example, a user may wish to move a virtual meter to another location, including maintaining the data already imported.

Figure 24:
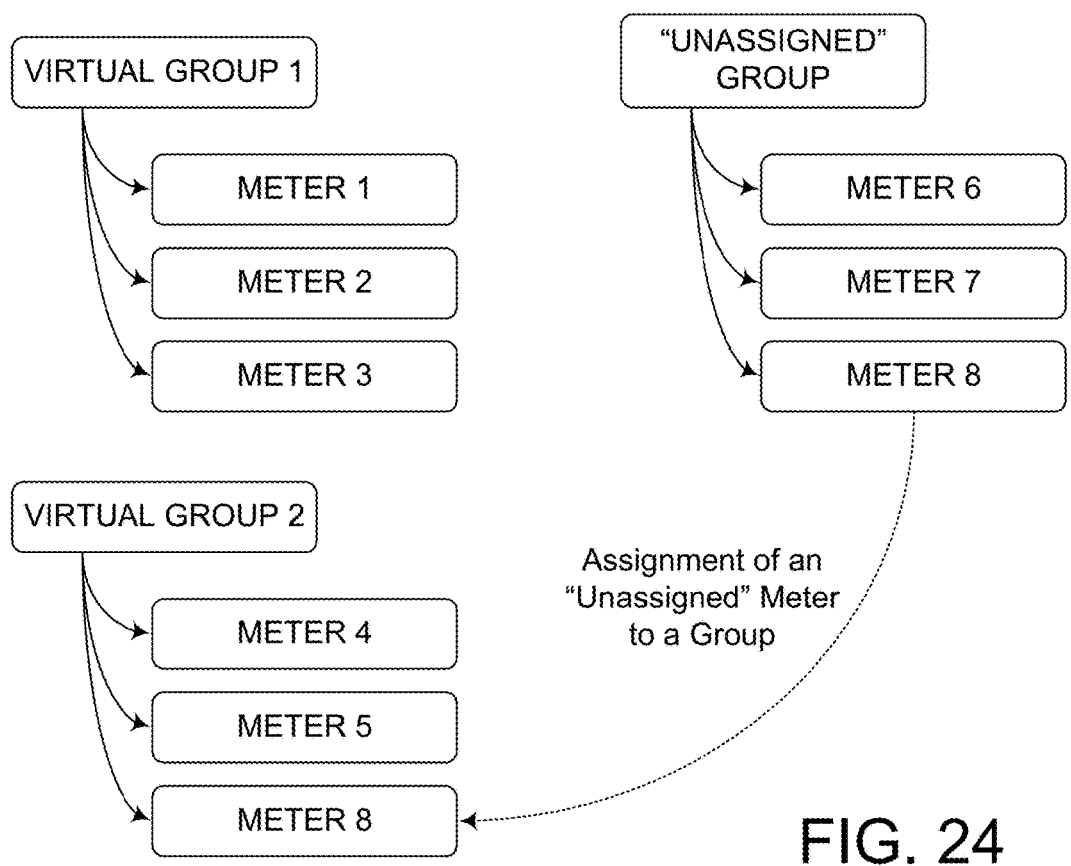
FIG. 24 illustrates a method of handling unassigned meters or IEDs in accordance with an embodiment of the present disclosure.

One exemplary implementation is to further extend the embodiments of Virtual Meters by not tying a Virtual Meter to a group in a definitive manner. One exemplary implementation of this could be to store all Virtual Meters in a pool of meters or virtual groups, and only connect them to a group when the user desires, as shown in FIG. 24. The user could then configure these meters without having to have a group, such as a location that the meter resides in. Unassigned meters or groups of meters can be assigned to a virtual group as desired.

The presentation of virtual meters in a tree configuration could be further configured, for example, by allowing the user to drag meters between groups and pools in a user interface. In this way, the assignment of a Virtual Meter to a group and the removal of a Virtual Meter from a group can be simplified.

Virtual Meters could be further extended by allowing the user to create a copy of an existing Virtual Meter, which would add a new Virtual Meter to the pool of meters, with all the settings of the original Virtual Meter. Only the unique identifier would have to be different.

Virtual Meters could be further extended by assigning a percentage value to each channel configured to be imported from the data source. This value could be either positive or negative. When the channel's stored values are used for reporting and display, the value would be scaled by this percentage value. For example, a Virtual Meter's channel, which could be electrical energy usage, could be configured with a percentage value of −50%. This value could then, when creating aggregate reports such as bills, be used to remove that energy from the aggregate. As another example, a Virtual Meter's channel, which could be electrical energy usage, could be configured with a percentage value of 20%. This value could then, when creating aggregate reports such as bills, be used to add a common charge to that aggregate.

According to the embodiments described with respect to FIGS. 22-24, various systems for managing meters as virtual meters can be realized. In some implementations, a system may include a network, a server, and a data source. The network enables the devices to communicate with other devices. The data source is configured to provide commodity data to the server via the network. Furthermore, the data source is configured to adopt a unique identification code associated with a customer location. When the commodity data is provided to the server, the data source is further configured to provide the unique identification code as well. In this way, the server may be able to determine an association of the commodity data with the particular customer location.

In some implementations, the data source may be an intelligent electronic device. Also, in some cases, the server may be configured to access a customer table that links a plurality of unique identification codes with a plurality of customer locations. The server can utilize the commodity data to calculate the usage of a commodity at the customer location.

The system may further be configured to include a plurality of data sources, wherein each data source, respectively, is configured to adopt a unique identification code associated with a customer location. The data sources provide commodity data and the unique identification code associated with the customer location to the server.

It should be noted that simply providing the unique identification code associated with the customer location can be done without revealing the identity of the data source itself. However, the server may access a data source table that identifies the data source if needed, but this data source table is independent of the unique identification code.

In some embodiments, the data source may adopt a plurality of unique identification codes associated with a plurality of customer locations. This may be the case when a data source (e.g., a meter) is used to measured commodity usage for multiple customers, such as in an apartment building.

The data source may be configured to adopt the unique identification code when the data source is initially installed at the customer location. A storage device, which is either incorporated with circuitry at the customer location itself or part of the server, may be configured to store the unique identification code for that location and may be configured to supply the code to the data source when it is installed.

The identification codes may contain any suitable combination of alphanumeric symbols. In some implementations, the codes may include a name associated with the customer at the customer location. Alternatively, the codes may include the address of the customer location.

Systems and methods using Non-Meter Data Sources are described herein.

Meters need not be the only source of data. According to some embodiments of the present disclosure, a data source could also include information from non-meter sources. For example, some sources could include information such as the square footage of a location, the number of employees at a location, or even the weather conditions in the area at or near the location. Since some of the values provided by these data sources are static (i.e., they do not change over time), recording them at different times over a period of time does not yield any benefit. For example, the square footage of a building does not change (unless, of course, a renovation to modify the space of the building is made). Nevertheless, the systems herein allow the user to manually enter these static or non-changing values. They would then be included in the channels data set. In another example, however, the data sources may be dynamic, meaning that updates to the data may be needed. The data may be updated on a regular, periodic basis or may be updated whenever needed. For example, the parameter that defines the number of people working at a location may change irregularly, and updates could be entered manually by the user as that number changes.

Since some of these data sources may be provided as a service by a third party, inputting these data sources could be enabled by providing the ability to use a common protocol to query that data service, and automatically record the current value on a configured interval. For example, weather information, such as temperature, could be queried from a weather service using a common protocol, such as Simple Object Access Protocol (SOAP), on an interval, such as each day, or every hour. As another example, the current price of an entity, such as real time pricing, stock values, or the value on a commodity market, could be queried every 15 minutes.

Figure 25:
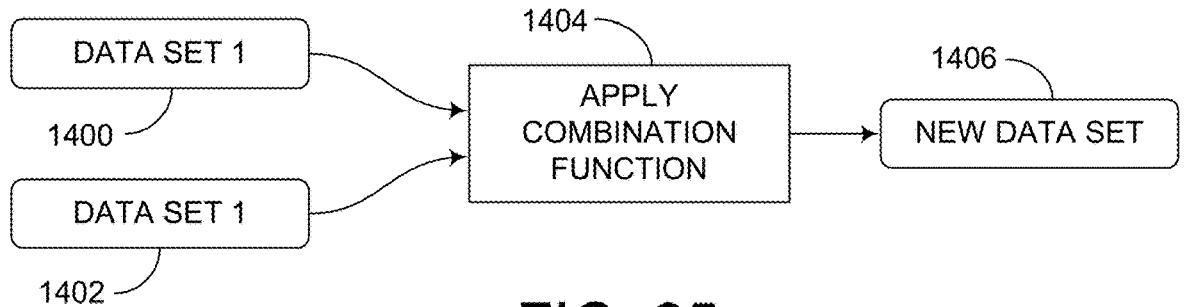
FIG. 25 illustrates a method of combining data sets in accordance with an embodiment of the present disclosure.

These non-meter data sources could then be used the same way as other meter data sources, including aggregation, comparison, and being the data set for a Virtual Meter. In some implementations, the usage of non-meter data may include allowing a new data set to be created by combining two data sets using a defined algorithm, as shown for example in FIG. 25. For example, a first data set 1400 and a second data set 1402 may be combined by applying a certain combination function 1404, resulting in a new data set 1406. In some embodiments, additional data sets may be combined using alternative combination functions. According to an example of with respect to FIG. 25, the new data set 1406 may include the parameters of Electrical Energy Usage per Square Foot, created by dividing each one of an Electrical Energy Usage value from the first data set 1400 by each one of a corresponding Square Foot value from the second data set 1402 for one or more periods of time. As another example, an Estimated Carbon Output value of a generator facility, which generates both electrical energy from coal and heat from steam, may be a new data set 1406 created by applying a formula 1404 to a measured electrical energy usage, measured steam usage, and measured loss, and summing the results together.

According to various implementations of non-meter data sources, one embodiment of a system comprises a network, a server, a plurality of meters, and at least one non-meter entity. The network enables communication between the different devices. The meters are configured to sense a usage of a commodity and provide the commodity usage data to the server via the network. The at least one non-meter entity may be configured to provide non-meter data to the server via the network. The server receives the commodity usage data and the non-meter data. From this, the server may calculate a new data set from the commodity usage data and the non-meter data.

In some embodiments, the meters may be intelligent electronic devices (IEDs) for measuring electricity usage. The meters may provide commodity usage data at predetermined intervals. The non-meter entity, according to some implementations, may be a third party entity. For example, the third party entity may be a weather service entity for providing weather conditions to the server. Another example of a third party entity is a financial entity that provides a price or cost of a commodity per unit volume. To query the non-meter data from the third party entities, the server may be configured to use a common protocol.

The non-meter entity, according to some embodiments, may include at least a user interface/device that enables a user to enter data to be provided to the server. For instance, the user data may include a number of people occupying a space associated with the usage of the commodity, a square footage of the space associated with the commodity usage, or other suitable parameters that may be utilized by the server to calculate the new data set. The system may further be defined by enabling the user to enter a time when the non-meter data was entered or when the non-meter data becomes effective.

From the commodity usage data and the non-meter data, the server is able to calculate any number of new data sets. For example, the server may calculate the energy usage per square foot of occupied space, the energy usage with respect to weather conditions, the cost per energy unit, the carbon output of an energy generator or energy facility, the efficiency of the energy generator or energy facility, or any other new data sets as desired. In addition, the system may be configured with a viewer device that may display the new data sets on a user interface.

Systems and methods that manage Commodities are described herein.

Data sources, such as meters, often do not know or store the actual specifics of the data they are recording. For example, a meter may have a pulse accumulator, which is measuring energy, or it may be recording steam. To the meter, it is just an accumulator. As another example, a comma-separated value (CSV) file may contain just a timestamp and a value for each item. While the values may have had an original meaning, in the data source, it is just a pair of numbers. While many of these items may just be arbitrary values, they should be used consistently by the software. For example, reports generated for electrical energy usage may not be concerned with where the data came from.

One implementation to overcome this issue is to create virtual Commodity entities, which are used as a common reference for each of these data sources. Each channel in a data source would be tied to one of these Commodities. Thus, the imported data from that channel would be the same commodity as a corresponding channel from another source, since that same commodity from the other source might also be tied to that channel. This could allow reports to be generated on a commodity from separate sources, without the report knowing where the data came from.

One exemplary implementation of tying commodities to particular channels may include storing an independent list of Commodities. When a data source is configured for import, a commodity is assigned to each channel to be imported. Then, when the data is imported, the channel data from the data source is stored as the specific commodity in the system. Furthermore, this list of Commodities could be configurable by the user, allowing them to create any number of Commodities as needed by their system.

Systems and methods using Perpetual Calendars are described herein.

Many events in a calendar, such as holidays, are recurring, meaning they occur every year on the same date. However, some do not occur on the same calendar date each year. Instead, the non-recurring holiday may follow a rule, such as Thanksgiving, which falls on the $4^{th}$ Thursday in November. Thus, the non-recurring holidays map to a different calendar date each year. Other rules may apply for the determining the dates when certain holidays are observed, such as business or federal holidays. The date may be altered by what day of week they happen to fall on. For example, New Years Day is officially January $1^{st}$, but if that day happens to occur on a Saturday or Sunday, it is often applied to the Friday before that weekend or the Monday after that weekend.

When generating utility usage bills, often different rates (i.e., monetary charge per unit of commodity usage) may be applied for certain days as opposed to others. For example, a different rate may apply to holidays as opposed to other days. Also, usage during weekends may often be charged at a different rate than weekdays. However, configuring these rules can be time consuming and may result in errors since a user will need to specify the dates and rules for each of these events for each individual year.

One implementation for overcoming the issue of user errors with regard to entering different rates and various rules for certain days is to create a set of rules which determines the correct dates for any event based on a descriptor, referred to as a Perpetual Calendar. One exemplary implementation of this descriptor could be an algorithm that takes as input rules to match, such as month, day of month, day of week, week of month, day of year, week of year, and a filter of days not to match. This algorithm would then compare a given day to its set of inputs, and output if the day matches that rule. If any input is not set, then it would not be used in the logic of the algorithm.

Figure 26:
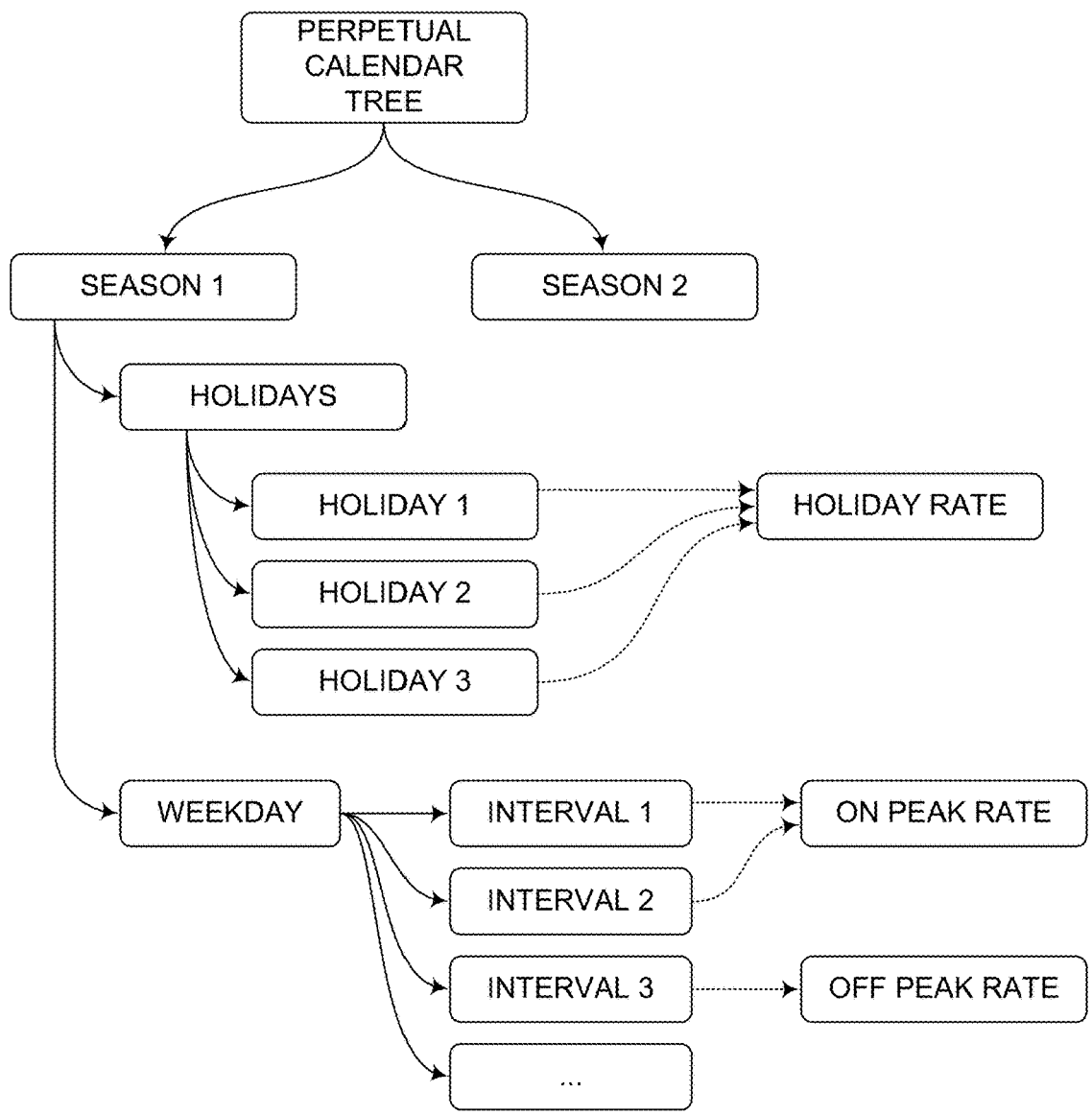
FIG. 26 illustrates a structure of a perpetual calendar tree in accordance with an embodiment of the present disclosure.

This implementation may include organizing these matching descriptors into a tree, where the descriptors are recursively compared against a day, as shown in FIG. 26. The descriptor which matches the day is the deepest node in the tree to match the day. In addition to having a day comparison, the descriptor could be further improved by having a time of day comparison. The descriptor could also include a range of time comparison, which would allow multiple days or times to be matched. One exemplary implementation of this could be to use two of the descriptors described above, and match any dates or times between the two.

One exemplary use of a Perpetual Calendar is to determine what rate to apply to any individual interval usage, called a Rate Structure. For example, many billing rate structures have an On Peak rate, typically applied during the middle of the day, and an Off Peak rate, typically applied during the night. These rates could be applied by rules which match the time or date range for each rate. As another example, weekdays often have a different set of rates than weekends. This could be applied as a pair of rules which match either the weekdays or the weekends. This could be further combined with the first example, where each day rule contains a set of time range rules, to match a different set of rate times on weekdays as weekends.

One exemplary implementation of this is to reference the rate to apply, from each rule. Then, when the time or date is matched, the rate can be applied.

The Rate Structure may also be configured to allow it to be stored independent of the data that it is applied to. This would allow a single Rate Structure to be applied to multiple data sets. For example, a single Electrical Rate could be configured, and applied to all of a customer's locations.

The Rate Structure could be further implemented by specifying which commodity it applies to. Groups, such as locations, could then apply multiple Rate Structures to its data, such that each commodity has a different Rate Structure. For example, a location may contain data for electrical energy usage and steam usage, and have two Rate Structures, one for electrical energy usage and one for steam usage.

Another exemplary implementation of this would be to have an additional input to the descriptor for the commodity, which would allow a single Rate Structure to have multiple commodities, one in each branch of the rule tree.

Many billing rules are separated into two rates, often called On Peak and Off Peak, which are used to charge more during high usage times of the day, and less during low usage times of the day. However, some rules require the use of more then those two. For example, a system may use On Peak, Off Peak, and Super Peak, which could be a short, very high usage, time of day.

One implementation to handle multiple billing rates is to have a configurable list of rates that is used by a Rate Structure. The system may be configured to maintain these lists of rates and allow new rates to be added or existing rates to be removed. The system could further comprise a different list of rates for each Rate Structure. These rates could then be tied to the rules of the Rate Structure, to allow the system to determine which rate to apply to any point in time.

In addition, the various billing rules may have different sets of rates and rules for different times of years, often called seasons. One implementation may include a system that applies a rule in the Rate Structure for each season, such that each season has its own set of rules. For example, a Summer Season rule could be applied to days from April 15 to October 15, and a Winter Season rule could be applied to days from October 15 to April 15. Thus, each season may have its own set of rules and its own rates.

The systems for handling rates, according to some embodiments of the present disclosure, could further allow a monetary charge per unit of commodity usage (e.g., referred to herein as a "Rate Value") to be configured as either a fixed value per unit or as a reference to another data value (e.g., called a "Dynamic Rate Value"). For example, the Dynamic Rate Value could be the sum, max, min, or average of values from another data source. As another example, this Dynamic Rate Value could be the most recent value, the value closest in time to which it is being applied, or a value from another data source.

The systems may define the Dynamic Rate Value as an algorithm and apply it to one or more data sources. This algorithm could be implemented as a script, such as a sequence of words and symbols to represent inputs, outputs, and operations, such that the input data sources are transformed into a single output rate value. This algorithm could also be implemented as a set of hard coded configurations to allow ease of use and programming.

Many billing rules require applying rates which do not have a time element, but instead may require applying a formula to the usage or to the final monetary value. For example, a tax may be applied to the monetary value computed for the usage, after the time rules have been applied. As another example, a flat rate may be applied to the usage, which ignores what time the usage occurred during. As another example, a fixed charge may be applied, which is a single monetary value, applied regardless of the usage. As another example, a peak demand charge may be applied, which looks for the single highest interval usage during the period of the bill, and applies a rate to that value, in addition to the other rates.

One exemplary implementation of this is to have a list of such rates, called Charges, configured along with the Rate Structure. These charges could be implemented as algorithms to be applied to the usage data and the bill, such that when generating the bill, software could iterate over the list of charges, adding each one in sequence.

This could be further improved by specifying these algorithms as scripts, such as a sequence of words and symbols to represent inputs, outputs, and operations, to allow an arbitrary set of charges to be used.

A tree based Rate Structure may be complex to understand and configure for a user, so one exemplary implementation of the UI to configure the Rate Structure could be rearranged to provide the most common options to the user, such as configuring lists of charges, configuring lists of rates, which commodity to apply the rate structure to, configuring what time of day to apply each rate to, and configuring when holidays are. These common options could be presented as simple lists, with add, edit, and remove options. When the user saves the Rate Structure, one exemplary implementation could be that the software rearranges the options the user selected into the internal Rate Structure tree. Likewise, when the Rate Structure is presented on the UI, it could be converted from the internal tree structure to the ease to use UI format.

Figure 27:
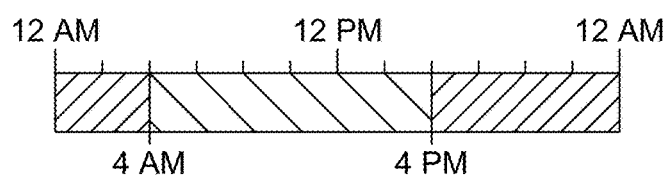
FIG. 27 illustrates a structure of a zoned calendar in accordance with an embodiment of the present disclosure.

Just listing Rate Structure rules may be complex and difficult to understand for the user, so one exemplary implementation could be to present a calendar 1450 to the user, as shown in FIG. 27. The calendar 1450 may be configured to display specific months and years specified by the user and may indicate which days and which hours of the days would follow which specific rules. The calendar 1450 may be displayed on a user interface of a client device for enabling the user to view the rate structure. In addition to the calendar 1450, the user interface may also show a key 1452, showing the symbols or highlighting used to depict the various rate structures. Also, a time-of-day indicator 1454 may be displayed for providing greater detail of the times during the day when different rates may be applied.

One exemplary way to indicate the different Rate Structures is to create visual patterns for each structure, as defined in the key 1452. For example, the user interface may be configured to display various colors for each rate and fill the date cells of the calendar 1450 with the appropriate bands of color to indicate what rates are applied for those days.

Another exemplary way to indicate this would be to assign a color to each day type, for example weekday, weekend, and holiday, and fill each calendar date cell with the color for its day type. When the day is selected, the time-of-day indicator 1454 showing a separate time line may be displayed to indicate what rates are applied to each range of time in that day.

This time line of the time-of-day indicator 1454 could be further configured to allow the user to manipulate the time ranges of the rates by directly interacting with the time line that represents the rate time ranges. One exemplary implementation of this could be to move the borders between the time ranges. Another exemplary implementation could be to denote each interval of the time range as a block, and click the block to select the rate to apply in that block.

In many data collection systems, one result of collecting the data is the generation of an analysis presentation of that data in a textual or graphical format, called a Report. For example, one exemplary report could be a bill, which is an analysis of the usage during a time range, and the application of rates to those interval usages, to generate a monetary value. As another example, an exemplary report could be a trend graph, which shows how data changes over time in a graphical format.

One problem with reports in many systems is that they only deal with a single data source. If they do deal with multiple data sources, they must often be explicitly configured to work with each data source, often requiring explicit implementation in the software for each data source.

One implementation to overcome the problem of only performing reports on single data sources is to perform the report on a Virtual Group. As mentioned with respect to FIG. 24, a Virtual Group performs each action as either an aggregate or an enumeration of the items contained within it. Thus, the report automatically aggregates the data of the data sources into a single set of values to be displayed.

Additionally, the report could enumerate over each data source presented, and thus easily scale from a single meter to many meters. The server may include logic for handling the report, wherein the logic may simply include instructions on how to combine data sources and how to present the data sources. For example, assume a location contains three meters, such that each meter measures electrical energy usage. A trend report could easily be generated for showing the interval usage for that location. The location, which may be a Virtual Group, provides the aggregation functionality.

As another example, a location could contain four meters, each measuring electrical energy, and two additionally measuring steam usage. A trend report could be generated that generates a sub report for aggregate electrical energy usage and a sub report for aggregate steam usage. Another sub report could be generated that enumerates over each meter at the location, and trends the individual data sets for each meter. These sub reports could then be integrated in a single main report.

Virtual Group Reporting could be further configured by adding a comparison action to the Virtual Groups. This comparison could include comparing multiple data sets, comparing the data sets of multiple Virtual Meters, comparing multiple different time ranges from the same data set, or comparing the data sets from multiple Virtual Groups. One exemplary implementation to enable this comparison could be to present the data sets to be compared on a graph. Another exemplary implementation of this comparison could be to present summarized values in a list.

For example, the electrical usage of two meters during a week could be compared by graphing their hourly usage side by side over the course of that week. As another example, the usage of multiple locations, such as buildings, could be compared by displaying a bar graph of the aggregate usage values for each building. It could also be displayed as a list of the aggregate usage values for each building.

Another exemplary implementation of the comparison would be to graph two data sets versus each other, rather then versus time. For example, a graph could be presented that compares the electrical energy usage of a location on one axis, versus the temperature of that building, or the external weather temperature, at the time of the interval value.

Aggregation of data sets could be configured to allow a single data set to be aggregated with itself. For example, a data set which contains values every 15 minutes could be aggregated into hour interval values by summing each 15 minute value in that hour. As another example, the same data set could be aggregated into month interval values. The aggregation process could also allow a user to specify the aggregation interval.

Another issue with reports is that the type and layout of the reports are often explicitly implemented in the software, and often require additional implementation to add new reports, or change the format and layout of existing reports. This can often cause problems when users have a predefined format that they expect the report to be in, but it is not explicitly implemented.

One implementation to overcome this would be to provide a template that the user can customize to provide the report format that they desire. Customizations could include adding and modifying the location of graphs and value lists, adding fixed labels and labels that are filled with settings from the software, adding labels to show the aggregation of Virtual Groups, and specifying aggregation and comparison actions to be used for generating graphs and value lists. Customizations could also include including other reports, such as sub reports, and allowing those reports to use as input the enumeration of entities in a Virtual Group. For example, a report on a location with five meters could contain five sub reports, each sub report showing the usage trend for each meter.

Another implementation, when the desired output is a table format, such as comma separated value lists, would be to allow the user to specify the fields to include in the output, and how to arrange those fields. For example, a custom output format may require that the output be comma separated value, where every row is a single meter, and that the fields include the start and end time of the period of the report, and the electrical energy usage at the beginning and end of the period.

One exemplary implementation of this is to specify a row list, and a column list. The row and column lists could contain options such a time, Virtual Meter enumeration, Virtual Group enumeration, Data Set enumeration, a list of individual data sets, or computing fields, such as the value at the beginning or end of the period. In this case Virtual Meter enumeration would be selected for the row, and the specific fields would be specified for the columns, include start time, end time, start value, and end value for electrical energy usage.

The customization could be further improved by allowing the user to specify the scope of the report. This could include input values such as the time range of the report, the data sets to include in the report, such as commodities, and the Virtual Meters and Groups to include in the report. This would allow generic reports to be customized to specific situations. For example, the system may generate a report that provides an aggregate summary of a Virtual Group, and a trend of each individual channel of each meter in the group. The user could specify, for example, that they want to only view March, and only electrical energy usage, thus limiting the data sets that are input to the report, resulting in a customized report.

Systems and methods regarding Automation are described herein.

As many reports rely on a period of time, the data for that period of time would need to be complete. Thus, in some embodiments, it may be important that reports not be generated until all the data for that period is available. For example, a bill report may be configured such that all the data for the month of the bill for each meter is already available for analysis. If all the data for each meter for that month has not yet been imported, the system may be configured not to generate the bill, but instead wait until all the data is imported.

In previous systems, a user may be required to manually perform each of a number of actions in sequence and at the proper time. For some users, this might be annoying or time-consuming and may cause the user to make errors.

One implementation to overcome this is to automate each step in the process. This could involve the four steps of Importing data sources, Notifying user of errors, Generating reports, and Notifying the user of the reports.

One exemplary implementation of the automation of the import of data sources could be to create a scheduler that retrieves and imports the data on a configured interval. For example, the data logs of a meter could be retrieved and imported each day at midnight. In another example, the current local temperature for a location could be read from a weather service every hour, and imported as a single item data source.

Once the data has been imported, there might have been problems, which would prevent the reports from being correctly generated. One implementation to overcome this is to have a method to notify the user that such an error occurred. One exemplary implementation of this would be to store the list of such errors, and display that list on the UI either automatically, or when the user requests it.

Systems of the present disclosure may further be configured to contain a small notification on the main interface, either in the software or in the host operating system. Such a notification can be provided to catch the user's attention such that an issue requiring attention can be easily seen.

However, the user may not be using the interface at the time of the error, or the computer that performs the import may have little to no UI interaction. One implementation to overcome this could be to send a notification to a configured destination. This destination may either be the user, or another automated process. For example, when each error occurs, an email could be sent to a configured address with the details of the error. As another example, when each error occurs, an entry could be appended to a log file on a remote machine.

When the data is known to be good, then the reports for that data can be generated. One exemplary way to decide when to generate reports could be to check if all the data required for the report is available on a configurable interval. This could be implemented as a list of reports to generate, where each item is checked if it has data on some interval.

Another exemplary implementation of this could be to check a list of reports to generate after each data source has been imported. When the import is automated, the generating of the reports may be deferred until all the data sources, which are to be imported, have been completed.

After the reports have been generated, the user may want to be notified of the completion of the imported data. One exemplary implementation of this would be to store a list of such reports, and display that list on the UI either automatically, or when the user requests it. As with errors, the system software or host operating system may display a small notification on the main interface to indicate the completion of the importing steps. Also, the notification can be made by email or a copy of such a report could be saved on the local or a remote machine.

Further features and implementations of the enterprise-wide energy management reporting, analysis and billing system of the present disclosure may become apparent to one of ordinary skill in the art from an understanding of the description provided herein. It is to be appreciated that the various features shown and described are interchangeable, that is a feature shown in one embodiment may be incorporated into another embodiment.

While non-limiting embodiments are disclosed herein, many variations are possible which remain within the concept and scope of the present disclosure. Such variations would become clear to one of ordinary skill in the art after inspection of the specification, drawings and claims herein. The present disclosure therefore is not to be restricted except within the spirit and scope of the appended claims.

Furthermore, although the foregoing text sets forth a detailed description of numerous embodiments, it should be understood that the legal scope of the present disclosure is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term ' ' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. § 112, sixth paragraph.

What is claimed is:

1. A system for managing sensor data, the system comprising:
a plurality of intelligent electronic devices, each intelligent device configured to obtain sensor data related to electrical parameters distributed to a load;
a server configured to receive the sensor data from the plurality of intelligent electronic devices, the server further configured to normalize the sensor data in a common data format and store the normalized sensor data in a database,
the server including a plurality of log import libraries that normalizes the sensor data, each of the log import libraries includes a conversion algorithm that converts a particular type of content data to the common data format, the server determines which of the plurality of log import libraries to use based on content of the received sensor data,
wherein the server is further configured to analyze the normalized data to determine if the normalized data contains at least one anomaly by applying a set of rules to the normalized data, the set of rules being selected based on a data type of the normalized data, and,
when the normalized data contains at least one anomaly, the server is further configured to work the normalized data to modify at least one original data value related to the anomaly to create a modified data value, to store the modified data value and the original data value in the database and to re-analyze the normalized data including the modified data value to determine if the at least one anomaly still exists;
and
a network enabling communication among the server and the plurality of intelligent electronic devices.

2. The system of claim 1, wherein the server is configured to receive the sensor data in a push operation.

3. The system of claim 1, wherein the server is configured to receive the sensor data in a pull operation.

4. The system of claim 1, wherein the server receives the sensor data in a burst operation.

5. The system of claim 1, wherein the server is configured to normalize the data to a format including a timestamp and a value.

6. The system of claim 1, wherein the server further determines which log import library to select based on a file extension of a data file.

7. The system of claim 1, wherein the server analyzes the normalized data for at least one anomaly by applying a set of rules based on a particular voltage or current channel of the electrical parameters.

8. The system of claim 1, wherein the server further analyzes the normalized data for at least one anomaly by comparing the data to previous values to verify at least one of a plurality of conditions.

9. The system of claim 8, wherein the conditions include ensuring that a value of the normalized data does not decrease from a previous value, ensuring that the value is not negative or zero, ensuring that the value has not changed suddenly from the previous value, ensuring that a time interval between the value and the previous value is predictable, ensuring that a slope of values with respect to time is substantially consistent, and detecting if the values have rolled over.

10. The system of claim 1, wherein the server works the normalized data by interpolation or extrapolation.

11. The system of claim 1, wherein the server works the normalized data by replacing values containing at least one anomaly with new values.

12. The system of claim 11, wherein the new values are computed based on an acceptable slope of valid data.

13. The system of claim 1, wherein the data type includes at least one of an accumulator, an interval accumulator and/or a single point in time reading.

14. The system of claim 1, wherein the server is further configured to notify a user associated with a respective data source when the normalized data contains at least one anomaly and instruct the user to manually modify the at least one value related to the at least one anomaly.

15. The system of claim 14, wherein the server is further configured to record an identification of the user who manually modifies at least one anomaly of the normalized data and to record when the at least one anomaly is modified.

16. A server for managing sensor data, the server comprising:
a processing device;
a plurality of log import libraries that normalizes data, each of the log import libraries includes a conversion algorithm that converts a particular type of content data to a common data format;
a database;
a network interface in communication with a network to enable communication with at least one intelligent electronic device;
wherein the network interface is configured to receive sensor data from the at least one intelligent electronic device, the sensor data related to power parameters distributed to a load;
wherein the processing device is configured to normalize the received sensor data to a common data format by employing at least one of the plurality of log import libraries and store the normalized sensor data in the database, the processing device determines which of the plurality of log import libraries to use based on content of the received sensor data,
wherein the processing device is further configured to analyze the normalized sensor data to determine if the normalized sensor data contains at least one anomaly by applying a set of rules to the normalized data, the set of rules being selected based on a data type of the normalized data; and
wherein, when the normalized sensor data contains at least one anomaly, the processing device is further configured to work the normalized sensor data to modify at least one original data value related to the anomaly to create a modified data value, store the original data value and the modified data value in the database and to re-analyze the normalized data including the modified data value to determine if the at least one anomaly still exits.

17. The server of claim 16, wherein the network interface is configured to communicate with a respective data source to notify a user associated with the respective data source when the normalized data contains at least one anomaly and is further configured to instruct the user to manually modify the at least one value related to the at least one anomaly.

18. The server of claim 17, wherein the storage device is further configured to record an identification of the user who manually modifies at least one anomaly of the normalized data and to record when the at least one anomaly is modified.

* * * * *